United States Patent
Ito et al.

(10) Patent No.: US 9,812,517 B2
(45) Date of Patent: Nov. 7, 2017

(54) METHOD FOR MANUFACTURING DISPLAY DEVICE AND METHOD FOR MANUFACTURING ELECTRONIC DEVICE

(71) Applicant: Semiconductor Energy Laboratory Co., Ltd., Atsugi-shi, Kanagawa-ken (JP)

(72) Inventors: Minato Ito, Kanagawa (JP); Yasuhiro Jinbo, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/163,072

(22) Filed: May 24, 2016

(65) Prior Publication Data
US 2016/0351641 A1    Dec. 1, 2016

(30) Foreign Application Priority Data
May 28, 2015 (JP) .................. JAPAN 2015-108191

(51) Int. Cl.
H01L 27/12 (2006.01)
H01L 27/32 (2006.01)
H01L 51/00 (2006.01)

(52) U.S. Cl.
CPC ........ *H01L 27/3248* (2013.01); *H01L 27/124* (2013.01); *H01L 27/1259* (2013.01); *H01L 51/0097* (2013.01); *H01L 2227/323* (2013.01)

(58) Field of Classification Search
None
See application file for complete search history.

(56) References Cited

U.S. PATENT DOCUMENTS

| 8,367,440 B2 | 2/2013 | Takayama et al. |
| 8,415,208 B2 | 4/2013 | Takayama et al. |
| 2009/0108728 A1 | 4/2009 | Ushimaru et al. |
| 2013/0214324 A1 | 8/2013 | Takayama et al. |
| 2013/0240855 A1 | 9/2013 | Chida et al. |

(Continued)

FOREIGN PATENT DOCUMENTS

| JP | 2000-150143 A | 5/2000 |
| JP | 2003-174153 A | 6/2003 |

(Continued)

*Primary Examiner* — Asok K Sarkar
(74) *Attorney, Agent, or Firm* — Fish & Richardson P.C.

(57) ABSTRACT

A method for manufacturing a display device, which does not easily damage an electrode, is provided. In the first step, a terminal electrode, a wiring, and a functional layer are provided over a first substrate; the terminal electrode, the wiring, and the functional layer are electrically connected to one another; an insulating layer is provided over the terminal electrode; a first layer is provided over the terminal electrode and the insulating layer; an adhesive layer is sandwiched between the first substrate and a second substrate; the second substrate and the adhesive layer include a first opening overlapping with part of the first layer; and the insulating layer includes a second opening inside the first opening in a top view. In the second step, part of the first layer is removed by emitting particles having a high sublimation property to the first layer, so that the terminal electrode is exposed.

25 Claims, 43 Drawing Sheets

(56) References Cited

U.S. PATENT DOCUMENTS

| | | | |
|---|---|---|---|
| 2014/0048791 A1* | 2/2014 | Matsuura | H01L 51/441 |
| | | | 257/40 |
| 2014/0273317 A1 | 9/2014 | Chida | |
| 2015/0250038 A1 | 9/2015 | Sakuishi et al. | |
| 2015/0263314 A1 | 9/2015 | Sakuishi et al. | |
| 2016/0020355 A1 | 1/2016 | Aoyama et al. | |
| 2016/0315134 A1 | 10/2016 | Nishido et al. | |

FOREIGN PATENT DOCUMENTS

| | | |
|---|---|---|
| JP | 2009-109770 A | 5/2009 |
| JP | 2013-251255 A | 12/2013 |

* cited by examiner

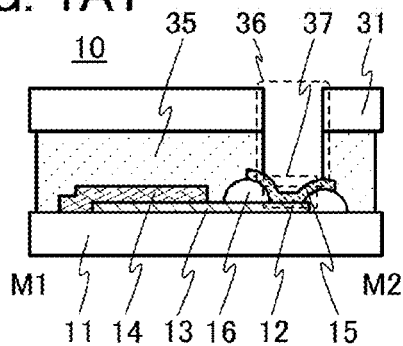
FIG. 1A1
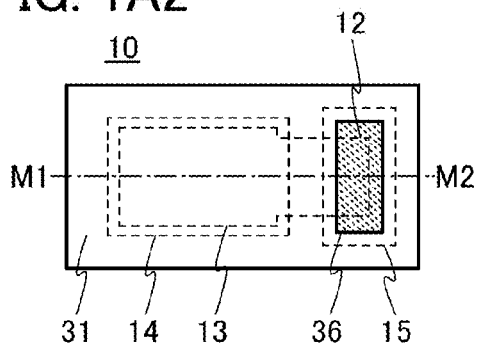
FIG. 1A2
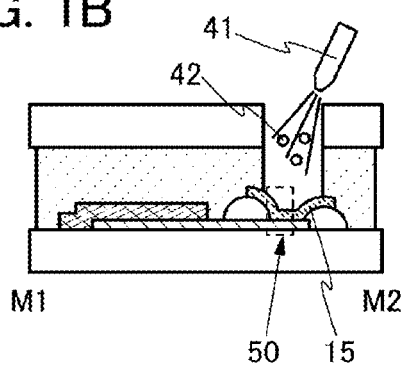
FIG. 1B
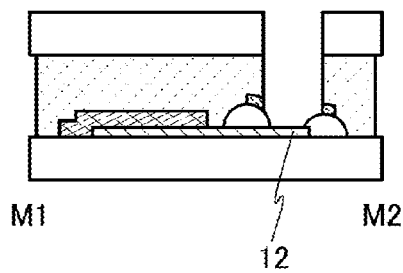
FIG. 1C1
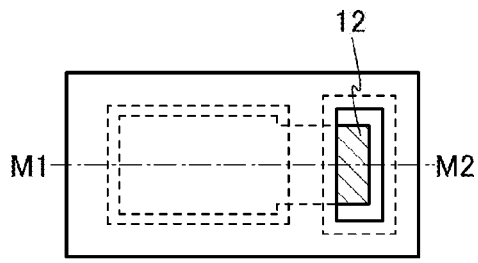
FIG. 1C2
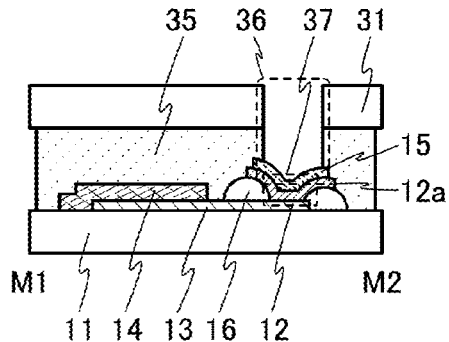
FIG. 1D1
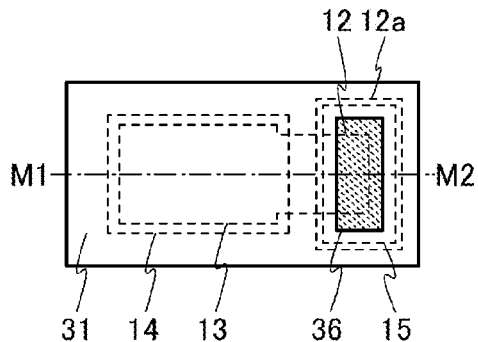
FIG. 1D2

FIG. 2A1
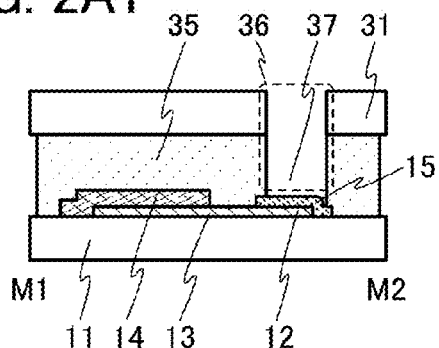
FIG. 2A2
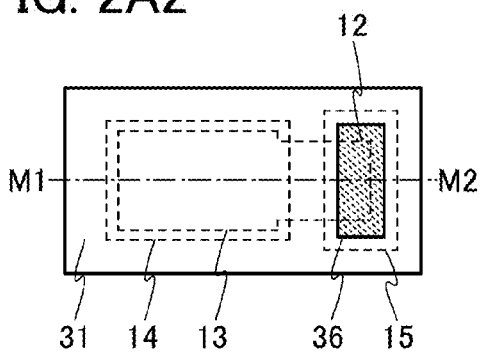
FIG. 2B1
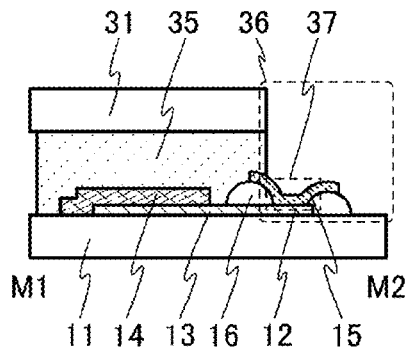
FIG. 2B2
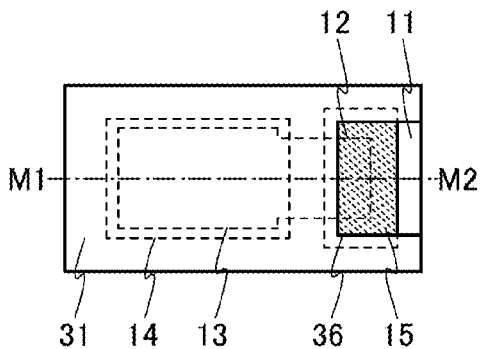
FIG. 2C1
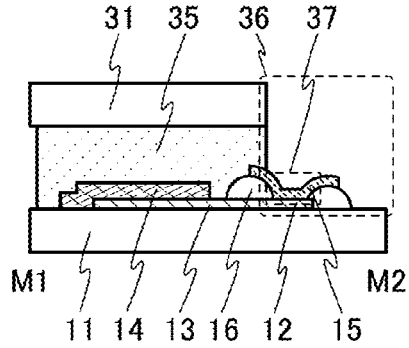
FIG. 2C2
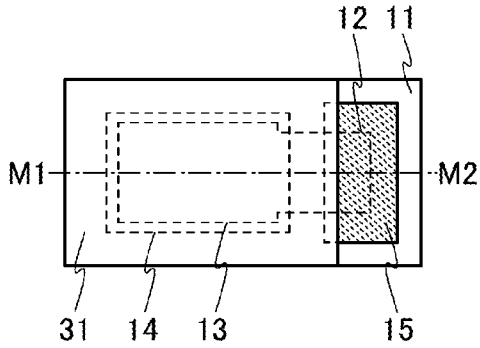
FIG. 2D1
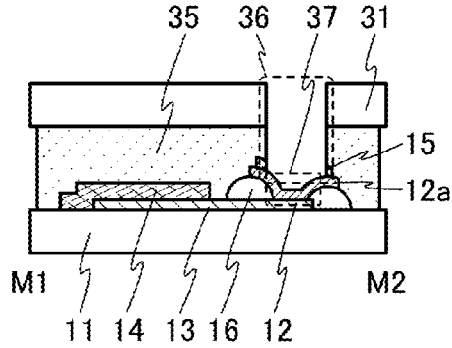
FIG. 2D2
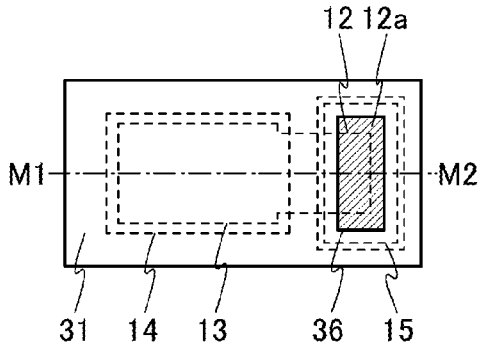

FIG. 4A1
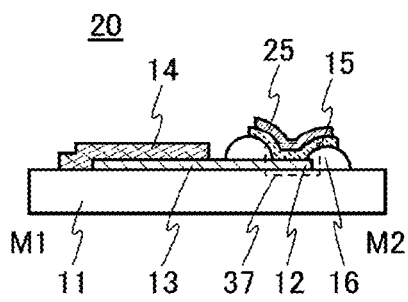
FIG. 4A2
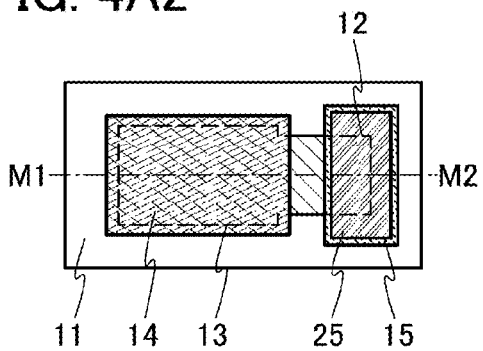
FIG. 4B1
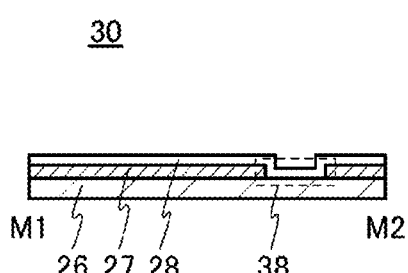
FIG. 4B2
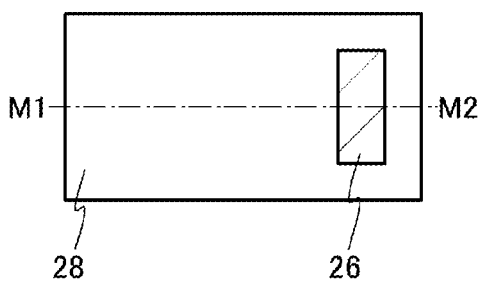
FIG. 4C1
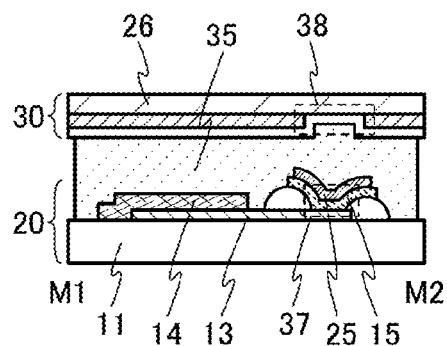
FIG. 4C2
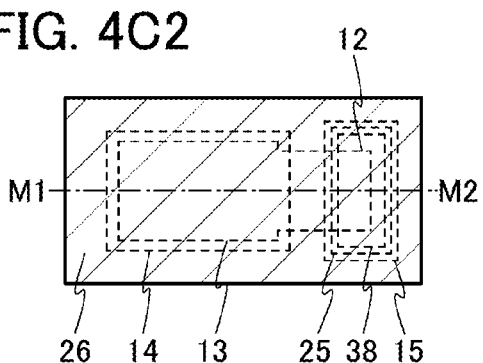
FIG. 4D
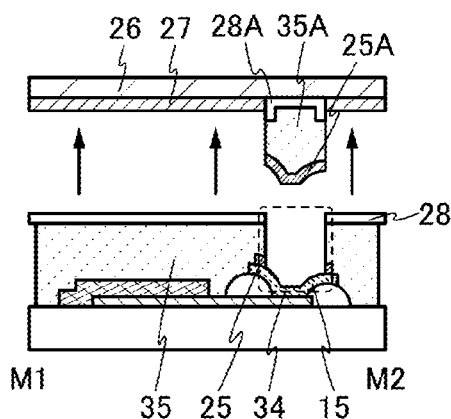

FIG. 5A
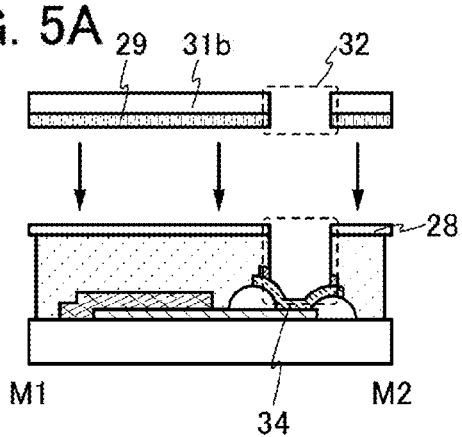
FIG. 5B1
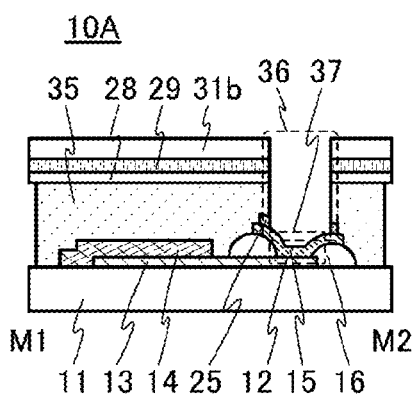
FIG. 5B2
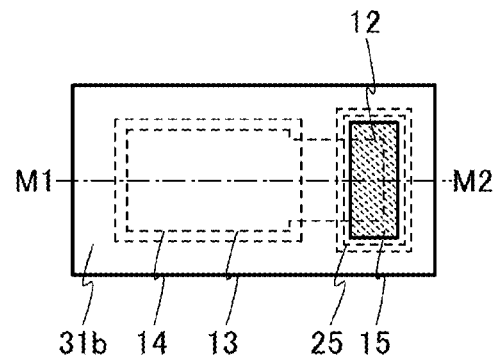

FIG. 6A1
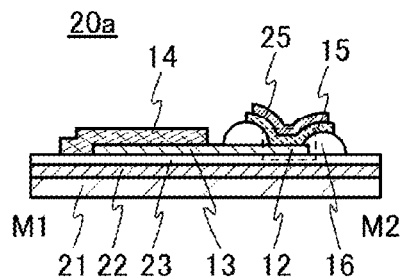
FIG. 6A2
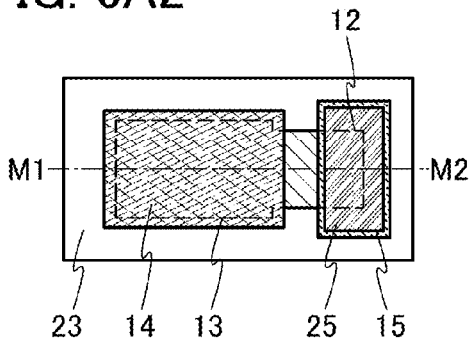
FIG. 6B1
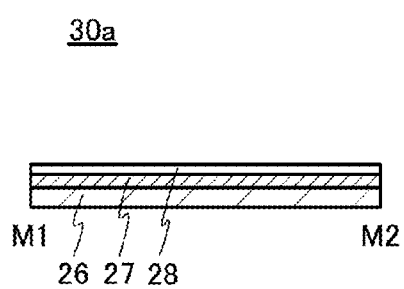
FIG. 6B2
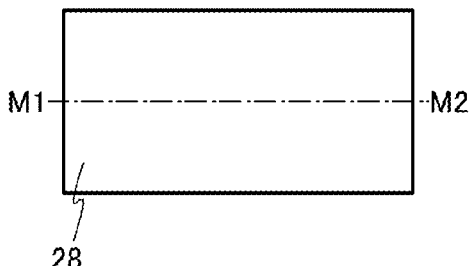
FIG. 6C1
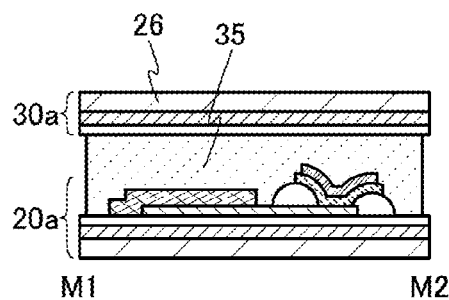
FIG. 6C2
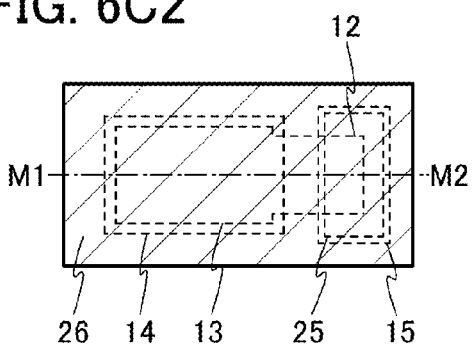
FIG. 6D
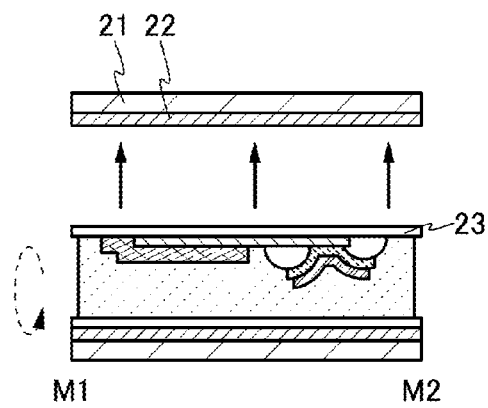

FIG. 7A
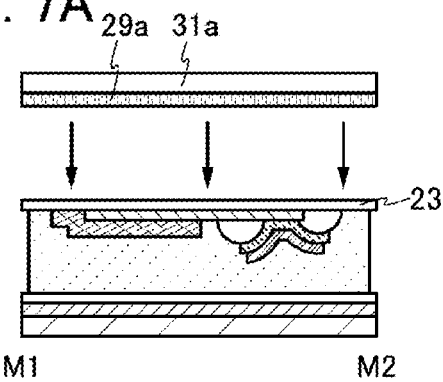
FIG. 7B
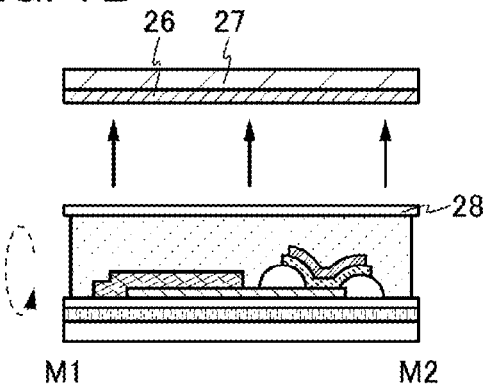
FIG. 7C
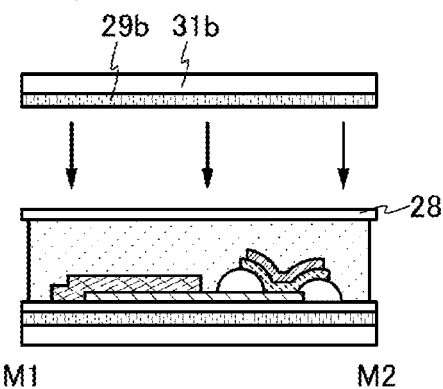
FIG. 7D1
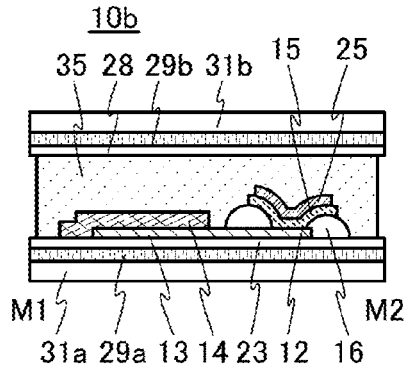
FIG. 7D2
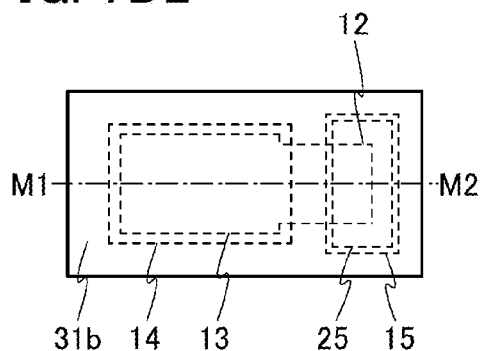

FIG. 8A1
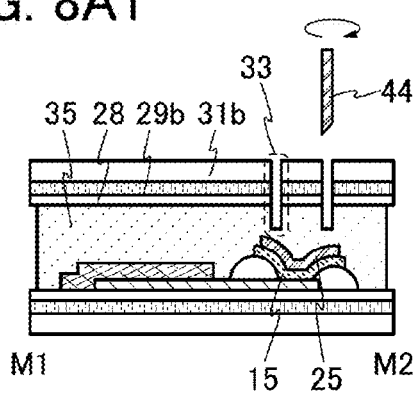
FIG. 8A2
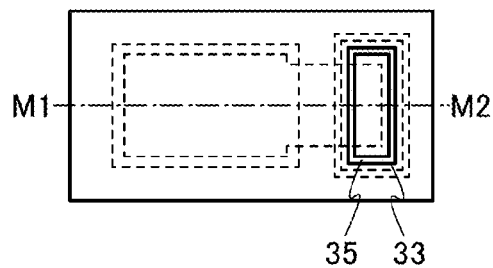
FIG. 8B
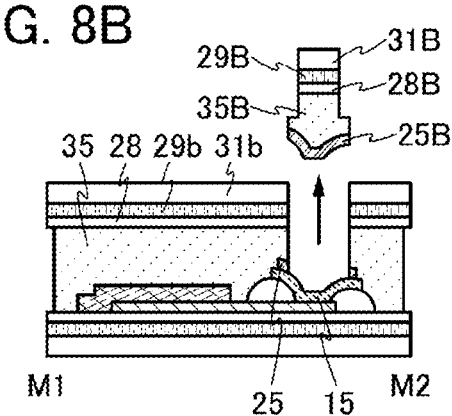
FIG. 8C1
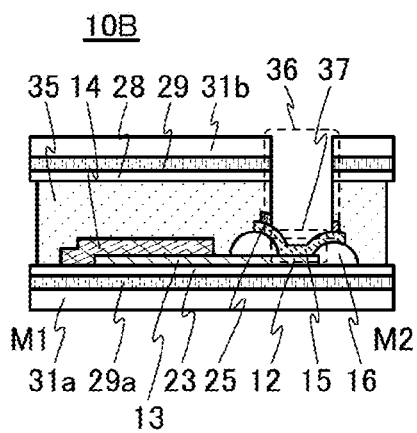
FIG. 8C2
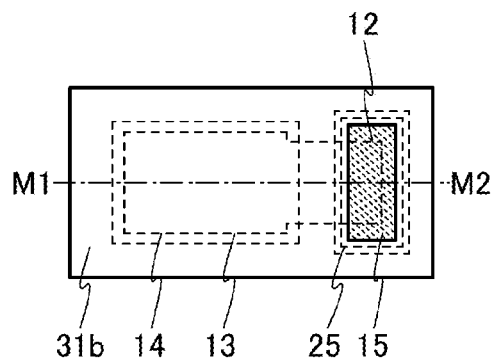

FIG. 9A1
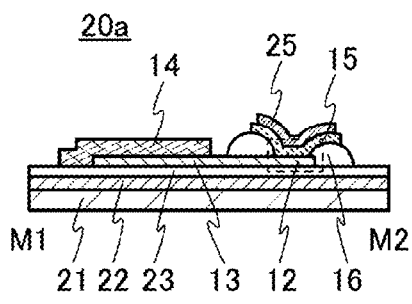
FIG. 9A2
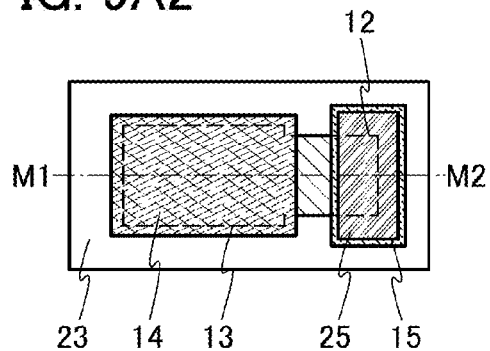
FIG. 9B1
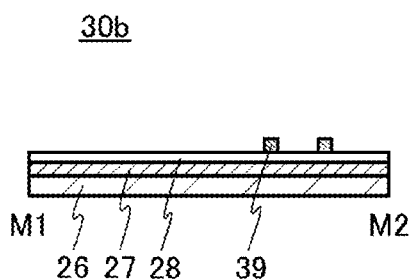
FIG. 9B2
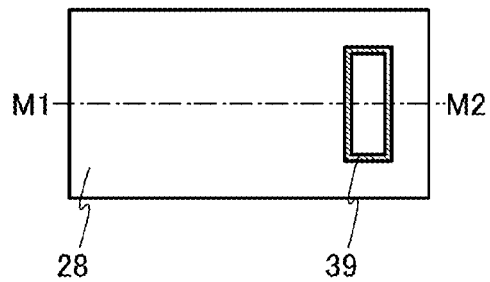
FIG. 9C1
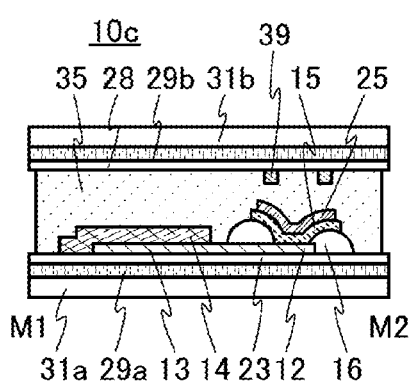
FIG. 9C2
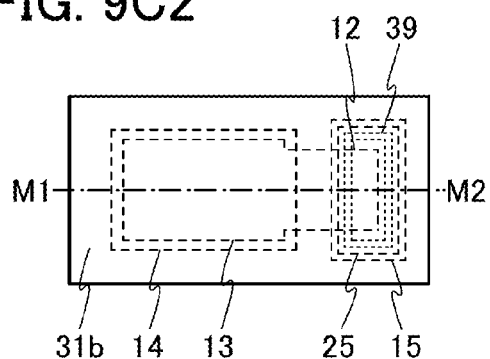
FIG. 9D
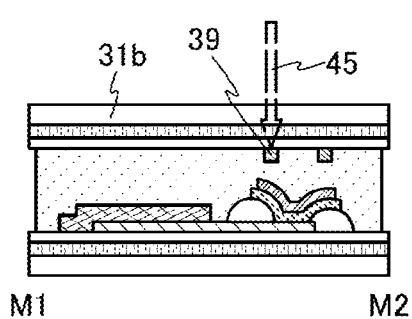

FIG. 10A
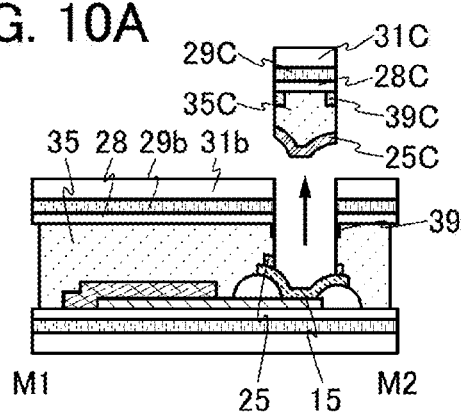
FIG. 10B1
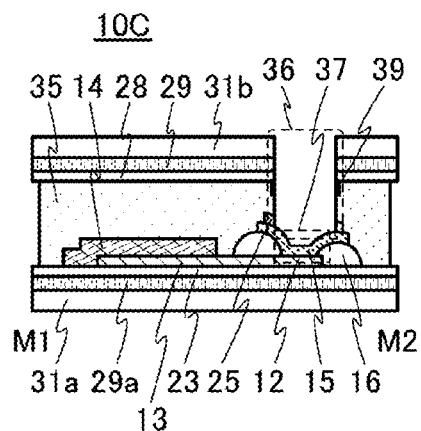
FIG. 10B2
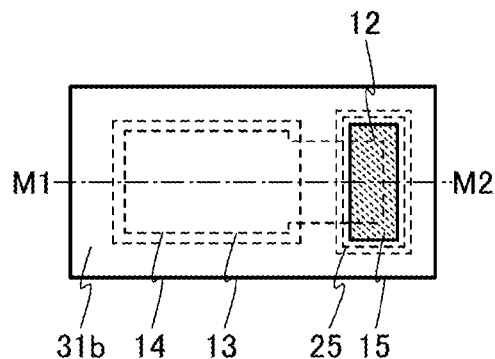

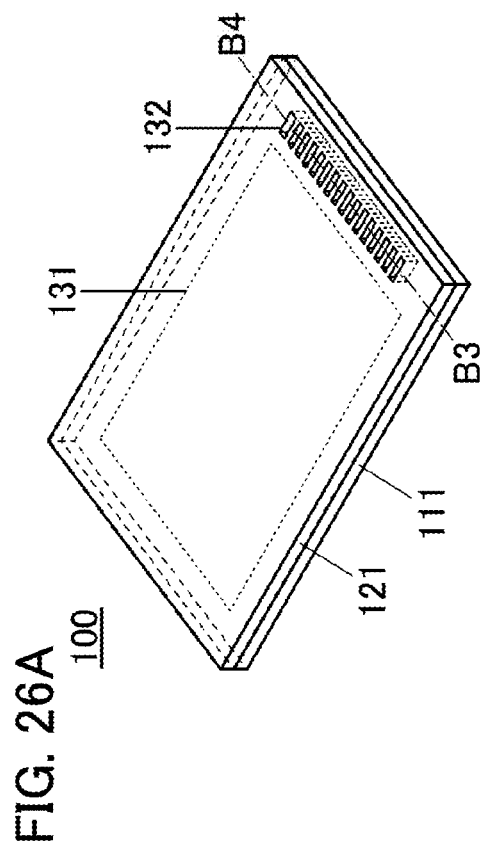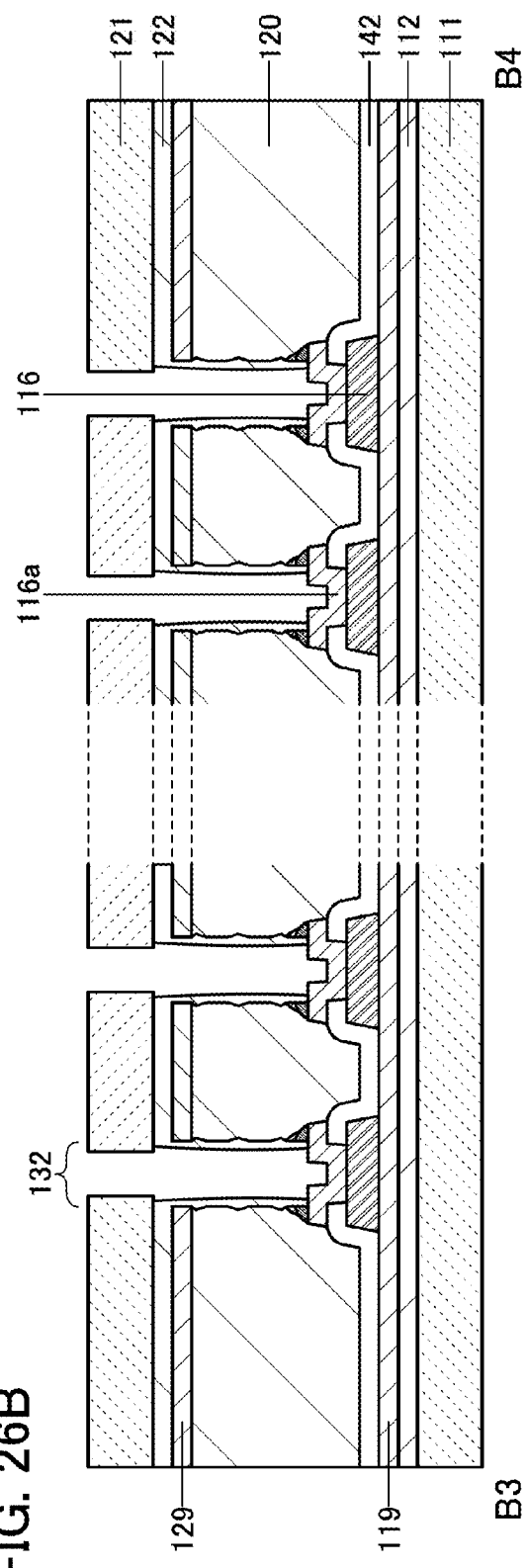
FIG. 26A
FIG. 26B

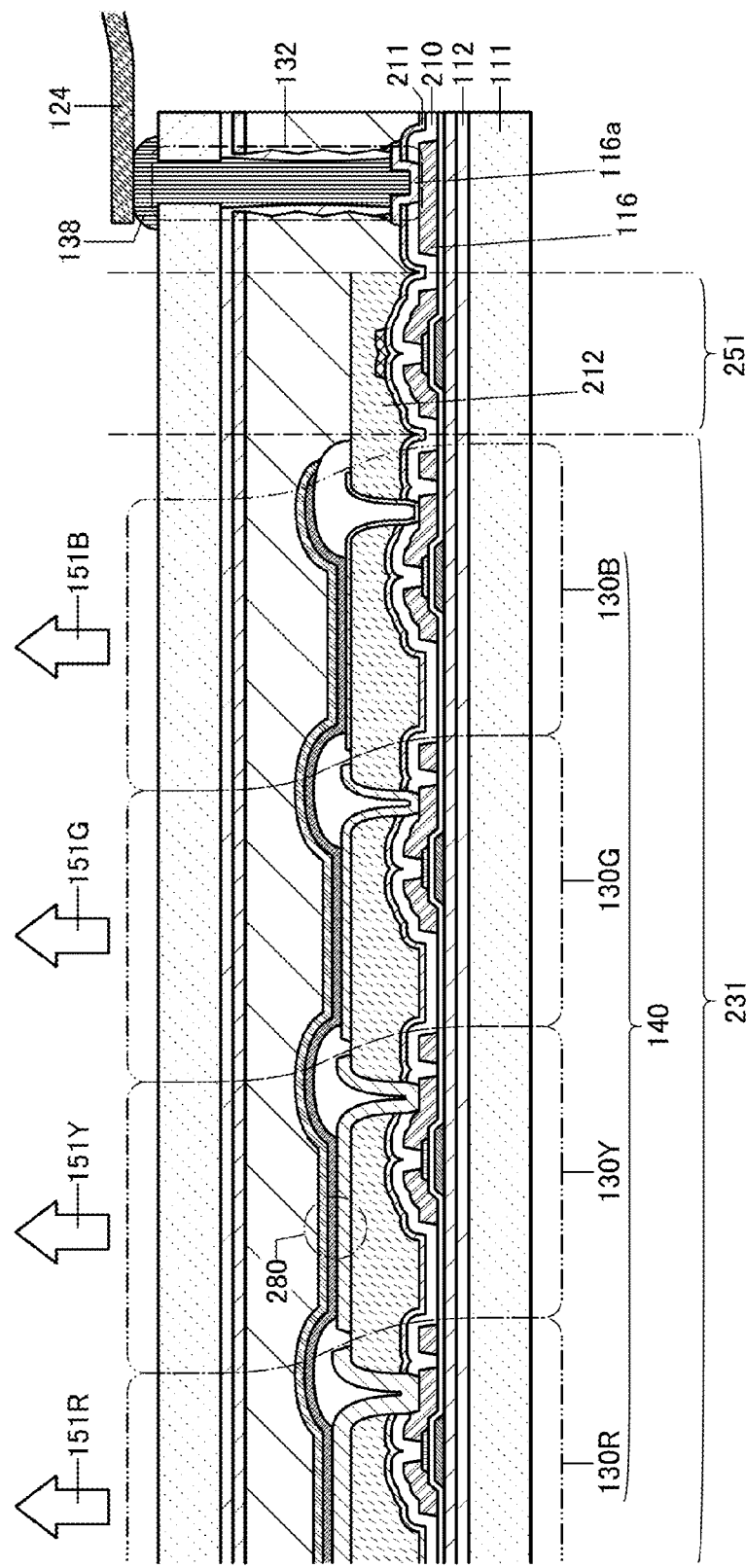
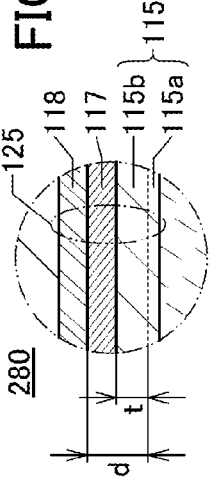
FIG. 29A
FIG. 29B

FIG. 34A1
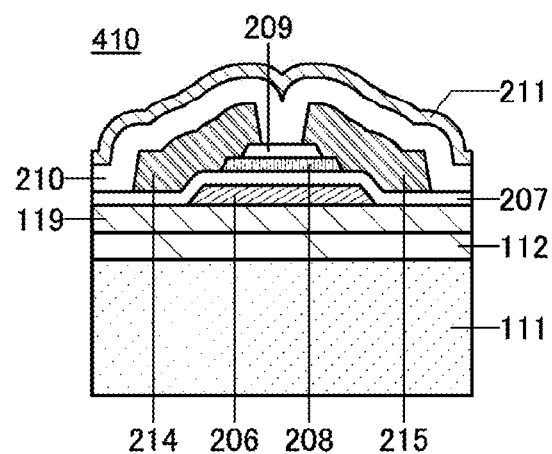
FIG. 34A2
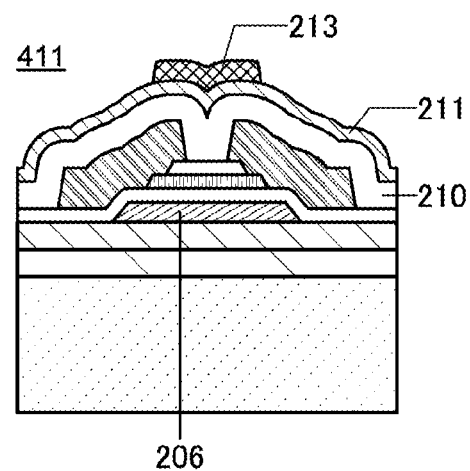
FIG. 34B1
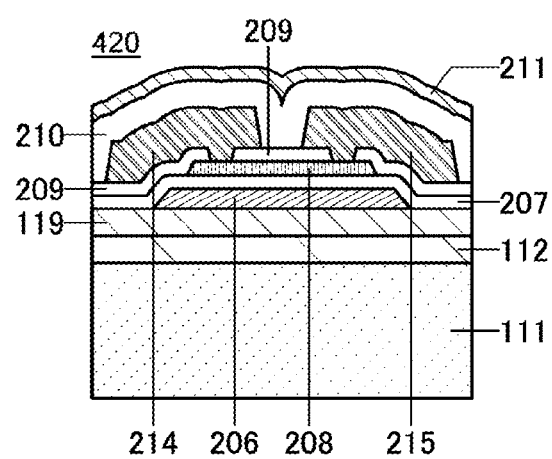
FIG. 34B2
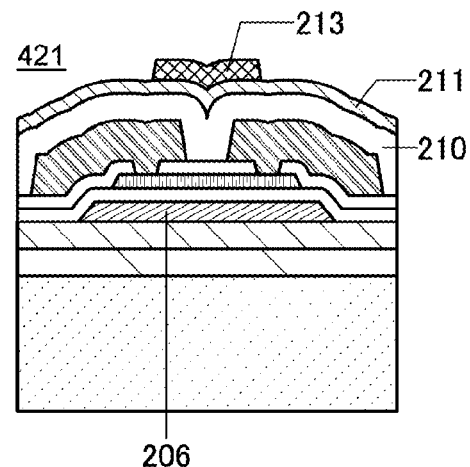

FIG. 35A1
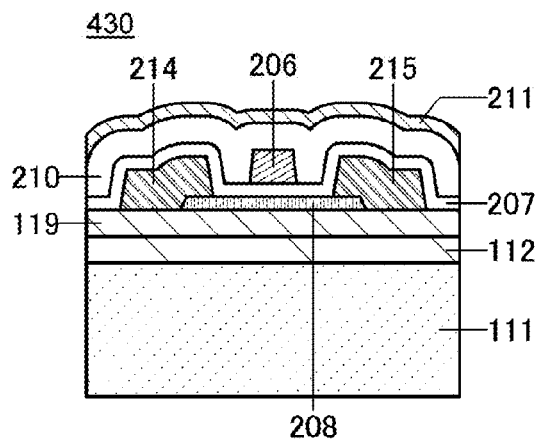
FIG. 35A2
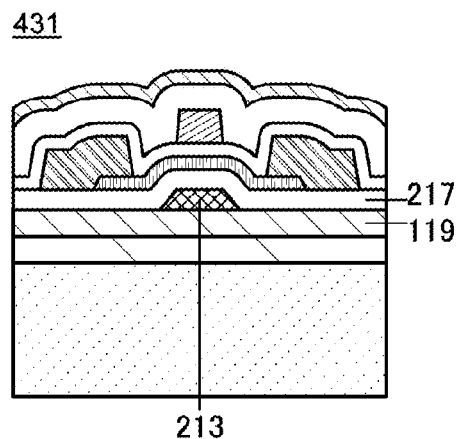
FIG. 35A3
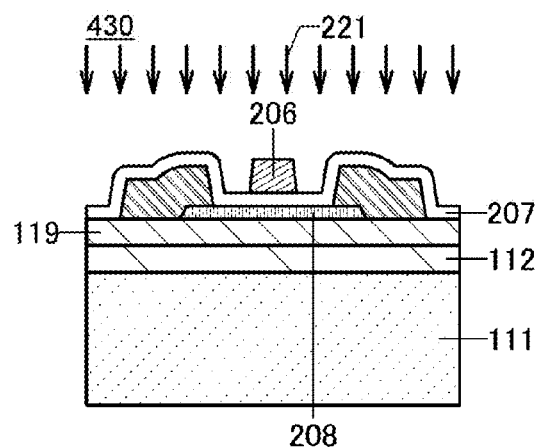
FIG. 35B1
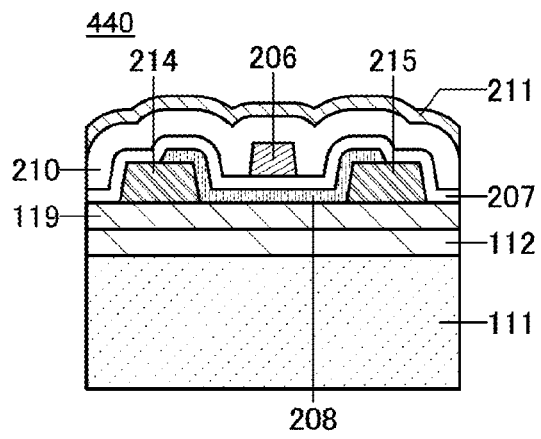
FIG. 35B2
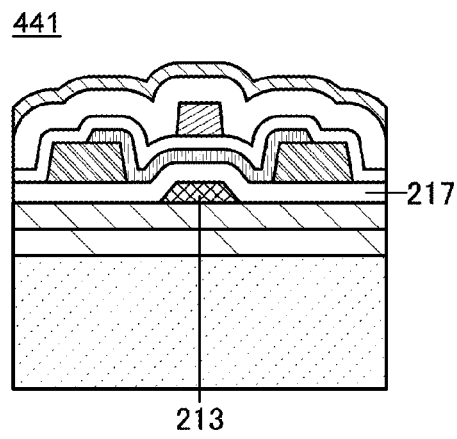

841

P1 — P2

816b  842b

810a

P1　816 816a 816b　842 842a 842b　819 811　P2

842b
816b

US 9,812,517 B2

METHOD FOR MANUFACTURING DISPLAY DEVICE AND METHOD FOR MANUFACTURING ELECTRONIC DEVICE

BACKGROUND OF THE INVENTION

1. Field of the Invention

One embodiment of the present invention relates to a method for manufacturing a display device. Another embodiment of the present invention relates to a method for manufacturing an electronic device. Another embodiment of the present invention relates to a display device. Another embodiment of the present invention relates to a touch panel.

Note that one embodiment of the present invention is not limited to the above technical field. For example, one embodiment of the present invention relates to an object, a method, or a manufacturing method. The present invention relates to a process, a machine, manufacture, or a composition of matter. One embodiment of the present invention relates to a memory device, a processor, a driving method thereof, or a manufacturing method thereof.

Note that in this specification and the like, a semiconductor device generally means a device that can function by utilizing semiconductor characteristics. Thus, a semiconductor element such as a transistor or a diode and a semiconductor circuit are semiconductor devices. A display device, a light-emitting device, a lighting device, an electro-optical device, an electronic device, and the like may include a semiconductor element or a semiconductor circuit. Therefore, a display device, a light-emitting device, a lighting device, an electro-optical device, an electronic device, and the like may include a semiconductor device.

2. Description of the Related Art

In recent years, research and development have been extensively conducted on liquid crystal elements as display elements used in a display region of a display device. In addition, research and development have been extensively conducted on light-emitting elements that utilize electroluminescence (EL). As a basic structure of these light-emitting elements, a layer containing a light-emitting substance is provided between a pair of electrodes. Voltage is applied to this light-emitting element to obtain light emission from the light-emitting substance.

Light-emitting elements are elements of a self-luminous type; thus, a display device using the light-emitting elements has, in particular, advantages such as high visibility, no necessity of a backlight, and low power consumption. The display device using the light-emitting elements also has advantages in that it can be manufactured to be thin and lightweight and has high response speed.

A display device including the display elements can have flexibility; therefore, the use of a flexible substrate for the display device has been considered.

As a method for manufacturing a display device using a flexible substrate, a technique has been developed in which an oxide layer and a metal layer are formed between a substrate and a semiconductor element, the substrate is separated by utilizing weak adhesion of an interface between the oxide layer and the metal layer, and then the semiconductor element is transferred to another substrate (e.g., a flexible substrate) (Patent Document 1).

REFERENCE

Patent Document

[Patent Document 1] Japanese Published Patent Application No. 2003-174153

SUMMARY OF THE INVENTION

An object of one embodiment of the present invention is to provide a method for manufacturing a display device, which does not easily damage an electrode. Another object of one embodiment of the present invention is to provide a highly reliable display device and a method for manufacturing the display device.

Another object of one embodiment of the present invention is to provide a method for manufacturing a novel display device, a method for manufacturing a novel electronic device, or the like. Another object of one embodiment of the present invention is to provide a method for manufacturing a display device having high display quality, a method for manufacturing an electronic device having high display quality, or the like. Another object of one embodiment of the present invention is to provide a method for manufacturing a display device that is not easily broken, a method for manufacturing an electronic device that is not easily broken, or the like.

Note that the descriptions of these objects do not disturb the existence of other objects. One embodiment of the present invention need not achieve all of these objects. Other objects will be apparent from and can be derived from the description of the specification, the drawings, the claims, and the like.

One embodiment of the present invention is a method for manufacturing a display device, which includes a first step of preparing a process member including a first substrate, a terminal electrode, a wiring, a functional layer, an insulating layer, a first layer, an adhesive layer, and a second substrate and a second step of removing part of the first layer. In the first step, the terminal electrode, the wiring, and the functional layer are provided over the first substrate; the terminal electrode, the wiring, and the functional layer are electrically connected to one another; the insulating layer is provided over the terminal electrode; the first layer is provided over the terminal electrode and the insulating layer; the adhesive layer is sandwiched between the first substrate and the second substrate; the second substrate and the adhesive layer include a first opening in a region overlapping with part of the first layer; and the insulating layer includes a second opening inside the first opening in a top view. In the second step, part of the first layer is removed by emitting particles having a high sublimation property to the first layer, so that the terminal electrode is exposed.

In the above-described method for manufacturing a display device, the particles are a solid form of carbon dioxide.

Furthermore, in the above-described method for manufacturing a display device, $(180°-\alpha 1)/2-10° < \beta 1 < (180°-\alpha 1)/2+10°$ is preferably satisfied where $\alpha 1$ is an inclination angle of an edge of the insulating layer and $\beta 1$ is an emission angle of the particles in the second step.

Moreover, the above-described method for manufacturing a display device in which the first layer is an organic film formed by vapor deposition is also one embodiment of the present invention.

Furthermore, the above-described method for manufacturing a display device in which the part of the first layer is removed by emitting the particles having a high sublimation property and dry air to the first layer in the second step is also one embodiment of the present invention.

One embodiment of the present invention is a method for manufacturing a display device including a display region, which includes a first step, a second step, a third step, a fourth step, a fifth step, a sixth step, a seventh step, and an eighth step. The first step includes the steps of providing a first layer over a first surface of a first substrate; providing a first insulating layer over the first layer; providing a first electrode over the first insulating layer; providing a second insulating layer over the first electrode; providing a first opening by removing part of the second insulating layer; and providing a display element, a second electrode, and a second layer over the second insulating layer. The second step includes the steps of providing a third layer over a second surface of a second substrate; providing a third insulating layer over the third layer; and providing a second opening by removing part of the third layer and part of the third insulating layer. The third step includes the step of making the first substrate and the second substrate overlap with each other with an adhesive layer positioned therebetween so that the first surface and the second surface face each other and the first opening and the second opening overlap with each other in a region. The fourth step includes the step of separating the first substrate from the first insulating layer together with the first layer. The fifth step includes the step of providing a third substrate so that the first insulating layer and the third substrate overlap with each other. The sixth step includes the step of separating the second substrate from the third insulating layer together with the third layer. The seventh step includes the step of removing part of the second layer. The eighth step includes the step of providing a fourth substrate so that the third insulating layer and the fourth substrate overlap with each other. In the first step, the second electrode and the second layer are provided in this order over the first electrode at a position overlapping with the first opening so that the second electrode and the second layer are at least partly in contact with each other. In the third step, the adhesive layer includes a first region where the adhesive layer and the second opening overlap with each other and the second layer includes a second region where the second layer and the second opening overlap with each other. In the sixth step, at least part of the adhesive layer in the first region and at least part of the second layer in the second region are separated together with the second substrate. In the seventh step, part of the second layer is removed by emitting particles having a high sublimation property and dry air to the second layer which remains over the second electrode in the sixth step, so that at least part of the second electrode is exposed.

In the above-described method for manufacturing a display device, $(180°-\alpha 2)/2-10°<\beta 2<(180°-\alpha 2)/2+10°$ is preferably satisfied where $\alpha 2$ is an inclination angle of an edge of the second insulating layer and $\beta 2$ is an emission angle of the particles and the dry air in the seventh step.

Furthermore, the above-described method for manufacturing a display device in which the second layer includes a stack of an EL layer and a conductive layer is also one embodiment of the present invention.

Moreover, the above-described method for manufacturing a display device in which the first substrate is a glass substrate, a quartz substrate, a sapphire substrate, a ceramic substrate, a metal substrate, a semiconductor substrate, or a plastic substrate, and the second substrate is a glass substrate, a quartz substrate, a sapphire substrate, a ceramic substrate, a metal substrate, a semiconductor substrate, or a plastic substrate is also one embodiment of the present invention.

Furthermore, the above-described method for manufacturing a display device in which the third substrate and the fourth substrate have flexibility is also one embodiment of the present invention.

The above-described method for manufacturing a display device in which the first layer includes tungsten, molybdenum, titanium, tantalum, niobium, nickel, cobalt, zirconium, ruthenium, rhodium, palladium, osmium, iridium, or silicon, and the third layer includes tungsten, molybdenum, titanium, tantalum, niobium, nickel, cobalt, zirconium, ruthenium, rhodium, palladium, osmium, iridium, or silicon is also one embodiment of the present invention.

Furthermore, the above-described method for manufacturing a display device in which the display element is a light-emitting element is also one embodiment of the present invention.

One embodiment of the present invention is a method for manufacturing an electronic device including a display device, in which the electronic device includes a battery, a touch sensor, or a housing and the display device is manufactured by any of the above-described methods for manufacturing a display device.

One embodiment of the present invention provides a method for manufacturing a display device, which does not easily damage an electrode. One embodiment of the present invention provides a highly reliable display device and a method for manufacturing the display device.

Furthermore, one embodiment of the present invention provides a method for manufacturing a novel display device, a method for manufacturing a novel electronic device, or the like. One embodiment of the present invention provides a method for manufacturing a display device having high display quality, a method for manufacturing an electronic device having high display quality, or the like. One embodiment of the present invention provides a method for manufacturing a display device that is not easily broken, a method for manufacturing an electronic device that is not easily broken, or the like.

Note that the descriptions of these effects do not disturb the existence of other effects. One embodiment of the present invention need not have all of these effects. Other effects will be apparent from and can be derived from the description of the specification, the drawings, the claims, and the like.

BRIEF DESCRIPTION OF THE DRAWINGS

In the accompanying drawings:

FIGS. 1A1, 1A2, 1B, 1C1, 1C2, 1D1, and 1D2 illustrate a manufacturing process of one embodiment of a display device;

FIGS. 2A1, 2A2, 2B1, 2B2, 2C1, 2C2, 2D1, and 2D2 illustrate a manufacturing process of one embodiment of a display device;

FIGS. 4A1, 4A2, 4B1, 4B2, 4C1, 4C2, and 4D illustrate a manufacturing process of one embodiment of a display device;

FIGS. 5A, 5B1, and 5B2 illustrate a manufacturing process of one embodiment of a display device;

FIGS. 6A1, 6A2, 6B1, 6B2, 6C1, 6C2, and 6D illustrate a manufacturing process of one embodiment of a display device;

FIGS. 7A, 7B, 7C, 7D1, and 7D2 illustrate a manufacturing process of one embodiment of a display device;

FIGS. 8A1, 8A2, 8B, 8C1, and 8C2 illustrate a manufacturing process of one embodiment of a display device;

FIGS. 9A1, 9A2, 9B1, 9B2, 9C1, 9C2, and 9D illustrate a manufacturing process of one embodiment of a display device;

FIGS. 10A, 10B1, and 10B2 illustrate a manufacturing process of one embodiment of a display device;

FIGS. 26A and 26B are a perspective view and a cross-sectional view illustrating one embodiment of a display device;

FIGS. 29A and 29B are cross-sectional views each illustrating one embodiment of a display device;

FIGS. 34A1, 34A2, 34B1, and 34B2 are cross-sectional views each illustrating one embodiment of a transistor;

FIGS. 35A1, 35A2, 35A3, 35B1, and 35B2 are cross-sectional views each illustrating one embodiment of a transistor;

DETAILED DESCRIPTION OF THE INVENTION

Figure 3:
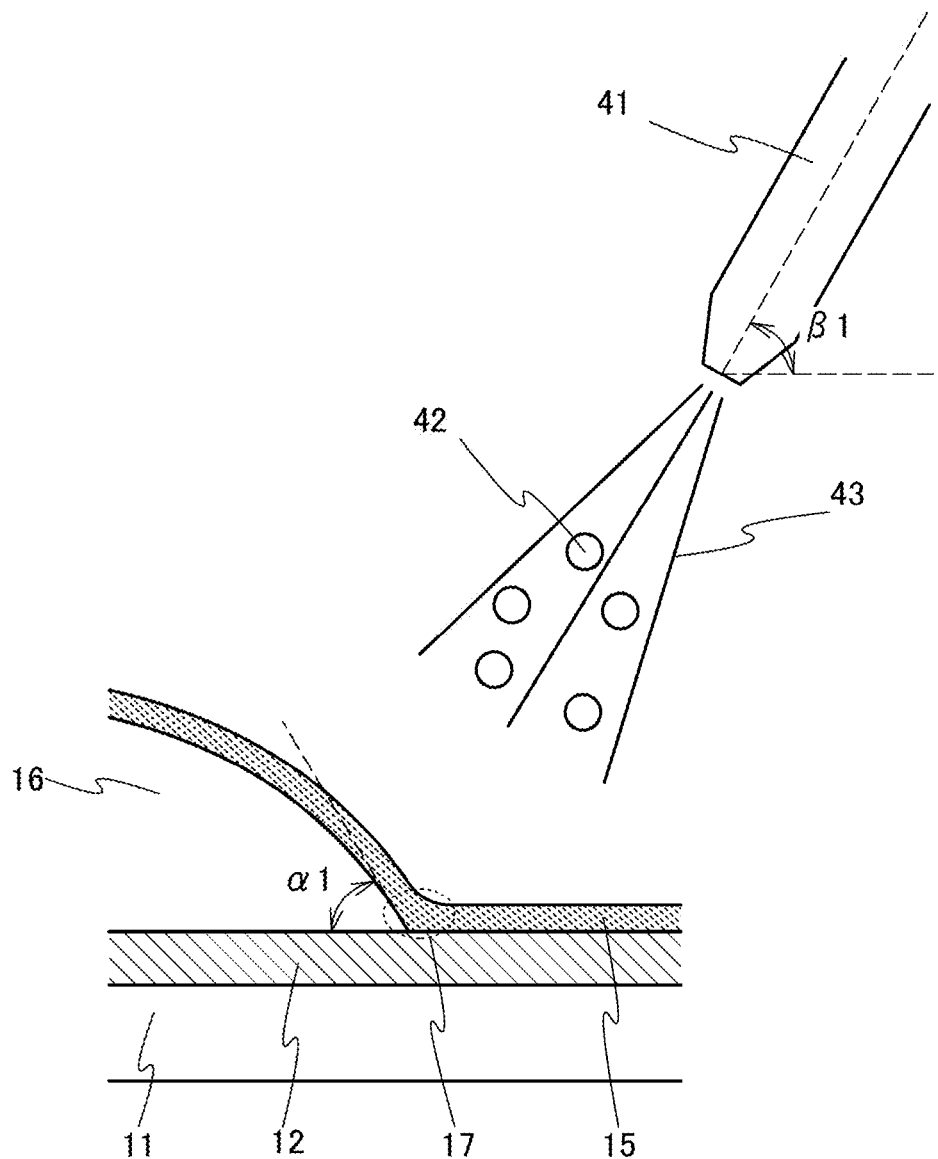
FIG. 3 illustrates a manufacturing process of one embodiment of a display device.

Embodiments will be described in detail below with reference to the accompanying drawings. Note that the present invention is not limited to the description below, and it is easily understood by those skilled in the art that various changes and modifications can be made without departing from the spirit and scope of the present invention. Therefore, the present invention should not be construed as being limited to the description in the following embodiments. In the structures of the invention described below, the same portions or portions having similar functions are denoted by the same reference numerals in different drawings, and explanation thereof is not repeated.

The position, size, range, and the like of each component illustrated in the drawings and the like are not accurately represented in some cases to facilitate understanding of the invention. Therefore, the disclosed invention is not necessarily limited to the position, the size, range, and the like disclosed in the drawings and the like. For example, in the actual manufacturing process, a resist mask or the like might be unintentionally reduced in size by treatment such as etching, which might not be illustrated for easy understanding.

Especially in a top view (also referred to as a plan view), some components might not be illustrated for easy understanding.

In this specification and the like, the term such as an "electrode" or a "wiring" does not limit the function of a component. For example, an "electrode" is used as part of a "wiring" in some cases, and vice versa. Furthermore, the term "electrode" or "wiring" can also mean a combination of a plurality of "electrodes" and "wirings" formed in an integrated manner.

Note that the term "over" or "under" in this specification and the like does not necessarily mean that a component is placed "directly on" or "directly below" and "directly in contact with" another component. For example, the expression "electrode B over insulating layer A" does not necessarily mean that the electrode B is on and in direct contact with the insulating layer A and can mean the case where another component is provided between the insulating layer A and the electrode B.

Functions of a source and a drain might be switched depending on operation conditions, e.g., when a transistor having opposite polarity is employed or the direction of current flow is changed in circuit operation. Thus, it is difficult to define which is a source or a drain. Accordingly, the terms "source" and "drain" can be switched in this specification.

Note that in this specification and the like, the expression "electrically connected" includes the case where components are connected through an "object having any electric function". There is no particular limitation on an "object having any electric function" as long as electric signals can be transmitted and received between components that are connected through the object. Accordingly, even when the expression "electrically connected" is used in this specification, there is a case in which no physical connection is made and a wiring is just extended in an actual circuit.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" or "orthogonal" indicates that the angle formed between two straight lines is greater than or equal to 80° and less than or equal to 100°, and accordingly also includes the case where the angle is greater than or equal to 85° and less than or equal to 95°.

In this specification, in the case where an etching step is performed after a lithography process, a resist mask formed in the lithography process is removed after the etching step, unless otherwise specified.

A voltage usually refers to a potential difference between a given potential and a reference potential (e.g., a ground potential (a GND potential) or a source potential). A voltage can be referred to as a potential and vice versa.

Note that an impurity in a semiconductor refers to, for example, elements other than the main components of the semiconductor. For example, an element with a concentration lower than 0.1 at. % can be regarded as an impurity. When an impurity is contained, the density of states (DOS) in a semiconductor may be increased, the carrier mobility may be decreased, or the crystallinity may be decreased, for example. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is silicon, examples of an impurity that changes characteristics of the semiconductor include oxygen, Group 1 elements except hydrogen, Group 2 elements, Group 13 elements, and Group 15 elements.

Note that ordinal numbers such as "first" and "second" in this specification and the like are used in order to avoid confusion among components and do not denote the priority or the order such as the order of steps or the stacking order. The term without an ordinal number in this specification and the like might be provided with an ordinal number in a claim in order to avoid confusion among components. The term with an ordinal number in this specification and the like might be provided with a different ordinal number in a claim. Moreover, the term with an ordinal number in this specification and the like might not be provided with any ordinal number in a claim.

Note that in this specification, the channel length refers to, for example, a distance, observed in a top view of a transistor, between a source (a source region or a source electrode) and a drain (a drain region or a drain electrode) in a region where a semiconductor (or a portion where a current flows in a semiconductor when the transistor is on) and a gate electrode overlap with each other or a region where a channel is formed. In one transistor, channel lengths are not necessarily the same in all regions. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths are not necessarily the same in all regions. In other words, the channel width of one transistor is not limited to one value in some cases. Therefore, in this specification, the channel width is any one of values, the maximum value, the minimum value, or the average value in a region where a channel is formed.

Embodiment 1

A method for manufacturing a display device of one embodiment of the present invention will be described below with reference to the drawings. FIG. 1A2 is a schematic top view of a process member 10. FIG. 1A1 is a schematic cross-sectional view taken along the dashed-dotted line M1-M2 in FIG. 1A2.

The process member 10 includes a first substrate 11, a terminal electrode 12, a wiring 13, a functional layer 14, an insulating layer 16, a first layer 15, an adhesive layer 35, and a second substrate 31. The terminal electrode 12, the wiring 13, and the functional layer 14 are provided over the first substrate 11 and electrically connected to each other. The insulating layer 16 is provided over the terminal electrode 12, the wiring 13, and the first substrate 11. The first layer 15 is provided over the terminal electrode 12 and the insulating layer 16. The adhesive layer 35 is provided so as to be sandwiched between the first substrate 11 and the second substrate 31. In other words, the adhesive layer 35 is provided over the first substrate 11, the wiring 13, the functional layer 14, the first layer 15, and the insulating layer 16.

The second substrate 31 and the adhesive layer 35 each include an opening at a position that overlaps with part of the first layer 15. In FIGS. 1A1 and 1A2, the opening included in the second substrate 31 and the opening included in the adhesive layer 35 are collectively referred to as an opening 36. Furthermore, the insulating layer 16 includes an opening 37 at a position that overlaps with part of the terminal electrode 12 and part of the first layer 15. In the top view, the opening 37 is provided inside the opening 36. Note that the opening 37 is not shown in FIG. 1A2.

Note that a terminal electrode 12a may be provided over the terminal electrode 12 and the insulating layer 16 (see FIGS. 1D1 and 1D2). In this case, the first layer 15 is provided over the terminal electrode 12a. Moreover, the insulating layer 16 may be omitted from the process member 10 (see FIGS. 2A1 and 2A2). In this case, the first layer 15 is provided over the terminal electrode 12 and the first substrate 11. Furthermore, the opening 36 may reach an edge of the second substrate 31. FIGS. 2B1 and 2B2 are a cross-sectional view and a top view of the process member 10 having a structure in which the opening 36 reaches an edge on one short side of the second substrate 31. Moreover, FIGS. 2C1 and 2C2 are a cross-sectional view and a top view of the process member 10 having a structure in which the opening 36 reaches an edge on one short side and two long sides of the second substrate 31.

The method for manufacturing a display device of one embodiment of the present invention includes a step of preparing the process member 10 and a step of removing part of the first layer 15 by emitting particles having a high sublimation property to the process member 10. A cross section in the step of emitting particles 42 from a nozzle 41 toward the first layer 15 is schematically shown in FIG. 1B. Removing part of the first layer 15 can expose the terminal electrode 12 (see FIGS. 1C1 and 1C2). Alternatively, removing part of the first layer 15 in the process member 10 illustrated in FIGS. 1D1 and 1D2 can expose the terminal electrode 12a (see FIGS. 2D1 and 2D2).

Note that the first layer 15 is preferably an organic film formed by vapor deposition; with this structure, the first layer 15 over the terminal electrode 12 can be easily separated.

By collision of the particles 42 with the first layer 15, the first layer 15 is separated from the terminal electrode 12. Furthermore, the first layer 15 can be separated in some cases in such a manner that the particles 42 are introduced between the first layer 15 and the terminal electrode 12 and are then expanded when they are vaporized.

Because the particles 42 have a high sublimation property, damage to the terminal electrode 12 can be reduced and a scatter of the liquid on or around the process member 10 can be prevented. Thus, the first layer 15 can be removed without damage to the process member 10 or liquid waste treatment.

Examples of the particles 42 include a solid form of carbon dioxide (also called dry ice), naphthalene, and dichlorobenzene. As the particles 42, carbon dioxide in a solid phase (dry ice) is particularly preferable. To prevent the dispersion of a gas that is obtained by sublimation at the time of emitting the particles 42, a gas exhaust process is preferably performed in a chamber where the process member 10 and the nozzle 41 are held, for example. Moreover, it is preferable to adjust the temperature inside the chamber and/or the temperature of dry air 43 that is to be described later, in accordance with the material used as the particles 42.

Here, the functional layer 14 includes a semiconductor element such as a transistor or a capacitor or a display element. Examples of the display element include an organic EL element and a liquid crystal element. The process member 10 including the functional layer 14 can be regarded as a display device or a semiconductor device. By connecting a flexible printed circuit (FPC) to the terminal electrode 12 exposed in FIG. 1C1 via an anisotropic conductive connection layer such as an anisotropic conductive film (ACF), a signal or electric power can be supplied to the functional layer 14 from the outside.

An enlarged cross-sectional view of a portion 50 in FIG. 1B is illustrated in FIG. 3, where the nozzle 41 emits the particles 42 and the dry air 43 toward the first layer 15. The emission of the dry air 43 as well as the particles 42 allows the first layer 15 separated by the particles 42 to be removed without being left over the terminal electrode 12.

To expose the terminal electrode 12 in the step of emitting the particles 42 to the first layer 15, at least the first layer 15 in a region in contact with the terminal electrode 12 is removed. Here, the first layer 15 is provided continuously over the terminal electrode 12 and the insulating layer 16, the first layer 15 tends to remain in a region 17 located in the vicinity of an edge of the insulating layer 16 over the terminal electrode 12.

In the method for manufacturing a display device of one embodiment of the present invention, the first layer 15 over the terminal electrode 12 including the first layer 15 in the region 17 can be effectively removed. In FIG. 3, when the inclination angle of the edge of the insulating layer 16 is α1 and the emission angle of the particles 42 and the dry air 43, that is, the inclination angle of the nozzle 41 is β1, the inclination angle β1 preferably satisfies the relation, $(180°-α1)/2-10°<β1<(180°-α1)/2+10°$. Note that the inclination angle of the edge of the insulating layer 16 refers to the angle formed between a side surface and a bottom surface of the insulating layer 16. If the side surface of the insulating layer 16 is curved, the inclination angle of the edge of the insulating layer 16 refers to the angle formed between a plane that is in contact with a vicinity of a boundary between the side surface and the bottom surface (i.e., the edge of the insulating layer 16) and the bottom surface. The inclination angle of the nozzle 41 refers to the angle formed between the horizontal plane and the center axis of the nozzle 41.

Note that the terminal electrode 12 and the wiring 13 may be formed of the same material or different materials. In this embodiment, an example in which the terminal electrode 12 and the wiring 13 are concurrently formed of the same material is described. Although not shown, the terminal electrode 12 and the wiring 13 include a plurality of wirings.

The structure described in this embodiment can be implemented in appropriate combination with any of the structures described in the other embodiments.

Embodiment 2

In this embodiment, a method for manufacturing the process member described in Embodiment 1 is described below with reference to the drawings. In this embodiment, a substrate provided with a structure body including a functional layer and the structure body are collectively referred to as an element substrate, and a substrate that faces the element substrate in the process member and a structure body provided on the substrate are collectively referred to as a counter substrate.

Manufacturing Method Example 1

FIG. 4A2 is a schematic top view of an element substrate 20. FIG. 4A1 is a schematic cross-sectional view taken along the dashed-dotted line M1-M2 in FIG. 4A2. FIG. 4B2 is a schematic top view of a counter substrate 30. FIG. 4B1 is a schematic cross-sectional view taken along the dashed-dotted line M1-M2 in FIG. 4B2.

The element substrate 20 includes the first substrate 11, the terminal electrode 12, the wiring 13, the functional layer 14, the insulating layer 16, the first layer 15, and a second layer 25 (see FIG. 4A1). The terminal electrode 12, the wiring 13, and the functional layer 14 are provided over the first substrate 11 and are electrically connected to each other. The insulating layer 16 is provided over the terminal electrode 12, the wiring 13, and the first substrate 11. The first layer 15 and the second layer 25 are provided in this order over the terminal electrode 12 and the insulating layer 16. The insulating layer 16 includes the opening 37 at a position that overlaps with part of the terminal electrode 12 and part of the first layer 15.

As the second layer 25, a film having low adhesion to the first layer 15 is used. In the case where an organic EL element is included in the functional layer 14, the first layer 15 and the second layer 25 can be an EL layer and a transparent conductive film, respectively, for example. With this structure, the step of forming the first layer 15 and the second layer 25 can be included in the step of forming the functional layer 14.

In the top view, the second layer 25 is preferably positioned inside the first layer 15. In the case where the second layer 25 does not have conductivity, the second layer 25 may be provided so that an edge of the second layer 25 is aligned with an edge of the first layer 15 or positioned outside the edge of the first layer 15. Note that like the first layer 15, the second layer 25 is also provided so as to include the opening 37 in the top view.

The counter substrate 30 includes a support substrate 26, a separation layer 27, and a separation base layer 28 (the separation base layer 28 is a layer which remains on the first substrate 11 side except a separation base layer 28A after separation) (see FIGS. 4B1, 4C1 and 4D). The separation layer 27 and the separation base layer 28 are provided in this order over the support substrate 26. The separation layer 27 includes an opening 38. In the example illustrated in FIG. 4B1, the separation base layer 28 includes an opening at a position that overlaps with the opening 38; however, the separation base layer 28 does not necessarily include such an opening.

As the separation layer 27 and the separation base layer 28, films having low adhesion to each other are used. Note that the separation layer 27 and the separation base layer 28 may each have a stacked-layer structure. Here, in the case where a structure body is formed over the separation base layer 28, materials of the separation layer 27 and the separation base layer 28 are preferably selected so that the adhesion at the interface between the separation layer 27 and the separation base layer 28 can be adjusted in order to prevent the separation layer 27 from being separated from the separation base layer 28 during the formation process of the structure body. For example, a tungsten film can be used as the separation layer 27, and a stacked-layer film of a silicon oxide film and a silicon oxynitride film can be used as the separation base layer 28. By forming the separation base layer 28 over the separation layer 27 or performing heat treatment after the formation of the separation layer 27 and the separation base layer 28, a tungsten oxide film functioning as an embrittlement layer can be formed in the separation layer 27 at the vicinity of the boundary between the separation layer 27 and the separation base layer 28.

As the support substrate 26, a substrate that can withstand a high-temperature process, such as a glass substrate or a quartz substrate, can be used.

First, the element substrate 20 and the counter substrate 30 are prepared and bonded to each other with the adhesive layer 35 sandwiched therebetween (see FIGS. 4C1 and 4C2). At this time, bonding is performed so that the opening 37 and the opening 38 overlap with each other.

Next, the support substrate 26 and the separation layer 27 are separated from the separation base layer 28, utilizing low adhesion between the separation layer 27 and the separation base layer 28 (see FIG. 4D). At this time, an adhesive layer 35A, the separation base layer 28A, and a second layer 25A at a position that overlaps with the opening 38 are separated together with the support substrate 26, so that an opening 34 is formed on the first substrate 11 side. Note that part of the second layer 25 is not separated and remains on the first substrate 11 side.

Next, a substrate 31b including an opening is attached to the separation base layer 28 with an adhesive layer 29 sandwiched therebetween (see FIG. 5A). This attachment is performed so that the opening overlaps with the opening 34. The adhesive layer 29 is positioned on the substrate 31b side and faces the separation base layer 28 at the time of the attachment in the example illustrated in FIG. 5A; however, the adhesive layer 29 may be positioned over the separation base layer 28. Although a liquid adhesive resin may be applied as the adhesive layer 29, a sheet-shaped adhesive resin may be used as well, in which case the adhesive layer 29 can easily have an opening which overlaps with the opening included in the substrate 31b. In FIG. 5A, the opening included in the substrate 31b and the opening included in the adhesive layer 29 are collectively referred to as an opening 32. Although the opening 32 and the opening 34 may have the same size in the top view, it is preferable that the opening 32 be smaller than the opening 34.

The substrate 31b is preferably a flexible substrate.

Through the above-described process, a process member 10A can be fabricated (see FIGS. 5B1 and 5B2). In FIG. 5B1, the opening 32 and the opening 34 illustrated in FIG. 5A are collectively referred to as the opening 36. Note that the process member 10A is different from the process member 10 described in Embodiment 1 in that the substrate 31b, the adhesive layer 29, and the separation base layer 28 are included instead of the second substrate 31 and that the second layer 25 is included over the first layer 15 in a region not overlapping with the opening 36.

Manufacturing Method Example 2

In this manufacturing method example, a method for manufacturing a process member which is different from Manufacturing Method Example 1 is described. The same structure as that described above is not described and only different points are described below.

FIG. 6A2 is a schematic top view of an element substrate 20a. FIG. 6A1 is a schematic cross-sectional view taken along the dashed-dotted line M1-M2 in FIG. 6A2. The element substrate 20a illustrated in FIGS. 6A1 and 6A2 is different in structure from the element substrate 20 illustrated in FIGS. 4A1 and 4A2 in that a support substrate 21, a separation layer 22, and a separation base layer 23 are included instead of the substrate 11. The separation layer 22 and the separation base layer 23 are provided in this order over the support substrate 21, and a structure body such as the terminal electrode 12 is provided over the separation base layer 23.

As the support substrate 21, a material similar to that of the support substrate 26 can be used. As the separation layer 22 and the separation base layer 23, materials similar to those of the separation layer 27 and the separation base layer 28, respectively, can be used.

FIG. 6B2 is a schematic top view of a counter substrate 30a. FIG. 6B1 is a schematic cross-sectional view taken along the dashed-dotted line M1-M2 in FIG. 6B2. The counter substrate 30a is different from the counter substrate 30 illustrated in FIGS. 4B1 and 4B2 in that the separation layer 27 does not include the opening 38.

First, the element substrate 20a and the counter substrate 30a are bonded to each other with the adhesive layer 35 sandwiched therebetween (see FIGS. 6C1 and 6C2).

Next, the support substrate 21 and the separation layer 22 are separated from the separation base layer 23, utilizing low adhesion at the interface between the separation layer 22 and the separation base layer 23 (see FIG. 6D).

Then, a substrate 31a is attached to the separation base layer 23 with an adhesive layer 29a sandwiched therebetween (see FIG. 7A). The substrate 31a is preferably a flexible substrate.

Next, the support substrate 26 and the separation layer 27 are separated from the separation base layer 28, utilizing low adhesion at the interface between the separation layer 27 and the separation base layer 28 (see FIG. 7B).

Then, the substrate 31b is attached to the separation base layer 28 with an adhesive layer 29b sandwiched therebetween; thus, a process member 10b is obtained (see FIGS. 7C, 7D1, and 7D2). The substrate 31b is preferably a flexible substrate.

Next, the process member 10b is subjected to cutting processing with a cutter 44 capable of cutting an object by rotating, so that a groove portion 33 is formed (see FIGS. 8A1 and 8A2). The groove portion 33 is formed inside the second layer 25 in the plan view. A region surrounded by the groove portion 33 preferably overlaps with part of the second layer 25. Furthermore, the depth of the groove portion 33 is more than half the thickness of the substrate 31b, and the groove portion 33 may reach the second layer 25. In the example illustrated in FIG. 8A1, the groove portion 33 is formed in the substrate 31b, the adhesive layer 29b, the separation base layer 28, and the adhesive layer 35.

As the cutter 44, an end mill, a drill, a cutter for rotary cutting, or the like can be used. Adjusting the depth of the cut by the cutter 44 allows the formation of the groove portion 33 without damage to the terminal electrode 12 and/or the wiring 13.

Then, by utilizing the low adhesion between the first layer 15 and the second layer 25 and the groove portion 33 as a starting point of removal, the first layer 15 and the layers above the first layer 15 which overlap with the region surrounded by the groove portion 33 are removed (see FIG. 8B). In other words, the substrate 31B, an adhesive layer 29B, a separation base layer 28B, an adhesive layer 35B, and a second layer 25B which overlap with the region surrounded by the groove portion 33 are removed. The removal can be performed with an adhesive tape or an adhesive roller, for example. As the depth of the groove portion 33 is larger, the removal can be performed more easily.

Through the above-described process, a process member 10B can be fabricated (see FIGS. 8C1 and 8C2). Note that the process member 10B is different from the process member 10A in that the substrate 31a, the adhesive layer 29a, and the separation base layer 23 are included instead of the first substrate 11.

Manufacturing Method Example 3

In this manufacturing method example, a method for manufacturing a process member which is different from Manufacturing Method Example 2 is described. The same structure as that described above is not described and only different points are described below.

FIG. 9A2 is a schematic top view of the element substrate 20a. FIG. 9A1 is a schematic cross-sectional view taken along the dashed-dotted line M1-M2 in FIG. 9A2. The element substrate 20a illustrated in FIGS. 9A1 and 9A2 has the same structure as the element substrate 20a illustrated in FIGS. 6A1 and 6A2.

FIG. 9B2 is a schematic top view of a counter substrate 30b. FIG. 9B1 is a schematic cross-sectional view taken along the dashed-dotted line M1-M2 in FIG. 9B2. The counter substrate 30b is different from the counter substrate 30a illustrated in FIGS. 6B1 and 6B2 in including a reflective layer 39. The reflective layer 39 is provided so as to surround a region as illustrated in FIG. 9B2. In the top view, the region is preferably smaller than a region where the first layer 15 and the second layer 25 overlap with each other.

The element substrate 20a and the counter substrate 30b are bonded to each other, the support substrates are each separated, and then different substrates are bonded, so that a process member 10c is obtained (see FIGS. 9C1 and 9C2). For the process from the preparation of the element substrate 20a and the counter substrate 30b up to and including this step, Manufacturing Method Example 2 can be referred to. Note that the element substrate 20a and the counter substrate 30b are bonded so that the region surrounded by the reflective layer 39 and the second layer 25 overlap with each other.

Next, the reflective layer 39 included in the process member 10c is irradiated with a laser beam 45 (see FIG. 9D). The irradiation is performed such that a closed curve is drawn with the laser beam 45 along the reflective layer 39 illustrated in FIG. 9C2. By the laser beam 45, a damaged region is formed in the substrate 31b, the adhesive layer 29b, and the separation base layer 28 in the region overlapping with the reflective layer 39. The damaged region is formed at least in the substrate 31b.

The reflective layer 39 is preferably formed of a material having high reflectance, for example, a material having a reflectance with respect to visible light of 70% or more. Furthermore, the reflective layer 39 is preferably formed of a material having high heat resistance. When the process member 10c includes the reflective layer 39, the damaged region can be formed without causing damage to the terminal electrode 12 and/or the wiring 13 by the laser beam 45.

Then, by utilizing the low adhesion between the first layer 15 and the second layer 25 and the damaged region as a starting point of removal, the first layer 15 and the layers above the first layer 15 which overlap with the region surrounded by the damaged region are removed (see FIG. 10A). In other words, a substrate 31C, an adhesive layer 29C, a separation base layer 28C, a reflective layer 39C, an adhesive layer 35C, and a second layer 25C which overlap with the region surrounded by the damaged region are removed. The removal can be performed with an adhesive tape or an adhesive roller, for example. As the damaged region is damaged more, the removal can be performed more easily.

Through the above-described process, a process member 10C can be fabricated (see FIGS. 10B1 and 10B2). Note that the process member 10C is different from the process member 10B in that part of the reflective layer 39 is left without being removed. Moreover, in some cases, the reflective layer 39 is not left in the process member 10C.

The structure described in this embodiment can be implemented in appropriate combination with any of the structures described in the other embodiments.

Embodiment 3

Figure 11A:
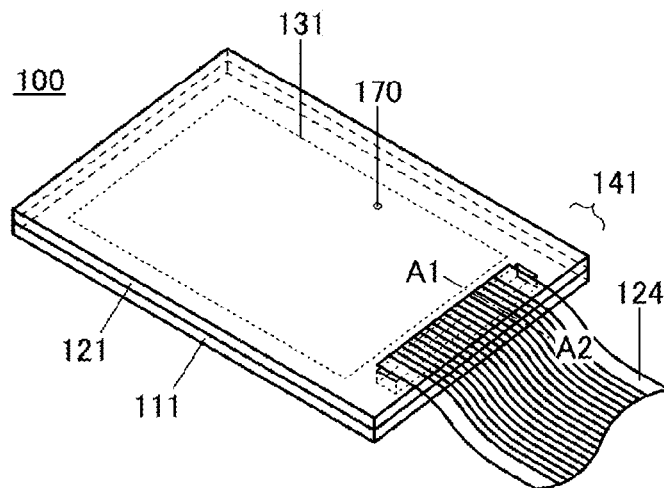
FIGS. 11A and 11B are a perspective view and a cross-sectional view illustrating one embodiment of a display device.
Figure 11B:
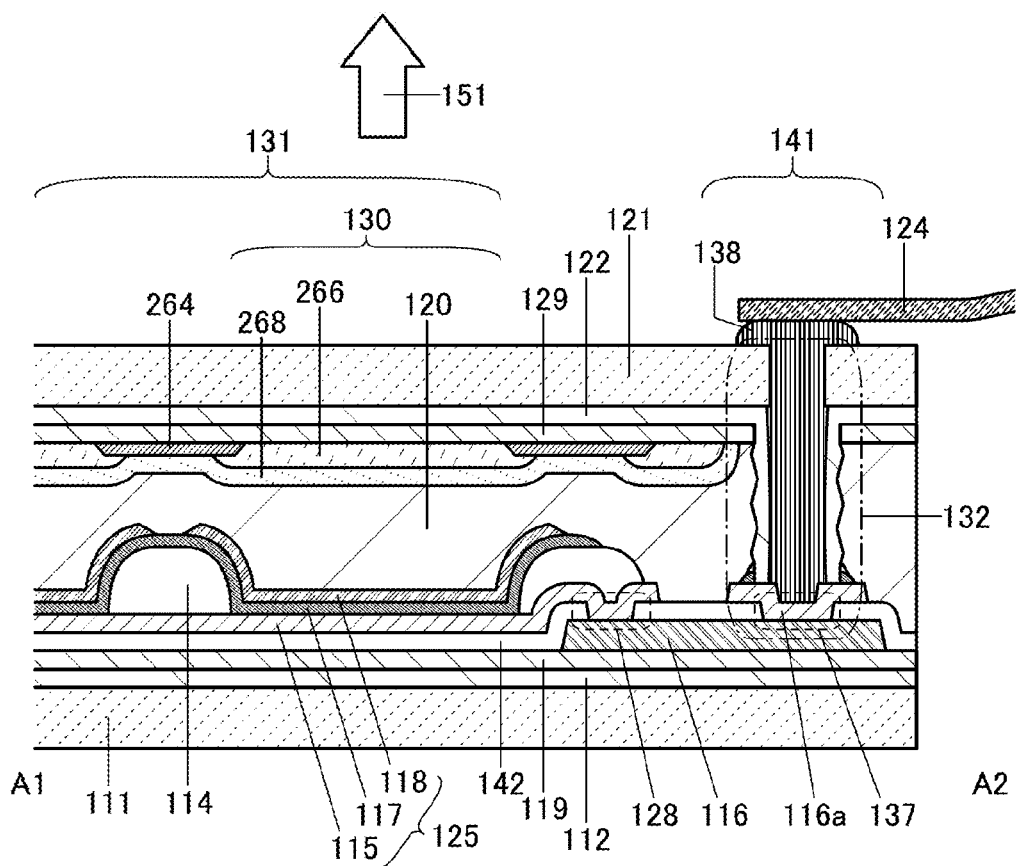

In this embodiment, a structure example of a display device 100 of one embodiment of the present invention will be described with reference to FIGS. 11A and 11B to FIGS. 26A and 26B. FIG. 11A is a perspective view of the display device 100 to which an external electrode 124 is connected, and FIG. 11B is a cross-sectional view taken along the dashed-dotted line A1-A2 in FIG. 11A. Note that the display device 100 disclosed in this specification is a display device in which a light-emitting element is used as a display element. As the display device 100 of one embodiment of the present invention, a display device having a top-emission structure is described as an example. Note that the display device 100 can be a display device having a bottom-emission structure or a dual-emission structure.

<Structure of Display Device>

The display device 100 described in this embodiment includes a display region 131 and a terminal region 141. The display region 131 includes a plurality of pixels 130. One pixel 130 includes at least one light-emitting element 125.

The display device 100 described in this embodiment includes an electrode 115, an EL layer 117, an electrode 118, a partition 114, and an electrode 116. Further, an insulating layer 142 is included over the electrode 116. The electrode 115 and the electrode 116 are electrically connected to each other in an opening 128 provided in the insulating layer 142. The electrode 116 and an electrode 116a are electrically connected to each other in an opening 137 provided in the insulating layer 142. The partition 114 is provided over the electrode 115, the EL layer 117 is provided over the electrode 115 and the partition 114, and the electrode 118 is provided over the EL layer 117.

The light-emitting element 125 is provided over a substrate 111 with an adhesive layer 112, an insulating layer 119, and the insulating layer 142 provided therebetween. The light-emitting element 125 includes the electrode 115, the EL layer 117, and the electrode 118.

The display device 100 described in this embodiment includes a substrate 121 provided over the electrode 118 with an adhesive layer 120 provided therebetween. In addition, the substrate 121 is provided with a light-blocking layer 264, a coloring layer (also referred to as a color filter) 266, and an overcoat layer 268 with an adhesive layer 122 and an insulating layer 129 provided therebetween.

Since the display device 100 described in this embodiment has a top-emission structure, light 151 emitted from the EL layer 117 is extracted from the substrate 121 side. The light 151 (e.g., white light) emitted from the EL layer 117 is partly absorbed when transmitted through the coloring layer 266 and converted into light with a specific color. In other words, the coloring layer 266 transmits light with a specific wavelength range. The coloring layer 266 can function as an optical filter layer for converting the light 151 into light of a different color.

Although the terminal electrode in the terminal region 141 is illustrated as being two layers of the electrode 116 and the electrode 116a in this embodiment, the present invention is not limited to this structure. The terminal electrode may be a single layer or three or more stacked layers.

Each of the substrate 121, the adhesive layer 122, the insulating layer 129, the adhesive layer 120, and the insulating layer 142 has an opening. The openings occupy regions which overlap with one another and each overlap with the electrode 116. In this specification and the like, these openings are collectively referred to as an opening 132. In the opening 132, the external electrode 124 and the electrode 116 are electrically connected to each other through an anisotropic conductive connection layer 138.

Figure 12A:
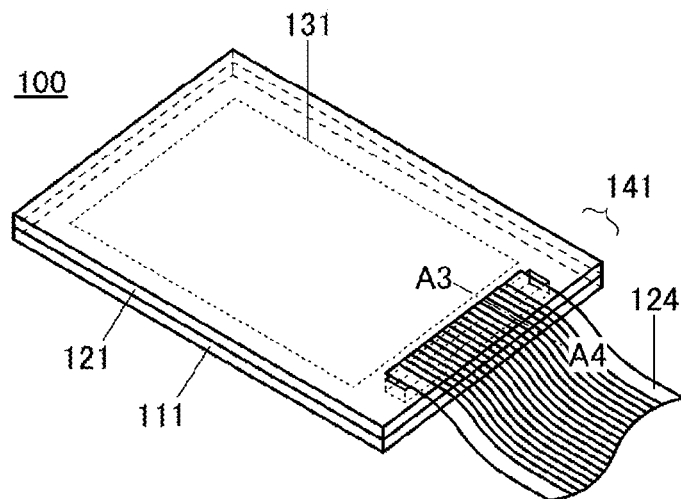
FIGS. 12A and 12B are a perspective view and a cross-sectional view illustrating one embodiment of a display device.
Figure 12B:
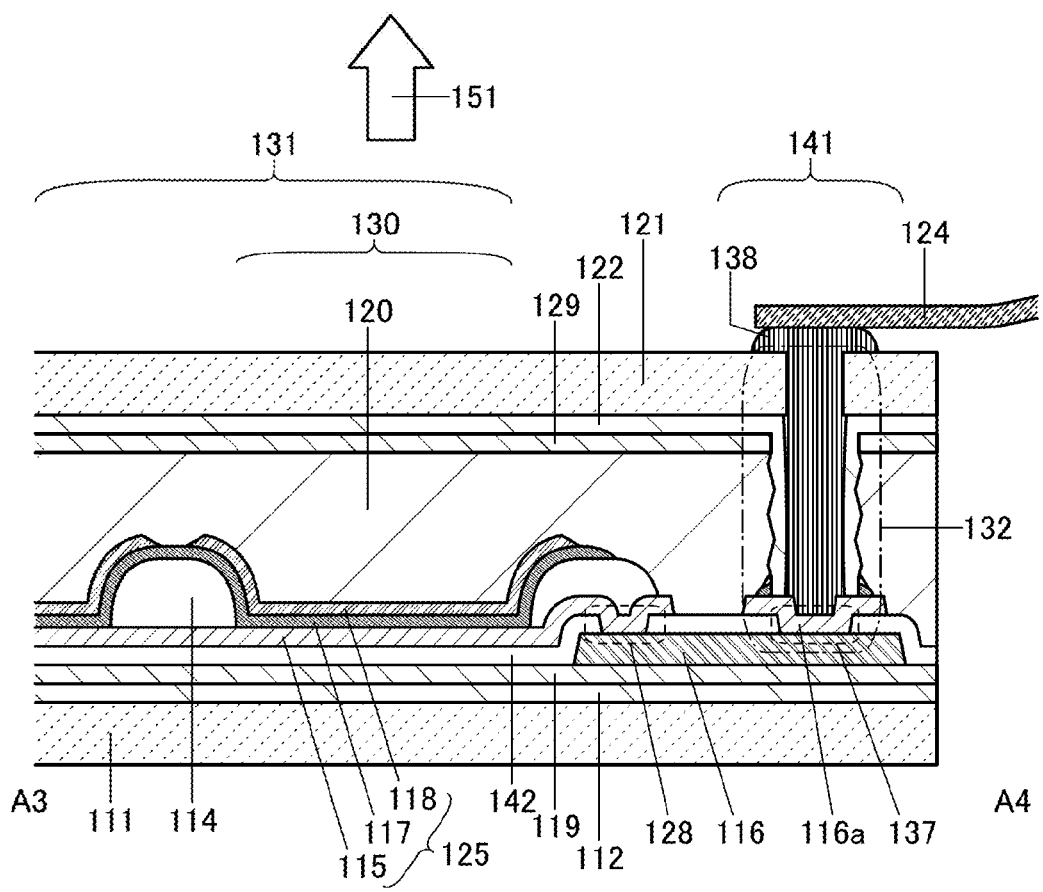

Note that as illustrated in FIGS. 12A and 12B, it is possible not to provide the light-blocking layer 264, the coloring layer 266, and the overcoat layer 268 in the display device 100. FIG. 12A is a perspective view of the display device 100 in which the light-blocking layer 264, the coloring layer 266, and the overcoat layer 268 are not provided, and FIG. 12B is a cross-sectional view taken along the dashed-dotted line A3-A4 in FIG. 12A.

Figure 13A:
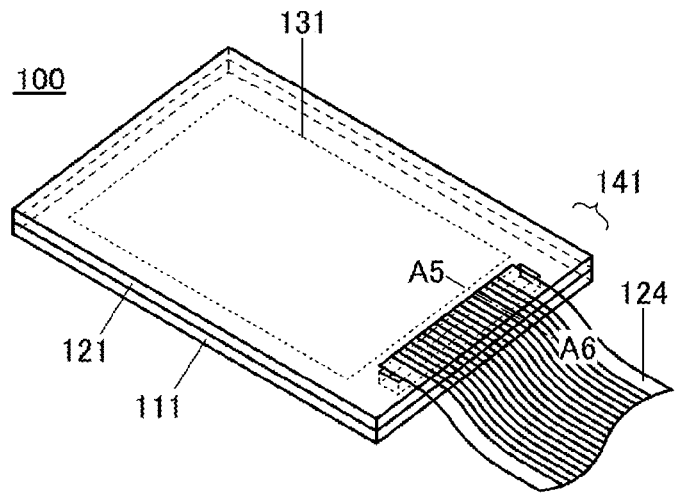
FIGS. 13A and 13B are a perspective view and a cross-sectional view illustrating one embodiment of a display device.
Figure 13B:
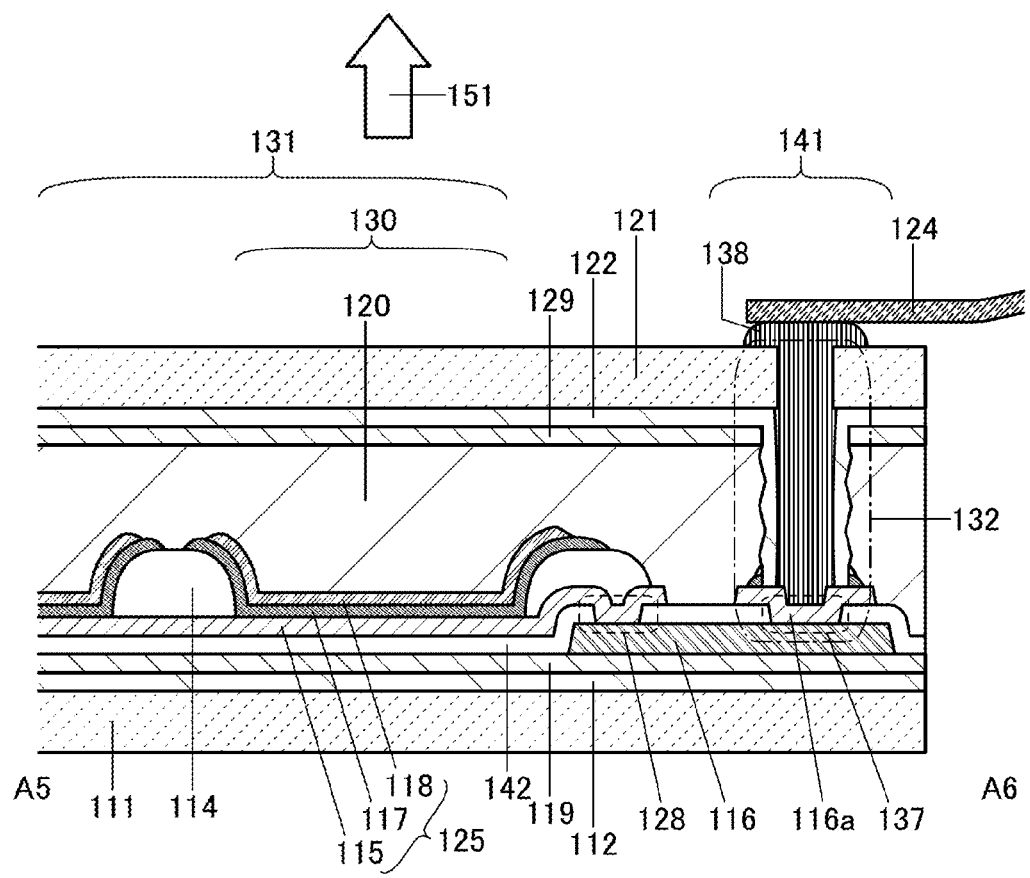

In particular, in the case where the EL layer 117 is provided by what is called side-by-side patterning by which the color of the light 151 varies from pixel to pixel, the coloring layer 266 may or may not be provided. FIG. 13A is a perspective view of the display device 100 including the EL layer 117 formed by side-by-side patterning and not including the coloring layer 266, and FIG. 13B is a cross-sectional view taken along the dashed-dotted line A5-A6 in FIG. 13A.

Figure 14A:
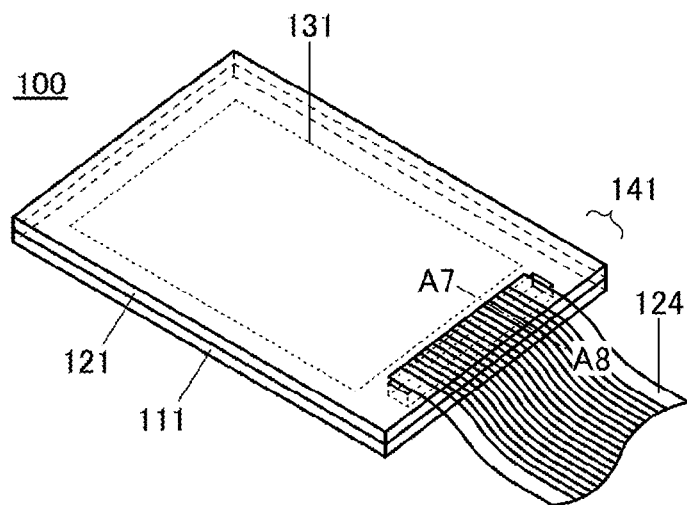
FIGS. 14A and 14B are a perspective view and a cross-sectional view illustrating one embodiment of a display device.
Figure 14B:
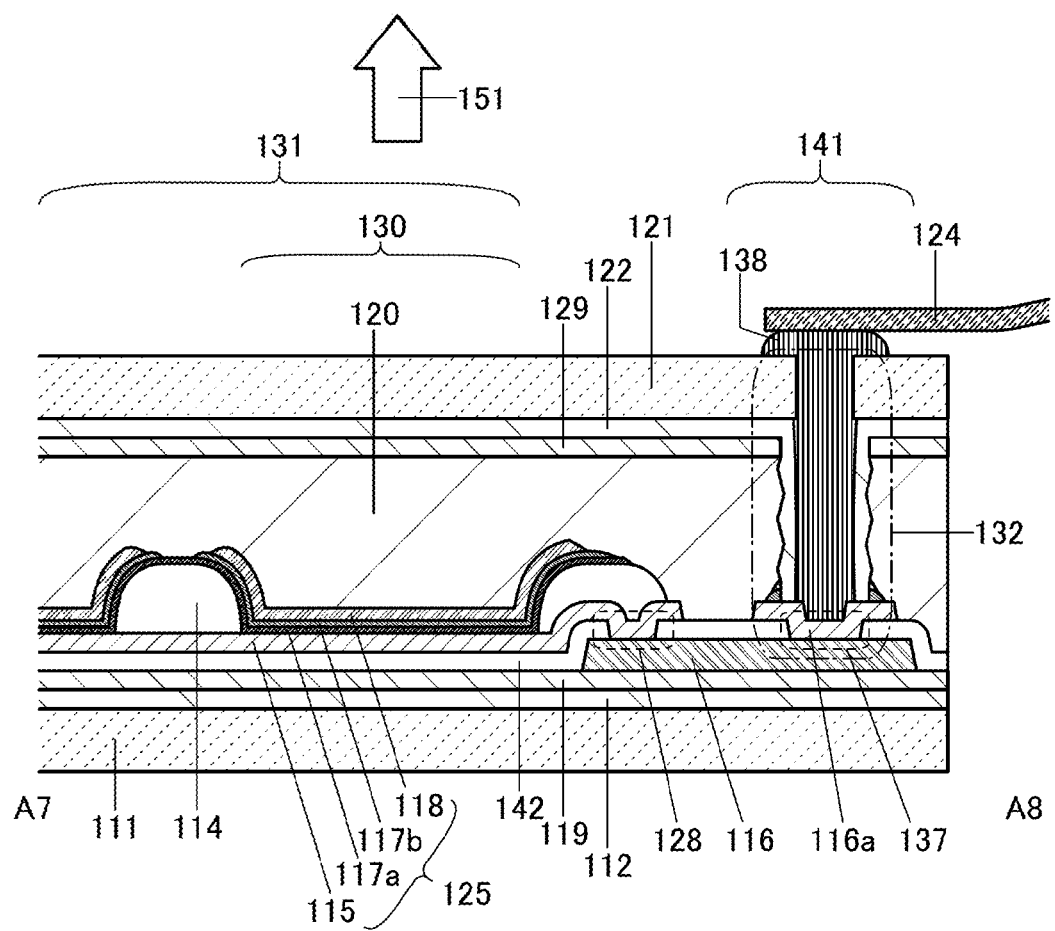

In the case where the EL layer 117 is formed by side-by-side patterning, the EL layer 117 may include a layer that is common among pixels (in the following description, referred to as a common layer) and a plurality of layers provided separately in pixels (in the following description, referred to as individual layers). FIG. 14A is a perspective view of the display device 100 including the EL layer 117 that includes a common layer 117a and an individual layer 117b and is formed by side-by-side patterning and not including the coloring layer 266. FIG. 14B is a cross-sectional view taken along the dashed-dotted line A7-A8 in FIG. 14A. Examples of the common layer 117a include a hole-injection layer, a hole-transport layer, an electron-transport layer, and an electron-injection layer. Examples of the individual layer 117b include a light-emitting layer. Note that the common layer 117a and the individual layer 117b each include two or more different layers.

When at least one of or all of the light-blocking layer 264, the coloring layer 266, and the overcoat layer 268 are not provided, a reduction in the manufacturing cost of the display device 100 can be achieved. Moreover, the light 151 can be emitted efficiently when the coloring layer 266 is not provided; therefore, luminance can be improved or power consumption can be reduced, for example.

In contrast, when the light-blocking layer 264, the coloring layer 266, and the overcoat layer 268 are provided, reflection of external light is suppressed and thus a contrast ratio, color reproducibility, or the like can be improved.

Figure 15A:
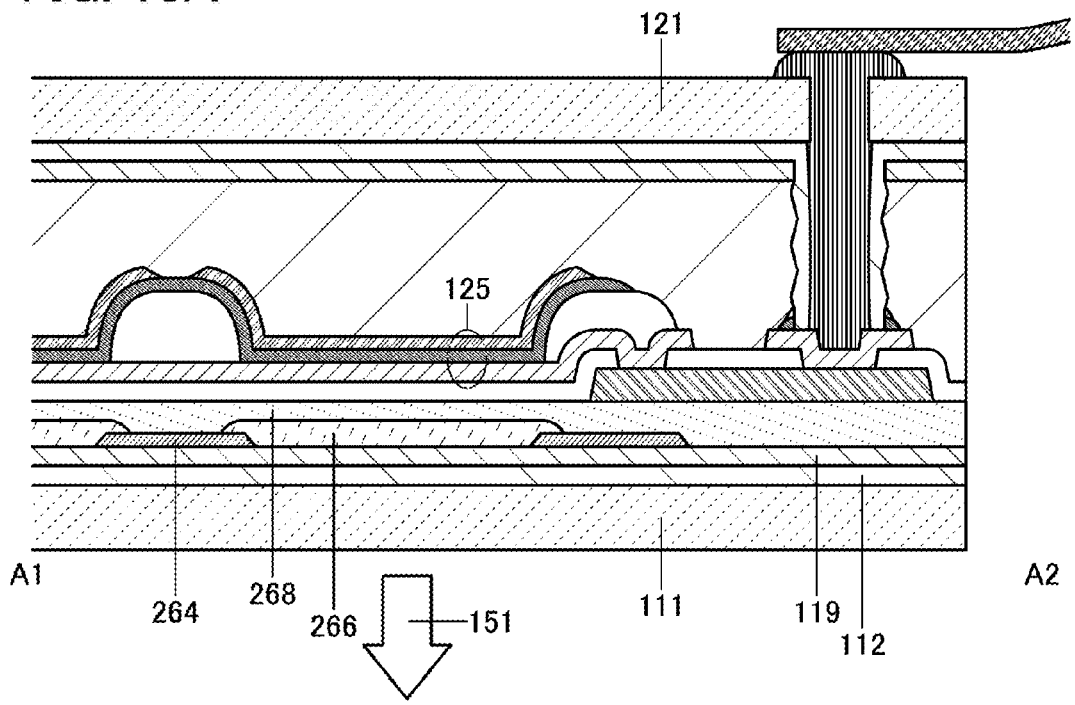
FIGS. 15A and 15B are cross-sectional views each illustrating one embodiment of a display device.
Figure 15B:
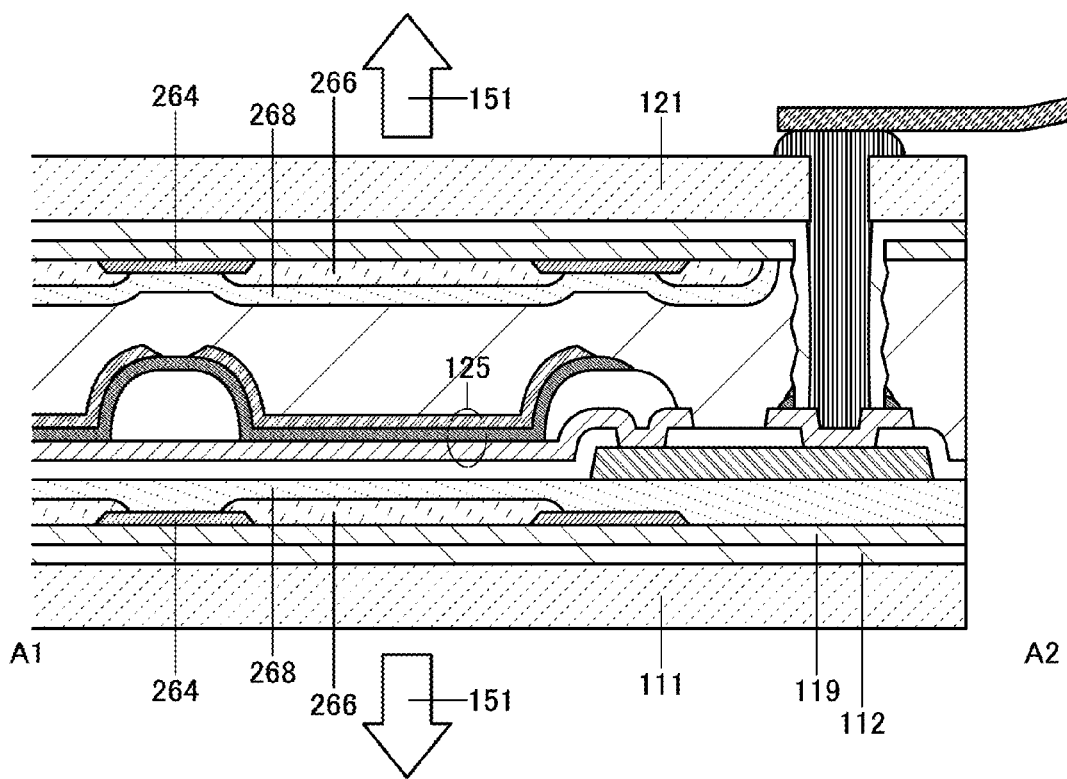

Note that in the case where the display device 100 has a bottom-emission structure, the light-blocking layer 264, the coloring layer 266, and the overcoat layer 268 may be provided on the substrate 111 side (see FIG. 15A). In the case where the display device 100 has a dual-emission structure, the light-blocking layer 264, the coloring layer 266, and the overcoat layer 268 may be provided on either or both of the substrate 111 side and the substrate 121 side (see FIG. 15B).

A switching element having a function of supplying a signal to the light-emitting element 125 may be provided between the light-emitting element 125 and the electrode 116. For example, a transistor may be provided between the light-emitting element 125 and the electrode 116.

A transistor is a kind of semiconductor element and enables amplification of current and/or voltage, switching operation for controlling conduction or non-conduction, or the like. By providing a transistor between the light-emitting element 125 and the electrode 116, an increase in the area of the display region 131 and a higher-resolution display can be achieved easily. Note that a resistor, an inductor, a capacitor, a rectifier element, or the like, without limitation to a switching element such as a transistor, can be provided in the display region 131.

[Substrates 111 and 121]

An organic resin material, a glass material that is thin enough to have flexibility, or the like can be used for the substrate 111 and the substrate 121. In the case where the display device 100 has a bottom-emission structure or a dual-emission structure, a material having a light-transmitting property with respect to light emitted from the EL layer 117 is used for the substrate 111. In the case where the display device 100 has a top-emission structure or a dual-emission structure, a material having a light-transmitting property with respect to light emitted from the EL layer 117 is used for the substrate 121.

As a material that has flexibility and transmits visible light, which can be used for the substrate 111 and the substrate 121, the following can be used: a poly(ethylene terephthalate) resin (PET), a poly(ethylene naphthalate) resin (PEN), a poly(ether sulfone) resin (PES), a polyacrylonitrile resin, an acrylic resin, a polyimide resin, a poly(methyl methacrylate) resin, a polycarbonate resin, a polyamide resin, a polycycloolefin resin, a polystyrene resin, a poly(amide imide) resin, a polypropylene resin, a polyester resin, a poly(vinyl halide) resin, an aramid resin, an epoxy resin, or the like. Alternatively, a mixture or a stack including any of these materials may be used. Note that the same material or different materials may be used for the substrate 111 and the substrate 121.

The thermal expansion coefficients of the substrate 121 and the substrate 111 are preferably less than or equal to 30 ppm/K, further preferably less than or equal to 10 ppm/K. On surfaces of the substrate 121 and the substrate 111, a protective film having low water permeability may be formed; examples of the protective film include a film containing nitrogen and silicon such as a silicon nitride film or a silicon oxynitride film and a film containing nitrogen and aluminum such as an aluminum nitride film. Note that a structure in which a fibrous body is impregnated with an organic resin (also called prepreg) may be used as the substrate 121 and the substrate 111.

[Insulating Layer 119]

The insulating layer 119 can be formed to have a single-layer structure or a multi-layer structure using an oxide material such as aluminum oxide, magnesium oxide, silicon oxide, silicon oxynitride, gallium oxide, germanium oxide, yttrium oxide, zirconium oxide, lanthanum oxide, neodymium oxide, hafnium oxide, or tantalum oxide; a nitride material such as silicon nitride, silicon nitride oxide, aluminum nitride, or aluminum nitride oxide; or the like. The insulating layer 119 may have, for example, a two-layer structure of silicon oxide and silicon nitride or a five-layer structure in which materials selected from the above are combined. The insulating layer 119 can be formed by a sputtering method, a CVD method, a thermal oxidation method, a coating method, a printing method, or the like.

The insulating layer 119 can prevent or reduce diffusion of an impurity element from the substrate 111, the adhesive layer 112, or the like to the light-emitting element 125.

Note that in this specification, a nitride oxide refers to a compound that contains more nitrogen than oxygen. An oxynitride refers to a compound that contains more oxygen than nitrogen. The content of each element can be measured by Rutherford backscattering spectrometry (RBS), for example.

[Electrode 116]

The electrode 116 can be formed using a conductive material. For example, a metal element selected from aluminum, chromium, copper, silver, gold, platinum, tantalum, nickel, titanium, molybdenum, tungsten, hafnium, vanadium, niobium, manganese, magnesium, zirconium, beryllium, and the like; an alloy containing any of the above metal elements; an alloy containing a combination of the above metal elements; or the like can be used. A semiconductor typified by polycrystalline silicon containing an impurity element such as phosphorus, or silicide such as nickel silicide may also be used. There is no particular limitation on the formation method of the conductive material, and a variety of formation methods such as an evaporation method, a CVD method, a sputtering method, and a spin coating method can be employed.

The electrode 116 can also be formed using a conductive material containing oxygen, such as indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. Moreover, a conductive material containing nitrogen, such as titanium nitride, tantalum nitride, or tungsten nitride, can be used. It is also possible to use a stacked-layer structure formed using the above conductive material containing oxygen and a material containing the above metal element.

The electrode 116 may have a single-layer structure or a stacked-layer structure of two or more layers. For example, a single-layer structure of an aluminum layer containing silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, and a three-layer structure in which a titanium layer, an aluminum layer, and a titanium layer are stacked in this order are given. Alternatively, an aluminum alloy containing one or more elements selected from titanium, tantalum, tungsten, molybdenum, chromium, neodymium, and scandium may be used as the electrode 116.

[Insulating Layer 142]

The insulating layer 142 can be formed using a material and a method that are similar to those of the insulating layer 119. For the insulating layer 142, a material containing oxygen is preferably used.

[Electrodes 115 and 116a]

The electrode 115 is preferably formed using a conductive material that efficiently reflects light emitted from the EL layer 117 formed later. Note that the electrode 115 may have a stacked-layer structure of a plurality of layers without limitation to a single-layer structure. For example, in the case where the electrode 115 is used as an anode, a layer in contact with the EL layer 117 may be a light-transmitting layer, such as an indium tin oxide layer, and a layer having high reflectance (e.g., aluminum, an alloy containing aluminum, or silver) may be provided in contact with the layer.

The display device having a top-emission structure is described as an example in this embodiment. In a display device having a bottom-emission structure or a dual-emission structure, the electrode 115 may be formed using a light-transmitting conductive material.

The electrode 116a can be formed using a material and a method similar to those of the electrode 115.

[Partition 114]

The partition 114 is provided in order to prevent an electrical short circuit between the adjacent electrodes 118. In the case of using a metal mask for formation of the EL layer 117 described later, the partition 114 has a function of preventing the contact of metal mask with a region where the light-emitting element 125 is formed. The partition 114 can be formed of an organic resin material such as an epoxy resin, an acrylic resin, or an imide resin or an inorganic material such as silicon oxide. The partition 114 is preferably formed so that its sidewall has a tapered shape or a tilted surface with a continuous curvature. The sidewall of the partition 114 having the above-described shape enables favorable coverage with the EL layer 117 and the electrode 118 formed later.

[EL Layer 117]

A structure of the EL layer 117 is described in Embodiment 6.

[Electrode 118]

The electrode 118 is used as a cathode in this embodiment, and thus the electrode 118 is preferably formed using a material that has a low work function and can inject electrons into the EL layer 117 described later. As well as a single-layer of a metal having a low work function, a stack in which a metal material such as aluminum, a conductive oxide material such as indium tin oxide, or a semiconductor material is formed over a several-nanometer-thick buffer layer formed of an alkali metal or an alkaline earth metal having a low work function may be used as the electrode 118. As the buffer layer, an oxide of an alkaline earth metal, a halide, a magnesium-silver, or the like can also be used.

In the case where light emitted from the EL layer 117 is extracted through the electrode 118, the electrode 118 preferably has a property of transmitting visible light.

[Adhesive Layers 120, 112, and 122]

A light curable adhesive, a reaction curable adhesive, a thermosetting adhesive, or an anaerobic adhesive can be used as the adhesive layer 120, the adhesive layer 112, and the adhesive layer 122. For example, an epoxy resin, an acrylic resin, or an imide resin can be used. A drying agent (e.g., zeolite) having a size less than or equal to the wavelength of light emitted from the EL layer 117 or a filler (e.g., titanium oxide or zirconium) with a high refractive index is preferably mixed into the adhesive layer 120 in the case of a top-emission structure or into the adhesive layer 112 in the case of a bottom-emission structure, in which case the efficiency of extracting light emitted from the EL layer 117 negligibly decrease and the reliability of the display device is improved.

[Anisotropic Conductive Connection Layer 138]

The anisotropic conductive connection layer 138 can be formed using any of various kinds of anisotropic conductive films (ACF), anisotropic conductive pastes (ACP), and the like.

The anisotropic conductive connection layer 138 is formed by curing a paste-form or sheet-form material that is obtained by mixing conductive particles to a thermosetting resin or a thermosetting and light curable resin. The anisotropic conductive connection layer 138 exhibits an anisotropic conductive property by light irradiation or thermocompression bonding. As the conductive particles used for the anisotropic conductive connection layer 138, for example, particles of a spherical organic resin coated with a thin-film metal such as Au, Ni, or Co can be used.

<Method for Manufacturing Display Device>

Figure 19A:
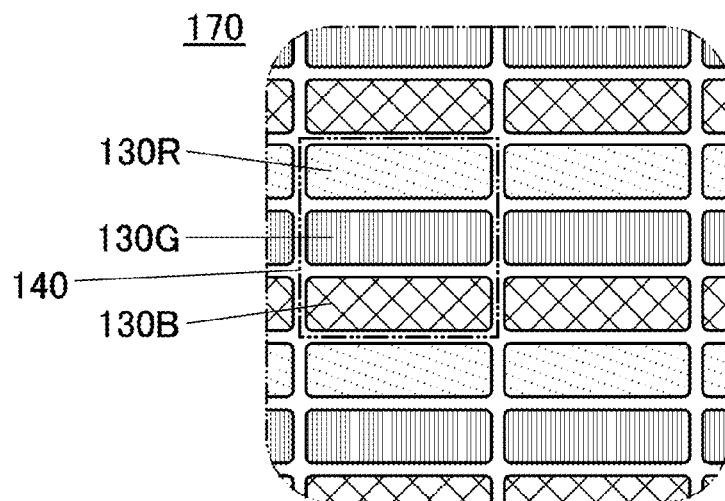
FIGS. 19A to 19C each illustrate an example of a pixel structure of one embodiment of a display device.
Figure 19B:
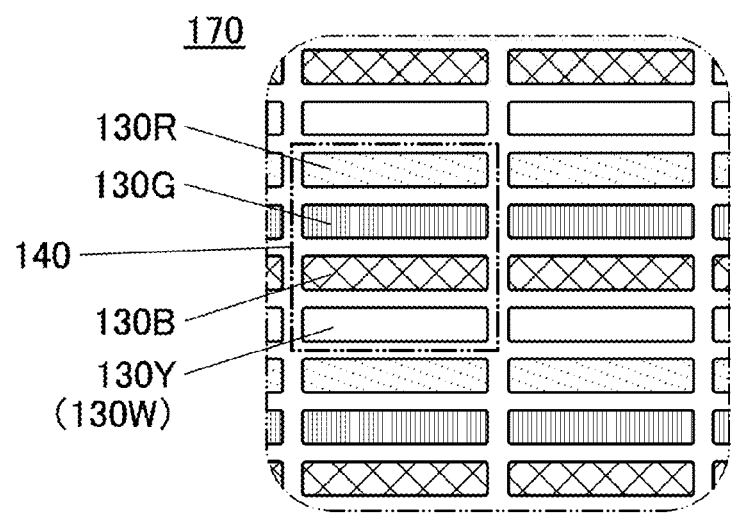
Figure 19C:
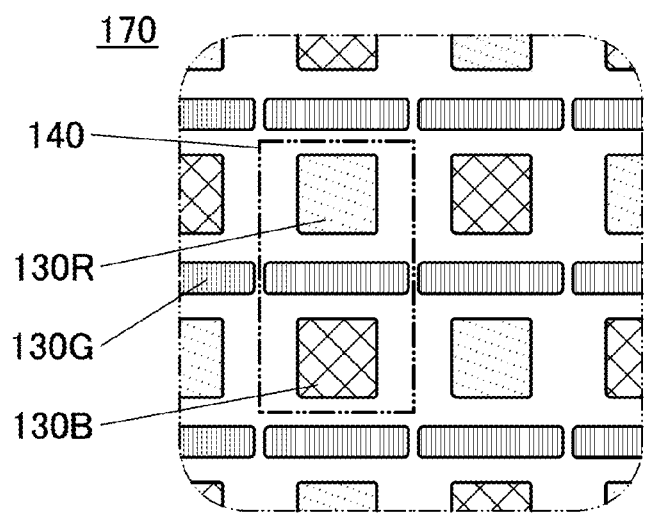

Next, a method for manufacturing the display device 100 is described with reference to FIGS. 16A to 16E to FIGS. 24A and 24B. FIGS. 16A to 16E to FIGS. 24A and 24B other than FIGS. 19A to 19C are cross-sectional views taken along the dashed-dotted line A1-A2 in FIGS. 11A and 11B.

[Formation of Separation Layer 113]

Figure 16A:
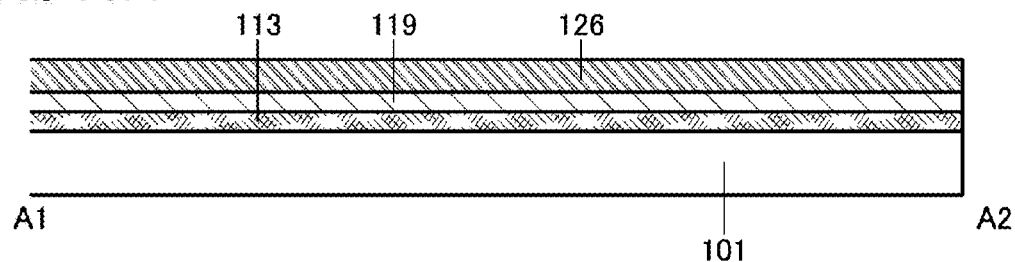
FIGS. 16A to 16E illustrate a manufacturing process of one embodiment of a display device.

First, a separation layer 113 is formed over a substrate 101 (see FIG. 16A). The substrate 101 may be exemplified by a semiconductor substrate (e.g., a single crystal substrate or a silicon substrate), an SOI substrate, a glass substrate, a quartz substrate, a sapphire substrate, a ceramic substrate, a plastic substrate which has heat resistance to the processing temperature in this embodiment, a metal substrate, a stainless steel substrate, a substrate including stainless steel foil, a tungsten substrate, and a substrate including tungsten foil. As an example of a glass substrate, a barium borosilicate glass substrate, an aluminoborosilicate glass substrate, and soda lime glass substrate can be given.

The separation layer 113 can be formed using an element selected from tungsten, molybdenum, titanium, tantalum, niobium, nickel, cobalt, zirconium, ruthenium, rhodium, palladium, osmium, iridium, and silicon; an alloy material containing any of the elements; or a compound material containing any of the elements. The separation layer 113 can also be formed to have a single-layer structure or a stacked-layer structure using any of the materials. Note that the crystalline structure of the separation layer 113 may be amorphous, microcrystalline, or polycrystalline. The separation layer 113 can also be formed using a metal oxide such as aluminum oxide, gallium oxide, zinc oxide, titanium dioxide, indium oxide, indium tin oxide, indium zinc oxide, or an oxide including indium, gallium, and zinc (In—Ga—Zn—O, IGZO).

The separation layer 113 can be formed by a sputtering method, a CVD method, a coating method, a printing method, or the like. Note that the coating method includes a spin coating method, a droplet discharge method, and a dispensing method.

In the case where the separation layer 113 has a single-layer structure, the separation layer 113 is preferably formed using tungsten, molybdenum, or a material containing tungsten and molybdenum. Alternatively, the separation layer 113 is preferably formed using an oxide or oxynitride of tungsten, an oxide or oxynitride of molybdenum, or an oxide or oxynitride of a material containing tungsten and molybdenum.

In the case where the separation layer 113 has a stacked-layer structure including, for example, a layer containing tungsten and a layer containing an oxide of tungsten, the layer containing an oxide of tungsten may be formed as follows: the layer containing tungsten is formed first and then an insulating oxide layer is formed in contact therewith, so that the layer containing an oxide of tungsten is formed at the interface between the layer containing tungsten and the insulating oxide layer. Alternatively, the layer containing an oxide of tungsten may be formed by performing thermal oxidation treatment, oxygen plasma treatment, treatment with an oxidizing solution such as ozone water, or the like on the surface of the layer containing tungsten. Moreover, an insulating layer may be provided between the substrate 101 and the separation layer 113.

In this embodiment, aluminoborosilicate glass is used for the substrate 101. As the separation layer 113, a tungsten film is formed over the substrate 101 by a sputtering method.

[Formation of Insulating Layer 119]

Next, the insulating layer 119 is formed over the separation layer 113 (see FIG. 16A). The insulating layer 119 can prevent or reduce diffusion of an impurity element from the substrate 101 or the like. After the substrate 101 is replaced with the substrate 111, the insulating layer 119 can prevent or reduce diffusion of an impurity element from the substrate 111, the adhesive layer 112, or the like to the light-emitting element 125. The thickness of the insulating layer 119 is preferably greater than or equal to 30 nm and less than or equal to 2 μm, further preferably greater than or equal to 50 nm and less than or equal to 1 μm, or still further preferably greater than or equal to 50 nm and less than or equal to 500 nm. In this embodiment, the insulating layer 119 is formed by stacking a 600-nm-thick silicon oxynitride film, a 200-nm-thick silicon nitride film, a 200-nm-thick silicon oxynitride film, a 140-nm-thick silicon nitride oxide film, and a 100-nm-thick silicon oxynitride film by a plasma CVD method from the substrate 101 side.

Note that it is preferable to expose the surface of the separation layer 113 to an atmosphere containing oxygen before the formation of the insulating layer 119.

As the gas used in the atmosphere containing oxygen, oxygen, dinitrogen monoxide, nitrogen dioxide, carbon dioxide, carbon monoxide, or the like can be used. A mixed gas of a gas containing oxygen and another gas may be used. For example, a mixed gas of a gas containing oxygen and a rare gas, for example, a mixed gas of carbon dioxide and argon may be used. Oxidizing the surface of the separation layer 113 can facilitate separation of the substrate 101 performed later.

[Formation of Electrode 116]

Next, a conductive layer 126 for forming the electrode 116 is formed over the insulating layer 119. As the conductive layer 126, a three-layer metal film in which a layer of aluminum is provided between two layers of molybdenum is formed over the insulating layer 119 by a sputtering method, for example (see FIG. 16A).

After that, a resist mask is formed over the conductive layer 126, and the conductive layer 126 is etched into a desired shape using the resist mask. In the above-described manner, the electrode 116 is formed. The resist mask can be formed by a lithography method, a printing method, an inkjet method, or the like as appropriate. Formation of the resist mask by an inkjet method needs no photomask; thus, manufacturing cost can be reduced.

The etching of the conductive layer 126 may be performed by a dry etching method, a wet etching method, or both of them. In the case where the conductive layer 126 is etched by a wet etching method, a solution obtained by mixing phosphoric acid, acetic acid, and nitric acid, a solution containing oxalic acid, a solution containing phosphoric acid, or the like can be used as an etchant. After the etching treatment, the resist mask is removed (see FIG. 16B).

Figure 16B:
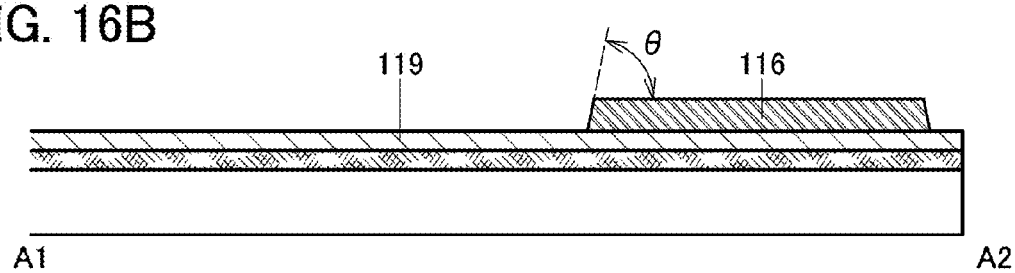

When the electrode 116 (including other electrodes and wirings formed using the same layer) has a taper-shaped edge, the coverage with a layer that covers the side surfaces of the electrode 116 can be improved. Specifically, the edge has an inclination angle θ of 80° or less, preferably 60° or less, or further preferably 45° or less. The shape of an edge having an inclination angle smaller than 90° is called a forward tapered shape, and the shape of an edge having an inclination angle larger than or equal to 90° is called an inverse tapered shape. FIG. 16B illustrates the case where the edge of the electrode 116 has a forward tapered shape.

Alternatively, the cross-sectional shape of the edge of the electrode 116 has a plurality of steps, so that the coverage with the layer formed thereon can be improved. The above description is not limited to the electrode 116 and, when the edge of each layer has a forward taper shape or a step-like shape in a cross section, a phenomenon that a layer formed to cover the edge is cut (disconnection) at the edge can be prevented, so that the coverage becomes favorable.

[Formation of Insulating Layer 127]

Figure 16C:
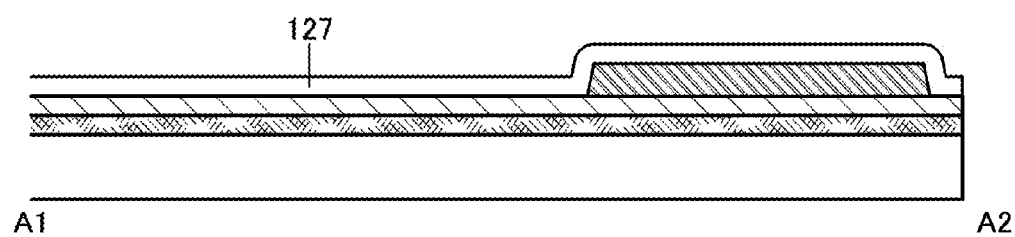

Next, an insulating layer 127 is formed over the electrode 116 (see FIG. 16C). In this embodiment, a stacked-layer film of a silicon oxynitride film and a silicon nitride film is formed by a plasma CVD method as the insulating layer 127.

Figure 16D:
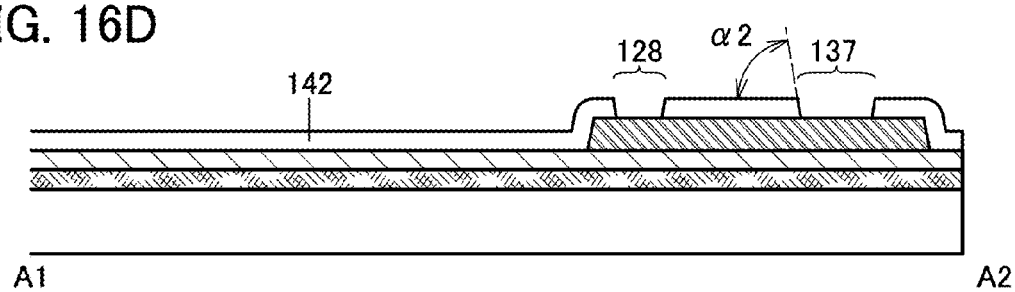

Next, a resist mask is formed over the insulating layer 127, and part of the insulating layer 127 overlapping with the electrode 116 is selectively removed using the resist mask, so that the insulating layer 142 having the opening 128 and the opening 137 is formed (see FIG. 16D). The etching of the insulating layer 127 is preferably performed by a dry etching method. For example, when the insulating layer 127 is etched by a dry etching method, inclination angles α2 of the edges of the insulating layer 127 in the opening 128 and the opening 137 are each greater than or equal to 70° and smaller than or equal to 90°.

[Formation of Electrode 115]

Figure 16E:
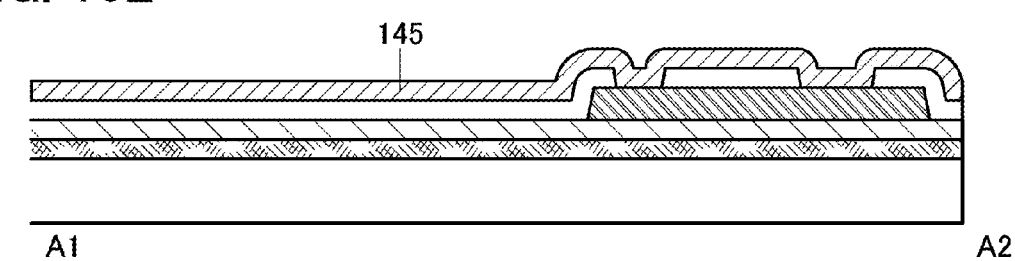

Next, a conductive layer 145 for forming the electrode 115 and the electrode 116a is formed over the insulating layer 142 (see FIG. 16E). The conductive layer 145 can be formed using a material and a method similar to those of the conductive layer 126 (the electrode 116).

Figure 17A:
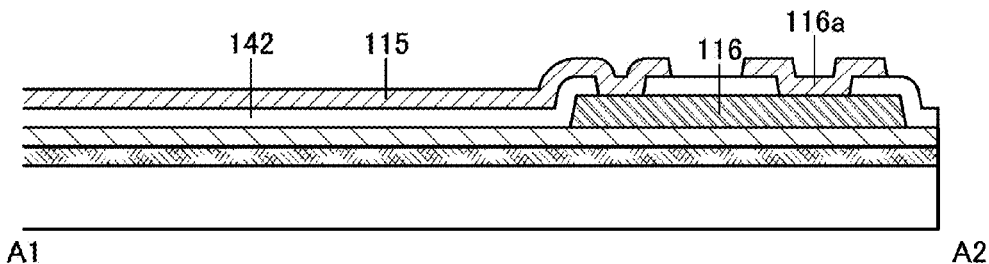
FIGS. 17A to 17D illustrate a manufacturing process of one embodiment of a display device.

Next, a resist mask is formed over the conductive layer 145, and part of the conductive layer 145 is selectively removed using the resist mask, so that the electrode 115 and the electrode 116a are formed (see FIG. 17A). The etching of the conductive layer 145 may be performed by a dry etching method, a wet etching method, or both of them. In this embodiment, the conductive layer 145 (the electrode 115, the electrode 116a) is formed using a material in which indium tin oxide is stacked over silver. The electrode 115 and the electrode 116 are electrically connected to each other through the opening 128, and the electrode 116a and the electrode 116 are electrically connected to each other through the opening 137.

[Formation of Partition 114]

Figure 17B:
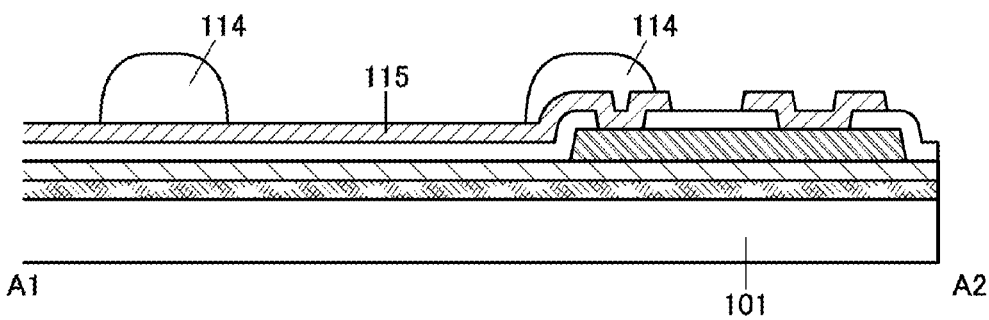

Next, the partition 114 is formed (see FIG. 17B). In this embodiment, the partition 114 is formed in such a manner that a photosensitive organic resin material is applied by a coating method and processed into a desired shape. In this embodiment, the partition 114 is formed using a photosensitive polyimide resin.

[Formation of EL Layer 117, Electrode 118, and Separation Layer 110]

In this embodiment, a separation layer 110 having a two-layer structure of a separation layer 110a formed using the same material as the EL layer 117 and a separation layer 110b formed using the same material as the electrode 118 is formed. Such a structure is preferable because the separation layer 110 can be formed without an increase in the number of manufacturing steps.

Figure 17C:
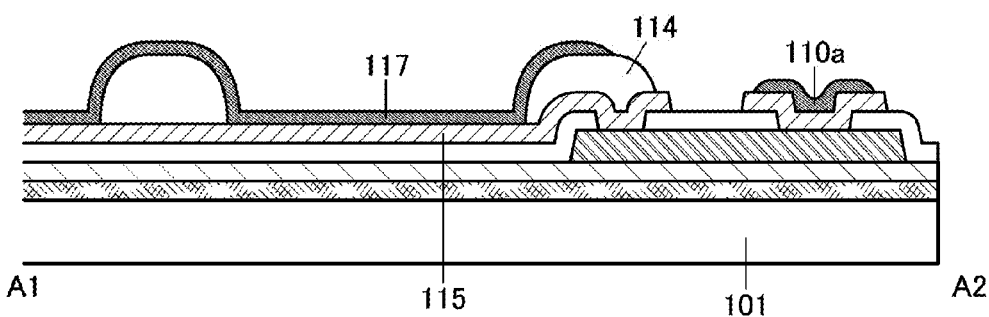
Figure 17D:
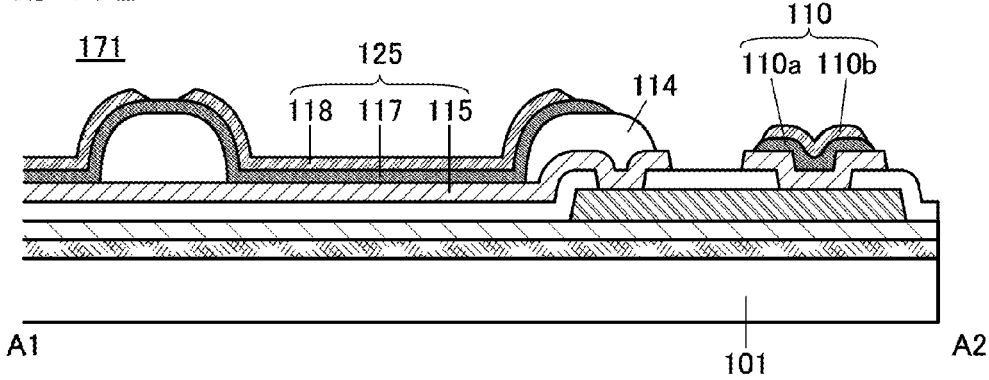

After the formation of the partition 114, the EL layer 117 is formed over the electrode 115 and the partition 114 and, at the same time, the separation layer 110a is formed in a region over the electrode 116 which overlaps with the opening 137 (see FIG. 17C).

Next, the electrode 118 is formed over the EL layer 117 and, at the same time, the separation layer 110b is formed over the separation layer 110a. In this embodiment, stacked layers of an alloy of magnesium and silver and indium tin oxide are used as the electrode 118 and the separation layer 110b. The electrode 118 and the separation layer 110b can be formed by an evaporation method, a sputtering method, or the like (see FIG. 17D).

Note that the separation layer 110 formed in and on the opening 137 over the electrode 116 may be formed to have a single-layer structure or a stacked-layer structure of two or more layers. In the case where the separation layer 110 has a single-layer structure, the separation layer 110 can be formed using a material having low adhesion to the electrode 116. In the case where the separation layer 110 has a stacked-layer structure, a plurality of materials can be used so that adhesion between layers in the stack is decreased.

A metal mask having openings in desired regions in the display region 131 and the terminal region 141 is necessary for forming the EL layer 117. In particular, in the case where the EL layer 117 is formed by side-by-side patterning, the metal mask needs to have small openings corresponding to the plurality of pixels 130 included in the display region 131 and a large opening corresponding to the terminal region 141. Generally speaking, the allowable positional error of the small openings is small because they are provided for every pixel 130; accordingly, tension is kept on the metal mask in order to avoid displacing a formation region of the EL layer 117 owing to bending of the metal mask. However, in the case where the metal mask has the large opening, the periphery of the large opening might be distorted by tension. Therefore, it is preferable that the EL layer 117 include the common layer 117a and the individual layer 117b as illustrated in FIGS. 14A and 14B in the case where the EL layer 117 is formed by side-by-side patterning. Moreover, it is preferable that the separation layer 110a and the common layer 117a be formed using the same material at the same time. In this way, the EL layer 117 can be formed without the metal mask having the small openings and the large opening.

In this embodiment, a substrate 101 over which the light-emitting element 125 is formed is referred to as an element substrate 180.

Next, a method for manufacturing a counter substrate 181 is described.

[Formation of Separation Layer 143]

Figure 18A:
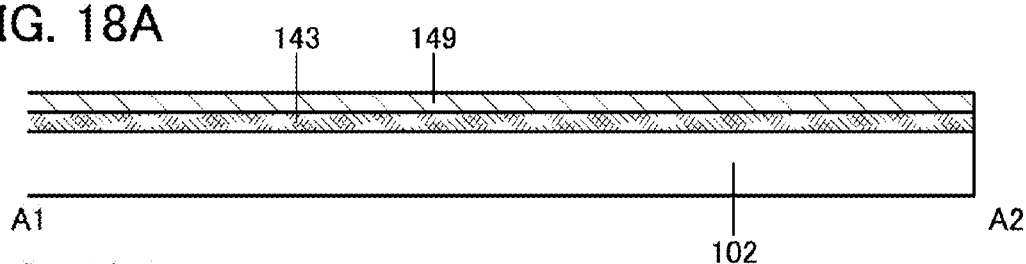
FIGS. 18A to 18F illustrate a manufacturing process of one embodiment of a display device.
Figure 18B:
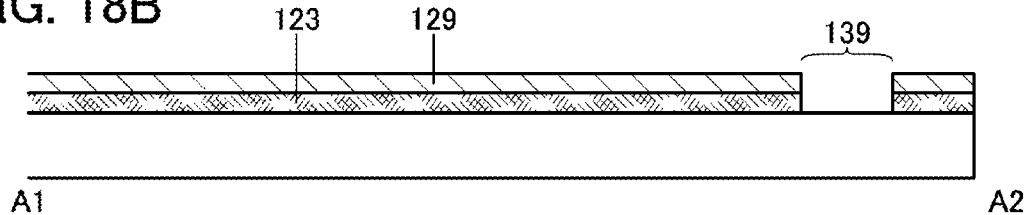

First, a separation layer 143 is formed over a substrate 102 (see FIG. 18A). The substrate 102 can be formed using a material similar to that of the substrate 101. Note that the same material or different materials may be used for the substrate 101 and the substrate 102. The separation layer 143 can be formed in a manner similar to that of the separation layer 113. Moreover, an insulating layer may be provided between the substrate 102 and the separation layer 143. In this embodiment, aluminoborosilicate glass is used for the substrate 102. As the separation layer 143, a tungsten film is formed over the substrate 102 by a sputtering method.

Note that it is preferable to expose the surface of the separation layer 143 to an atmosphere containing oxygen or a plasma atmosphere containing oxygen after the formation of the separation layer 143. Oxidizing the surface of the separation layer 143 can facilitate separation of the substrate 102 performed later.

[Formation of Insulating Layer 149]

Next, an insulating layer 149 is formed over the separation layer 143 (see FIG. 18A). The insulating layer 149 can be formed using a material and a method that are similar to those of the insulating layer 119. In this embodiment, the insulating layer 149 is formed by stacking a 200-nm-thick silicon oxynitride film, a 140-nm-thick silicon nitride oxide film, and a 100-nm-thick silicon oxynitride film by a plasma CVD method from the substrate 102 side.

[Formation of Separation Layer 123 and Insulating Layer 129]

Then, a resist mask is formed over the insulating layer 149, and part of the insulating layer 149 and part of the separation layer 143 are selectively removed using the resist mask, so that a separation layer 123 and the insulating layer 129 having an opening 139 are formed. The resist mask can be formed by a lithography method, a printing method, an inkjet method, or the like as appropriate. Formation of the resist mask by an inkjet method needs no photomask; thus, manufacturing cost can be reduced.

The etching of the insulating layer 149 and the separation layer 143 may be performed by a dry etching method, a wet etching method, or both of them. After the etching treatment, the resist mask is removed (see FIG. 18B).

[Formation of Light-Blocking Layer 264]

Figure 18C:
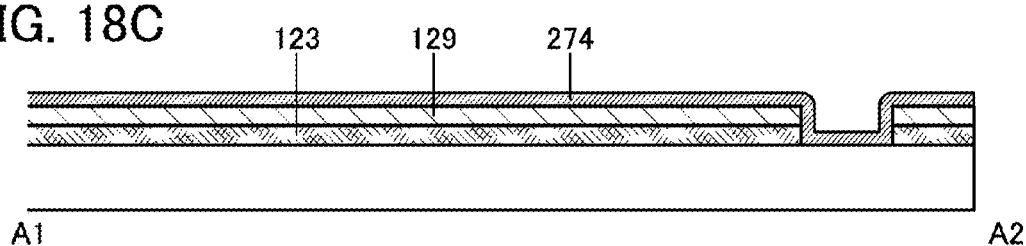

Next, a layer 274 for forming the light-blocking layer 264 is formed over the insulating layer 129 (see FIG. 18C). The layer 274 may have a single-layer structure or a stacked-layer structure including two or more layers. Examples of a material for the layer 274 are a metal material including chromium, titanium, nickel, or the like; or an oxide material including chromium, titanium, nickel, or the like.

Figure 18D:
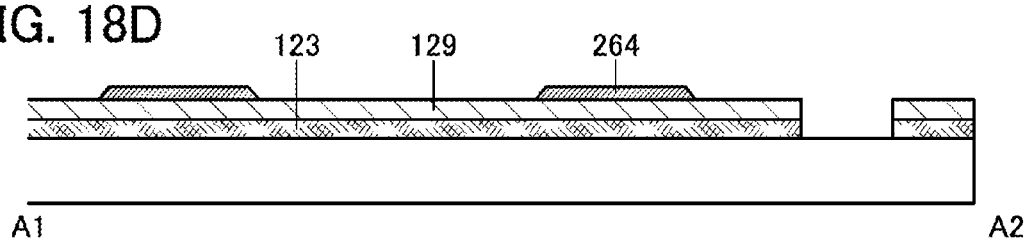

In the case where the layer 274 is formed using the metal material or the oxide material, a resist mask is formed over the layer 274, and the layer 274 is etched into a desired shape using the resist mask, so that the light-blocking layer 264 is formed (see FIG. 18D). With a macromolecular material in which carbon black is dispersed, direct writing of the light-blocking layer 264 can be performed over the insulating layer 129 by an inkjet method.

[Formation of Coloring Layer 266]

Figure 18E:
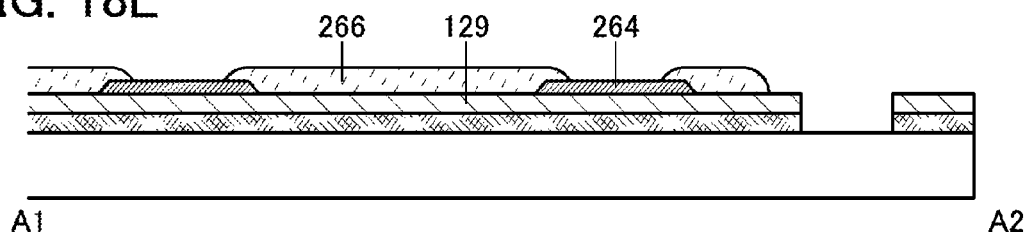

Next, the coloring layer 266 is formed over the insulating layer 129 (see FIG. 18E). Each coloring layer 266 is formed in a desired position with any of various materials by a printing method, an inkjet method, or a photolithography method. At this time, the coloring layer 266 is preferably provided so as to partly overlap with the light-blocking layer 264. Color display can be performed by providing the coloring layers 266 of different colors in different pixels.

Here, examples of a pixel configuration for achieving color display are described with reference to FIGS. 19A to 19C. FIGS. 19A to 19C are enlarged plan views of a region 170 in the display region 131 of FIG. 11A. For example, as illustrated in FIG. 19A, three pixels 130 arranged in a stripe pattern function as subpixels and can be collectively used as one pixel 140. Full color display can be achieved in such a manner that the red, green, and blue coloring layers 266 are used so as to correspond to three pixels 130. In FIG. 19A, the pixel 130 emitting red light, the pixel 130 emitting green light, and the pixel 130 emitting blue light are illustrated as a pixel 130R, a pixel 130G, and a pixel 130B, respectively. Note that the colors of the coloring layers 266 may be a color other than red, green, and blue; for example, the coloring layer 266 may be yellow, cyan, magenta, or the like.

As illustrated in FIG. 19B, four pixels 130 may function as a subpixel and may be collectively used as one pixel 140. For example, the coloring layers 266 corresponding to the four pixels 130 may be red, green, blue, and yellow. In FIG. 19B, the pixel 130 emitting red light, the pixel 130 emitting green light, the pixel 130 emitting blue light, and the pixel 130 emitting yellow light are illustrated as a pixel 130R, a pixel 130G, a pixel 130B, and a pixel 130Y, respectively. By increasing the number of pixels 130 used as one pixel 140, the color reproducibility can be particularly improved. Thus, the display quality of the display device can be improved.

Alternatively, in FIG. 19B, the coloring layers 266 corresponding to the four pixels 130 may be red, green, blue, and white. With the pixel 130 emitting white light (a pixel 130W), the luminance of the display region can be increased. Note that in the case of the pixel 130 emitting white light, it is not necessary to provide the coloring layer 266. Without a white coloring layer 266, there is no luminance reduction at the time of transmitting light through the coloring layer 266; thus, power consumption of the display device can be reduced. On the other hand, color temperature of white light can be controlled with the white coloring layer 266. Thus, the display quality of the display device can be improved. Depending on the intended use of the display device, the given two pixels 130 of the four pixels may be used as one pixel 140.

Note that the occupation areas or shapes of the pixels 130 may be the same or different. In addition, arrangement is not limited to stripe arrangement. For example, delta arrangement, Bayer arrangement, pentile arrangement, or the like can be used. FIG. 19C illustrates an example of three pixels 130 arranged in a pentile pattern.

[Formation of Overcoat Layer 268]

Figure 18F:
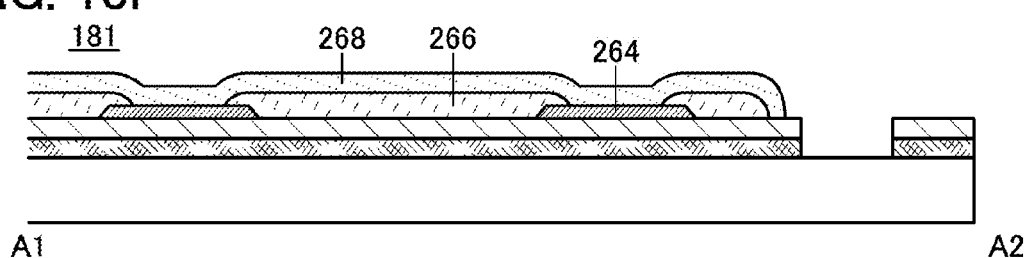

Next, the overcoat layer 268 is formed over the light-blocking layer 264 and the coloring layer 266 (see FIG. 18F).

For the overcoat layer 268, an organic insulating layer of an acrylic resin, an epoxy resin, a polyimide resin, or the like can be used. With the overcoat layer 268, an impurity or the like contained in the coloring layer 266 can be inhibited from diffusing into the light-emitting element 125 side, for example. Note that the overcoat layer 268 is not necessarily formed.

A light-transmitting conductive film may be formed as the overcoat layer 268 by which the light 151 emitted from the light-emitting element 125 can pass through the overcoat layer 268 and ionized impurities can be prevented from passing through the overcoat layer 268.

The light-transmitting conductive film can be formed using, for example, indium oxide, indium tin oxide, indium zinc oxide, zinc oxide, zinc oxide to which gallium is added, or the like. Graphene or a metal film that is thin enough to have a light-transmitting property can also be used.

In this embodiment, the substrate 102 over which the coloring layer 266 and the like are formed is referred to as the counter substrate 181. Through the above steps, the counter substrate 181 can be formed. Note that in some cases, the counter substrate 181 is not provided with the coloring layer 266 or the like.

[Bonding of Element Substrate 180 and Counter Substrate 181]

Next, the element substrate 180 and the counter substrate 181 are bonded to each other with the adhesive layer 120 provided therebetween. At the bonding, the light-emitting element 125 included in the element substrate 180 and the coloring layer 266 included in the counter substrate 181 are arranged so as to face each other (see FIG. 20A).

[Separation of Substrate 101]

Figure 20A:
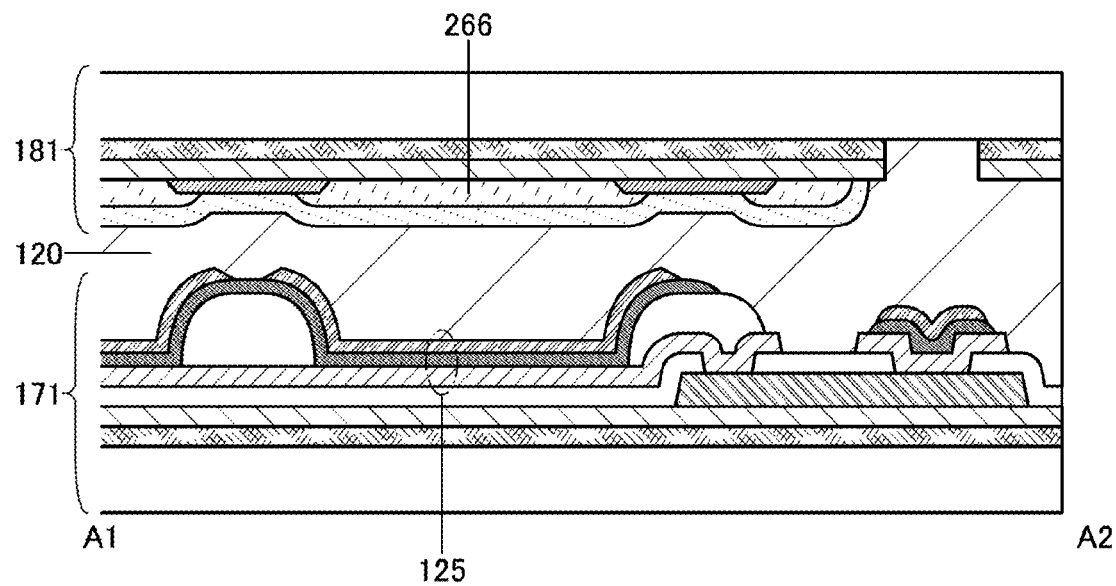
FIGS. 20A and 20B illustrate a manufacturing process of one embodiment of a display device.
Figure 20B:
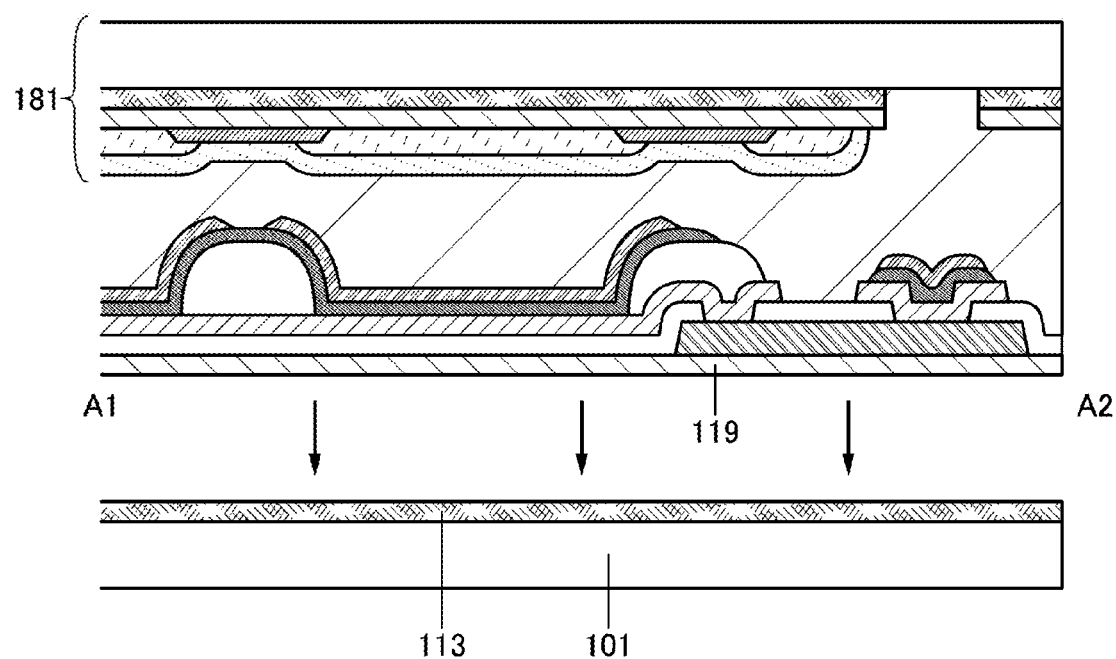

Next, the substrate 101 included in the element substrate 180 is separated from the insulating layer 119 together with the separation layer 113 (see FIG. 20B). As a separation method, mechanical force (a separation process with a human hand or a gripper, a separation process by rotation of a roller, ultrasonic waves, or the like) may be used. For example, a cut is made in the interface between the separation layer 113 and the insulating layer 119 from the side surface of the element substrate 180 with a sharp edged tool, by laser beam irradiation, or the like and water is injected into the cut. The interface between the separation layer 113 and the insulating layer 119 absorbs water by capillary action, so that the substrate 101 can be separated easily from the insulating layer 119 together with the separation layer 113.

[Bonding of Substrate 111]

Figure 21A:
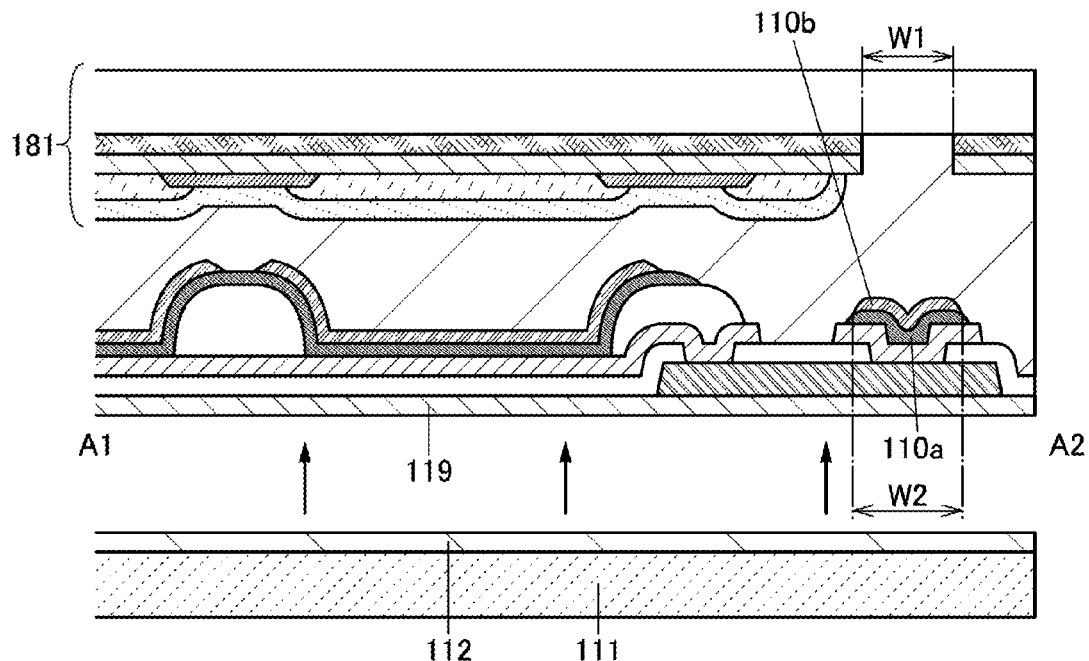
FIGS. 21A and 21B illustrate a manufacturing process of one embodiment of a display device.

Next, the substrate 111 is bonded to the insulating layer 119 with the adhesive layer 112 provided therebetween (see FIG. 21A).

[Separation of Substrate 102]

Next, the substrate 102 included in the counter substrate 181 is separated from the insulating layer 129 together with the separation layer 123.

Figure 21B:
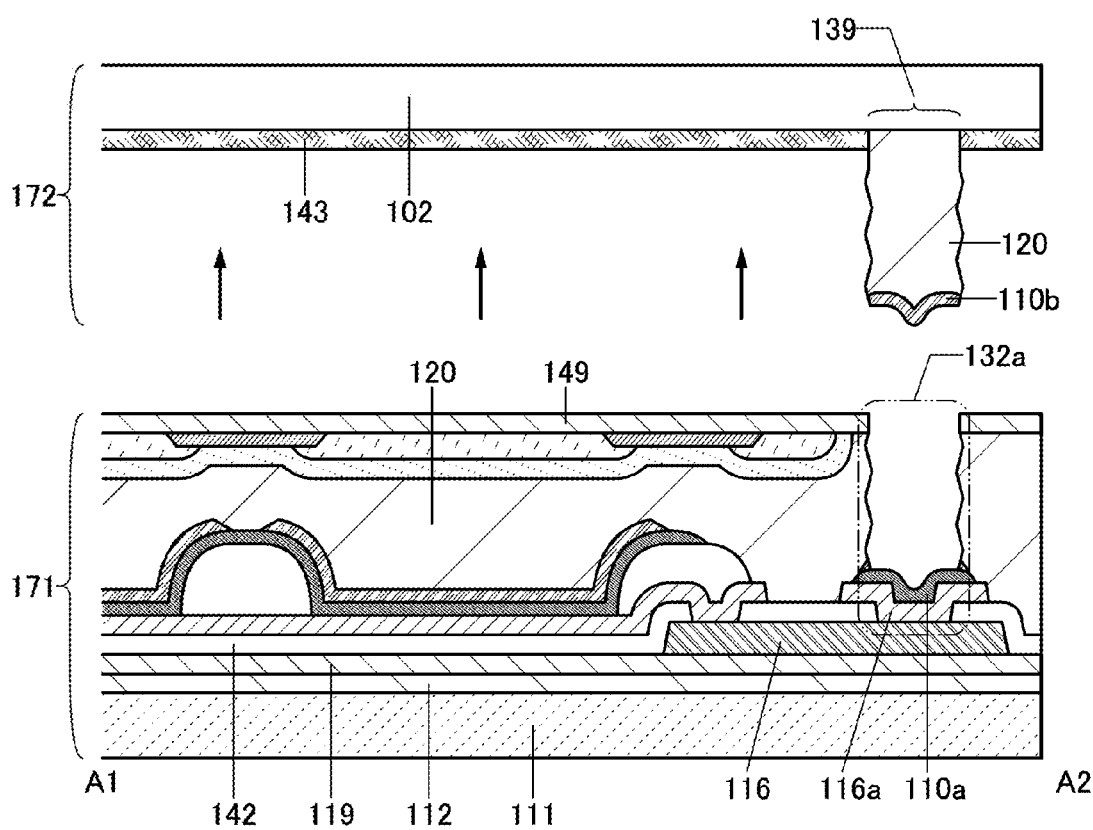

FIG. 21B illustrates a state in which the substrate 102 included in the counter substrate 181 is separated from the insulating layer 129 together with the separation layer 123. At this time, an opening 132a is formed by removal of part of the adhesive layer 120 overlapping substantially with the opening 139 and the separation layer 110b overlapping substantially with the opening 139. Alternatively, the opening 132a is formed by removal of the adhesive layer 120 overlapping substantially with the opening 139, the separation layer 110b overlapping substantially with the opening 139, and part of the separation layer 110a overlapping substantially with the opening 139. Note that the substrate 102 is preferably placed such that the opening 139 is positioned inside the electrode 116a, in which case the opening 132a can be formed easily. That is, it is preferable that the opening 132a be formed inside the edge of the electrode 116a in the cross-sectional view. The width W1 of the opening 139 is preferably smaller than the width W2 of the surface where the separation layer 110a and the separation layer 110b are in contact with each other, in which case the separation layer 110b is easily separated from the separation layer 110a (see FIG. 21A).

Meanwhile, when the width W1 is smaller than the width W2, a part of the separation layer 110b, which does not overlap with the opening 132a, might be lifted at separation from the separation layer 110a in a direction diagonal to the perpendicular direction. Accordingly, in some cases, this part and a part of the adhesive layer 120 overlapping therewith, and the like are separated from the interface with the separation layer 110a and remain over the separation layer 110a. Therefore, it is preferable that a difference between the width W1 and the width W2 be small. After this step, the separation layer 110a remains over the electrode 116a.

For description convenience in a later embodiment, the counter substrate 181 and a structure body separated from the display device 100 together with the counter substrate 181 are collectively referred to as a second member 172, and the display device 100 after the separation is referred to as a first member 171.

[Removal of separation layer 110a]

Figure 22A:
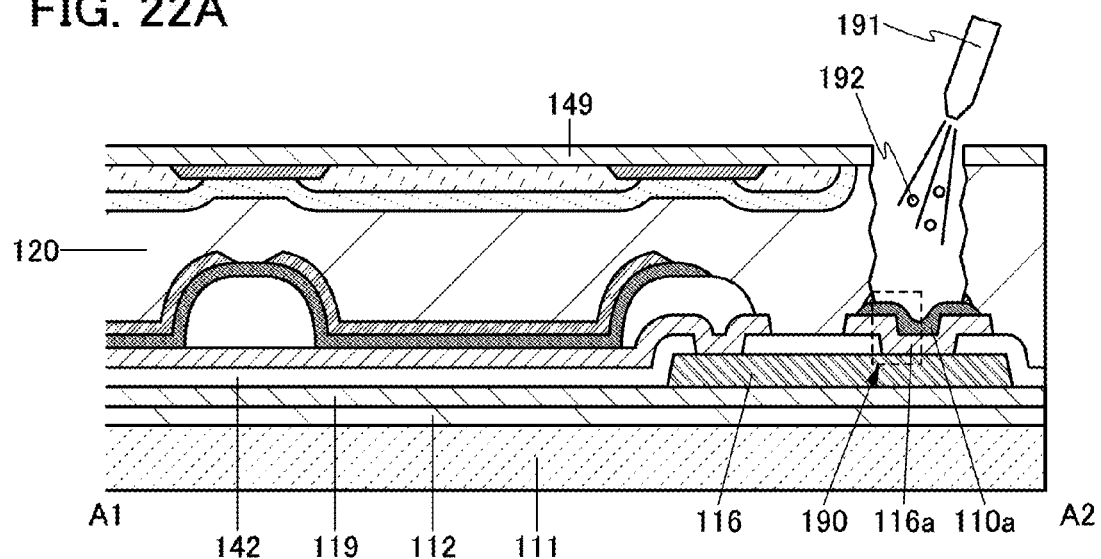
FIGS. 22A and 22B illustrate a manufacturing process of one embodiment of a display device.
Figure 22B:
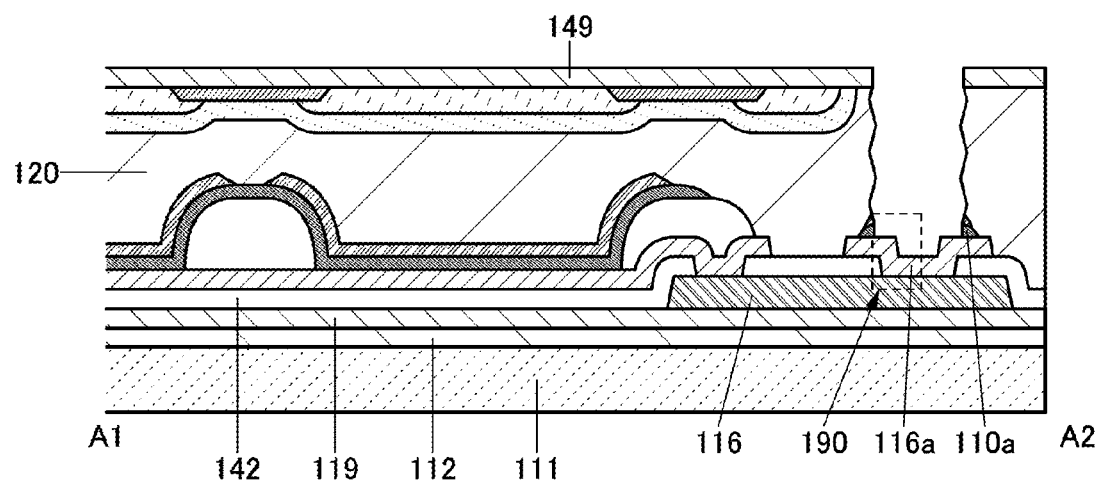

Next, particles 192 having a high sublimation property are emitted to the display device 100, so that the separation layer 110a over the electrode 116a is removed. FIG. 22A is a cross-sectional view illustrating a step of emitting the particles 192 from a nozzle 191 toward the separation layer 110a. By removing the separation layer 110a, the electrode 116a can be exposed (see FIG. 22B). In this embodiment, a solid form of carbon dioxide is used as the particles 192.

Figure 23:
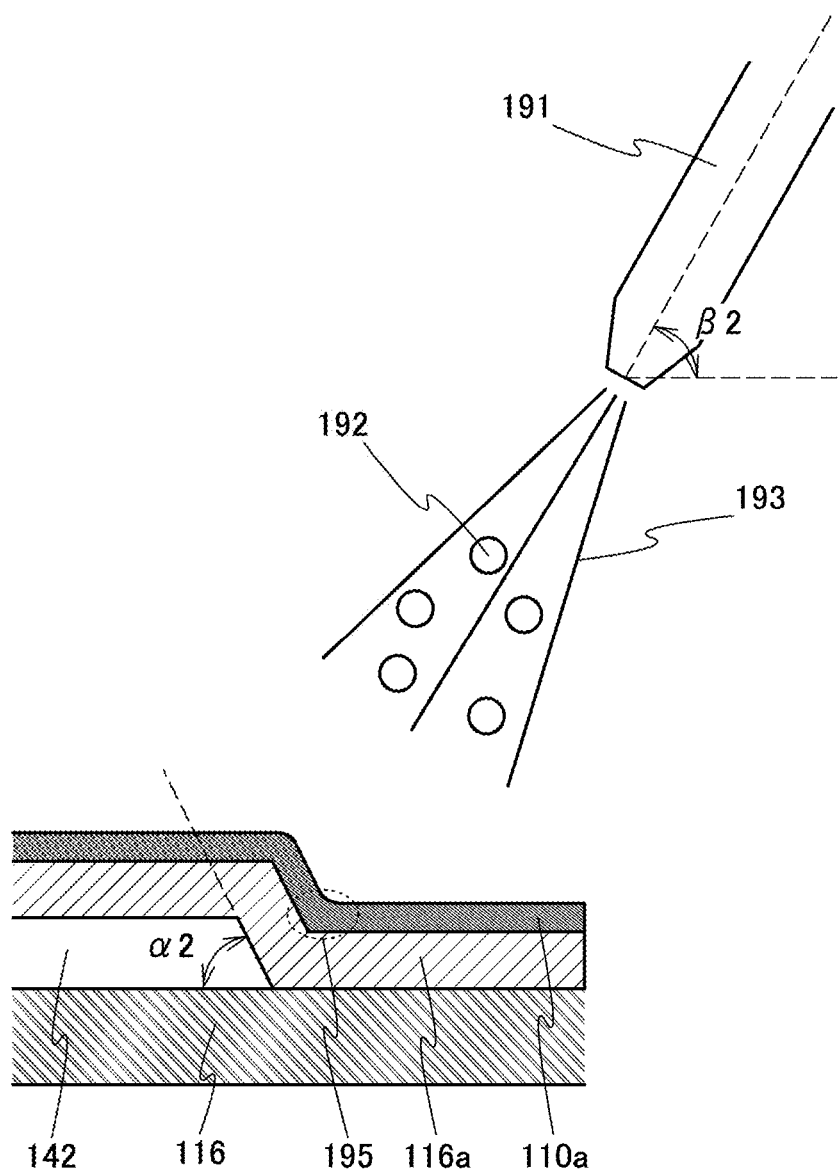
FIG. 23 illustrates a manufacturing process of one embodiment of a display device.

An enlarged cross-sectional view of a portion 190 in FIG. 22A is illustrated in FIG. 23, where the nozzle 191 emits the particles 192 and dry air 193 toward the separation layer 110a. The emission of the dry air 193 as well as the particles 192 allows the separation layer 110a separated by the particles 192 to be removed without being left over the electrode 116a.

Here, since the electrode 116a is provided continuously over the electrode 116 and the insulating layer 142, the electrode 116a has a depression at a position overlapping with the vicinity of an edge of the insulating layer 142. At the removal of the separation layer 110a by the particles 192, the separation layer 110a tends to remain in a region 195 that overlaps with the vicinity of the depression.

In the method for manufacturing a display device of one embodiment of the present invention, the separation layer 110a over the electrode 116a including separation layer 110a in the region 195 can be effectively removed. In FIG. 23, when the inclination angle of the edge of the insulating layer 142 is $\alpha 2$ and the emission angle of the particles 192 and the dry air 193, that is, the inclination angle of the nozzle 191 is $\beta 2$, the inclination angle $\beta 2$ preferably satisfies the relation, $(180°-\alpha 2)/2-10° < \beta 2 < (180°-\alpha 2)/2+10°$. For example, in the case where $\alpha 2$ is greater than or equal to 70° and smaller than or equal to 90°, β2 is preferably greater than 35° and smaller than 65°. Note that the inclination angle of the edge of the insulating layer 142 refers to the angle formed between a side surface and a bottom surface of the insulating layer 142. If the side surface of the insulating layer 142 is curved, the inclination angle of the edge of the insulating layer 142 refers to the angle formed between a plane that is in contact with a vicinity of a boundary between the side surface and the bottom surface (i.e., the edge of the insulating layer 142) and the bottom surface. The inclination angle of the nozzle 191 refers to the angle formed between the horizontal plane and the center axis of the nozzle 191.
[Bonding of Substrate 121]

Figure 24A:
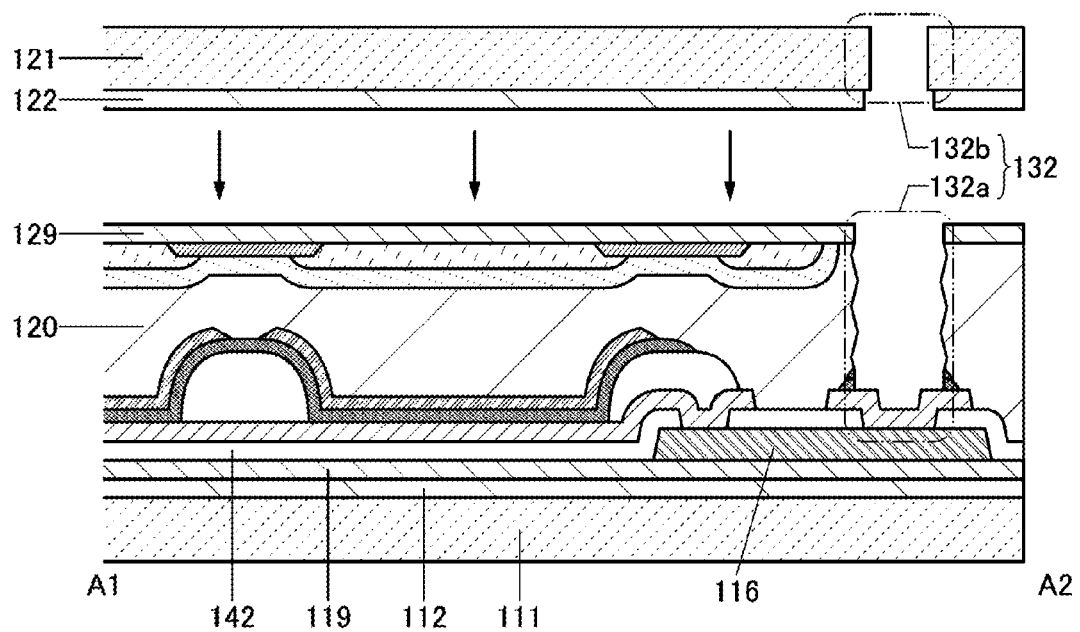
FIGS. 24A and 24B illustrate a manufacturing process of one embodiment of a display device.

Next, the substrate 121 having an opening 132b is bonded to the insulating layer 129 with the adhesive layer 122 provided therebetween (see FIG. 24A). The substrate 121 and the insulating layer 129 are bonded to each other so that the opening 132a overlaps with the opening 132b. In this embodiment, the opening 132a and the opening 132b are collectively referred to as an opening 132. The surface of the electrode 116a is exposed from the opening 132. After the substrate 121 is bonded to the insulating layer 129, the separation layer 110a may be removed.

Figure 24B:
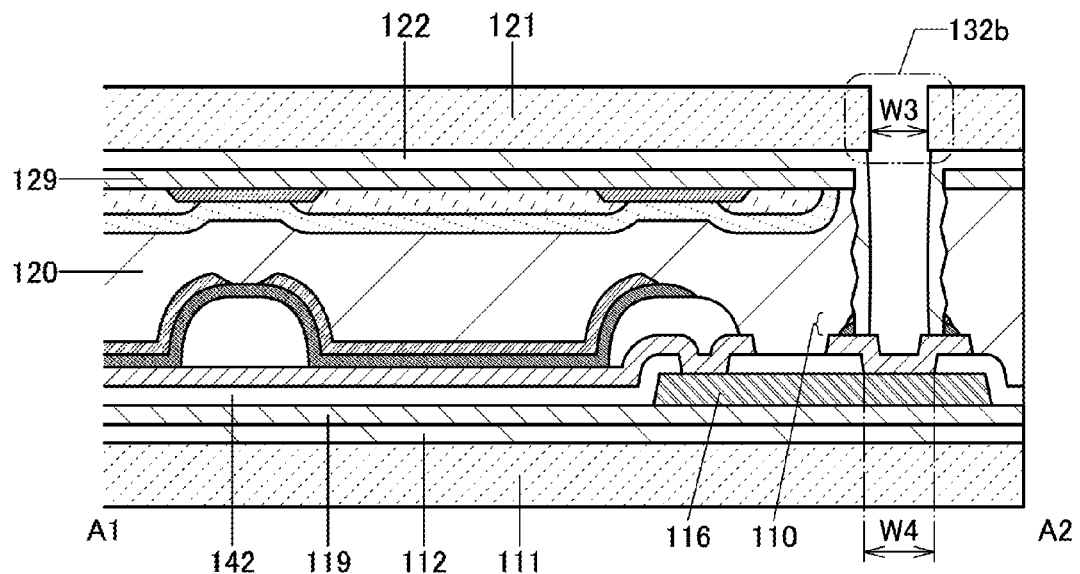

At the bonding of the substrate 121 to the insulating layer 129, the width of the opening 132b, the amount of an adhesive used for the adhesive layer 122, or the like is preferably adjusted so that the adhesive layer 122 covers side surfaces of the layers in the opening 132a as illustrated in FIG. 24B. With such a structure, a break or a crack of the insulating layer 129 and the like which are exposed in the side surfaces of the opening 132a can be suppressed. Moreover, after the removal of the separation layer 110b, the separation layer 110 remaining on the insulating layer 142 in the vicinity of the opening 132a is covered with the adhesive layer 122, so that diffusion of the material for forming the separation layer 110 into the anisotropic conductive connection layer 138 can be suppressed. For example, the width W3 of the opening 132b is preferably smaller than the width W4 of the opening 132 (see FIG. 24B). FIG. 24B is a cross-sectional view of the display device 100 after the bonding of the substrate 121 to the insulating layer 129.

Figure 25A:
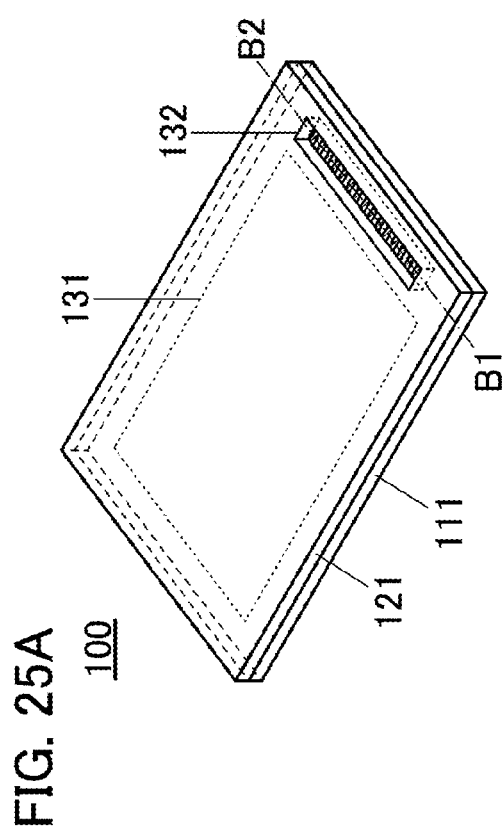
FIGS. 25A and 25B are a perspective view and a cross-sectional view illustrating one embodiment of a display device.
Figure 25B:
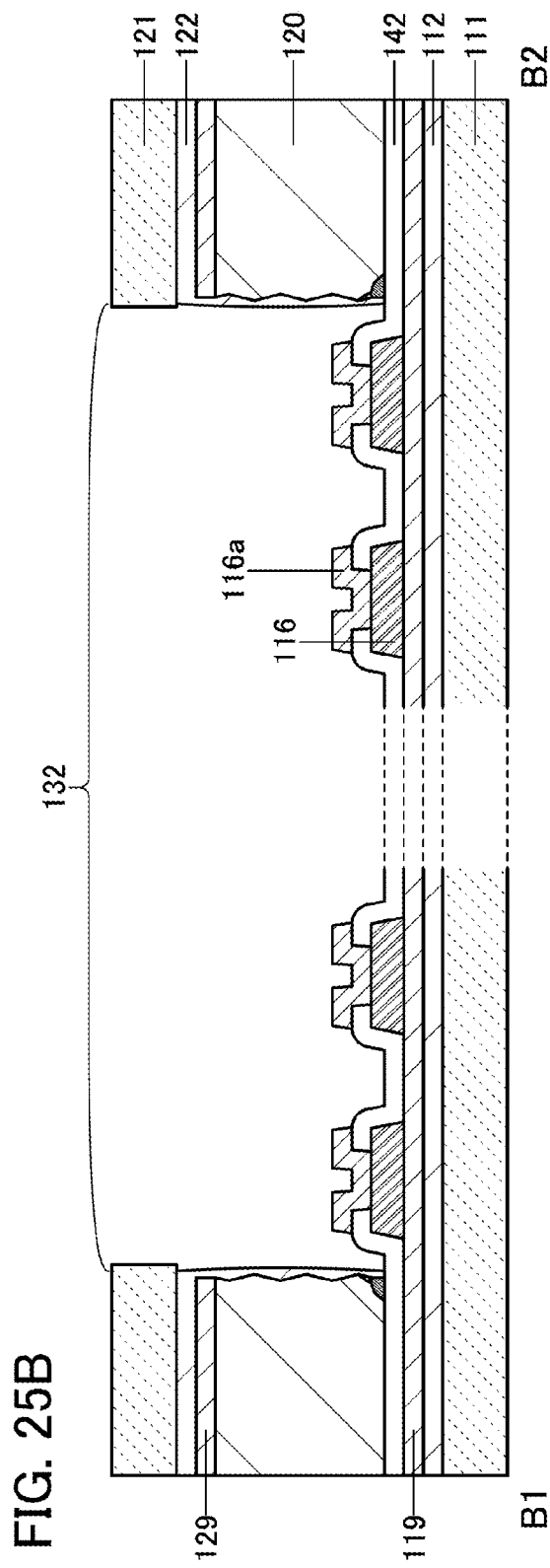

In the display device 100 of one embodiment of the present invention, a plurality of electrodes 116a may be provided in one opening 132 or the opening 132 may be provided for each electrode 116a. FIG. 25A is a perspective view of the display device 100 in which a plurality of electrodes 116a are provided in one opening 132, and FIG. 25B is a cross-sectional view taken along the dashed-dotted line B1-B2 in FIG. 25A. FIG. 26A is a perspective view of the display device 100 in which the opening 132 is provided for each electrode 116a, and FIG. 26B is a cross-sectional view taken along the dashed-dotted line B3-B4 in FIG. 26A.

The opening 132 is provided inside the edge of the substrate 121 in a plan view, so that the outer edge of the opening 132 can be supported by the substrate 121 and the substrate 111. Thus, the mechanical strength of a region where the external electrode 124 and the electrode 116a are connected to each other is unlikely to decrease, and unintentional deformation of the connected region can be reduced. Note that an effect of reducing the deformation of the connected region can be improved in the case where the opening 132 is provided for each electrode 116a as compared with the case where a plurality of electrodes 116a are provided in one opening 132 (see FIG. 26B). With one embodiment of the present invention, breakage of the display device 100 can be prevented, and the reliability of the display device 100 can be improved.

Alternatively, one or more of layers each formed using a material having a specific function, such as an anti-reflection layer, a light diffusion layer, a microlens array, a prism sheet, a retardation plate, or a polarizing plate, (hereinafter referred to as "optical functional layers") may be provided on an outer side than the substrate 111 or the substrate 121 from which the light 151 is emitted. As the anti-reflection layer, for example, a circularly polarizing plate can be used. With the functional layer, a display device having a higher display quality can be achieved. Moreover, power consumption of the display device can be reduced.

Figure 27A:
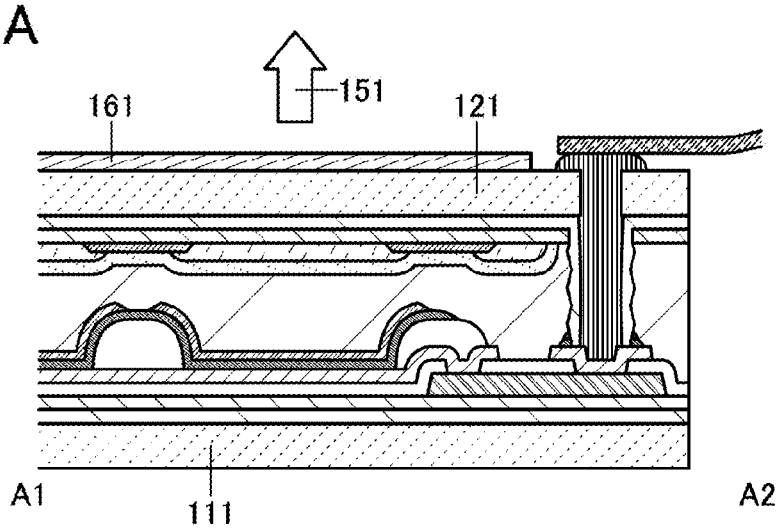
FIGS. 27A to 27C are cross-sectional views each illustrating one embodiment of a display device.
Figure 27B:
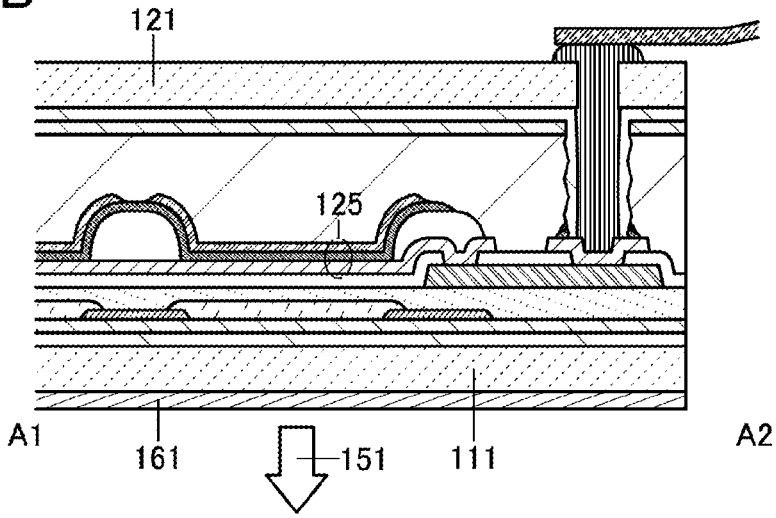
Figure 27C:
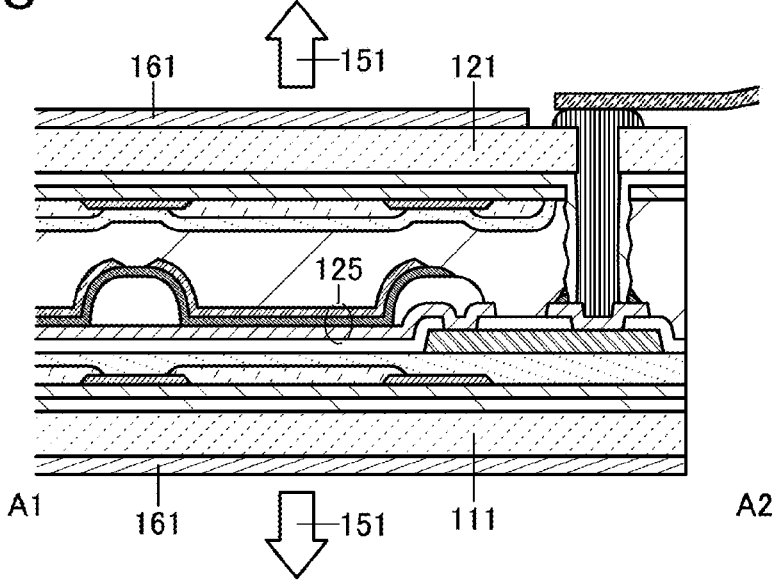

FIG. 27A is a cross-sectional view of the display device 100 having a top-emission structure including an optical functional layer 152. FIG. 27B is a cross-sectional view of the display device 100 having a bottom-emission structure including the optical functional layer 152. FIG. 27C is a cross-sectional view of the display device 100 having a dual-emission structure including the optical functional layer 152.

For the substrate 111 or the substrate 121, a material having a specific function may be used. For example, a circularly polarizing plate may be used as the substrate 111 or the substrate 121. Alternatively, for example, the substrate 111 or the substrate 121 may be formed using a retardation plate, and a polarizing plate may be provided so as to overlap with the substrate. As another example, the substrate 111 or the substrate 121 may be formed using a prism sheet, and a circularly polarizing plate may be provided so as to overlap with the substrate. With the use of the material having a specific function for the substrate 111 or the substrate 121, improvement of display quality and reduction of the manufacturing cost can be achieved.
[Formation of External Electrode 124]

Next, the anisotropic conductive connection layer 138 is formed in and on the opening 132, and the external electrode 124 for inputting electric power or a signal to the display device 100 is formed over the anisotropic conductive connection layer 138 (see FIGS. 11A and 11B). The electrode 116a is electrically connected to the external electrode 124 through the anisotropic conductive connection layer 138. Thus, electric power or a signal can be input to the display device 100. Note that an FPC can be used as the external electrode 124. A metal wire can also be used as the external electrode 124. Although the anisotropic conductive connection layer 138 may be used to connect the metal wire and the electrode 116 to each other, the connection may be performed by a wire bonding method without using the anisotropic conductive connection layer 138. Alternatively, the metal wire and the electrode 116 can be connected to each other by a soldering method.

The structure described in this embodiment can be implemented in appropriate combination with any of the structures described in the other embodiments.

Embodiment 4

Figure 28A:
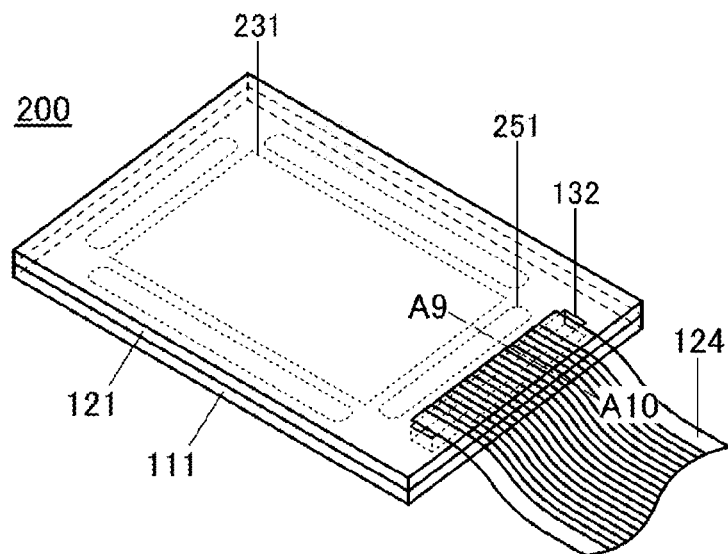
FIGS. 28A and 28B are a perspective view and a cross-sectional view illustrating one embodiment of a display device.
Figure 28B:
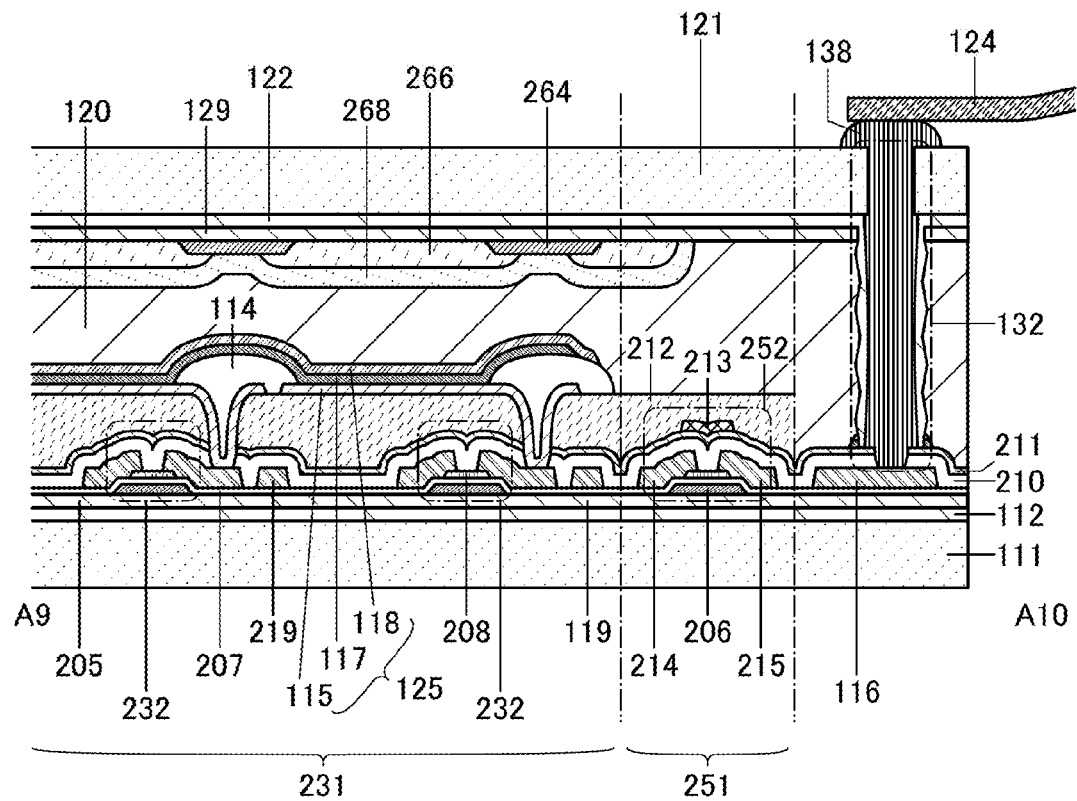

In this embodiment, a display device 200 having a structure different from the structure of the display device 100 described in the above embodiment and a touch panel will be described with reference to the drawings. FIG. 28A is a perspective view of the display device 200, and FIG. 28B is a cross-sectional view taken along the dashed-dotted line A9-A10 in FIG. 28A.
<Structure of Display Device>

The display device 200 described in this embodiment includes a display region 231 and a peripheral circuit 251. The display device 200 further includes the electrode 116 and the light-emitting element 125 including the electrode 115, the EL layer 117, and the electrode 118. A plurality of light-emitting elements 125 are formed in the display region 231. A transistor 232 for controlling the amount of light emitted from the light-emitting element 125 is connected to each light-emitting element 125.

The electrode 116 is electrically connected to the external electrode 124 through the anisotropic conductive connection layer 138 formed in the opening 132. Although not illustrated, the electrode 116 is electrically connected to the peripheral circuit 251.

The peripheral circuit 251 includes a plurality of transistors 252. The peripheral circuit 251 has a function of determining which light-emitting element 125 in the display region 231 to supply a signal supplied from the external electrode 124.

In the display device 200 illustrated in FIGS. 28A and 28B, the substrate 111 and the substrate 121 are bonded to each other with the adhesive layer 120 provided therebetween. An insulating layer 205 is formed over the substrate 111 with the adhesive layer 112 provided therebetween. The insulating layer 205 is preferably formed as a single layer or a multilayer using any of silicon oxide, silicon nitride, silicon oxynitride, silicon nitride oxide, aluminum oxide, aluminum oxynitride, and aluminum nitride oxide. The insulating layer 205 can be formed by a sputtering method, a CVD method, a thermal oxidation method, a coating method, a printing method, or the like.

The insulating layer 205 functions as a base layer and can prevent or reduce diffusion of impurity elements from the substrate 111, the adhesive layer 112, or the like to the transistor or the light-emitting element.

The transistor 232, the transistor 252, the electrode 116, and a wiring 219 are formed over the insulating layer 205. Although a channel-etched transistor that is a type of bottom-gate transistor is illustrated as the transistor 232 and/or the transistor 252 in this embodiment, a channel-protective transistor, a top-gate transistor, or the like can also be used. Alternatively, an inverted staggered transistor or a forward staggered transistor can also be used. It is also possible to use a dual-gate transistor, in which a semiconductor layer in which a channel is formed is provided between two gate electrodes. Furthermore, the transistor is not limited to a transistor having a single-gate structure; a multi-gate transistor having a plurality of channel formation regions, such as a double-gate transistor, may be used.

As the transistor 232 and the transistor 252, a transistor with any of a variety of structures such as a planar type, a FIN-type, and a Tri-Gate type can be used.

The transistor 232 and the transistor 252 may have the same structure or different structures. The size (e.g., channel length and channel width) or the like of each transistor can be adjusted as appropriate.

The transistor 232 and the transistor 252 each include an electrode 206 that can function as a gate electrode, an insulating layer 207 that can function as a gate insulating layer, a semiconductor layer 208, an electrode 214 that can function as one of a source electrode and a drain electrode, and an electrode 215 that can function as the other of the source electrode and the drain electrode.

The wiring 219, the electrode 214, and the electrode 215 can be formed at the same time as the electrode 116 using part of the conductive layers for forming the electrode 116. The insulating layer 207 can be formed using a material and a method similar to those of the insulating layer 205. The electrode 116a can be formed using a material and a method similar to those of the electrode 115.

The semiconductor layer 208 can be formed using a single crystal semiconductor, a polycrystalline semiconductor, a microcrystalline semiconductor, a nanocrystal semiconductor, a semi-amorphous semiconductor, an amorphous semiconductor, or the like. For example, amorphous silicon, microcrystalline germanium, or the like can be used. Alternatively, a compound semiconductor such as silicon carbide, gallium arsenide, an oxide semiconductor, or a nitride semiconductor, an organic semiconductor, or the like can be used. In the case of using an oxide semiconductor for the semiconductor layer 208, a c-axis aligned crystalline oxide semiconductor (CAAC-OS), a polycrystalline oxide semiconductor, a microcrystalline oxide semiconductor, a nanocrystalline oxide semiconductor (nc-OS), an amorphous oxide semiconductor, or the like can be used.

Note that an oxide semiconductor has an energy gap as wide as 3.0 eV or more and high visible-light transmissivity. In a transistor obtained by processing an oxide semiconductor under appropriate conditions, it is possible to realize an extremely low off-state current (current flowing between a source and drain in an off state of a transistor). For example, the off-state current per 1 μm of a channel width can be less than or equal to 100 zA ($1 \times 10^{-19}$ A), less than or equal to 10 zA ($1 \times 10^{-20}$ A), and further less than or equal to 1 zA ($1 \times 10^{-21}$ A) when the source-drain voltage is 3.5 V at 25° C. Therefore, a display device with low power consumption can be achieved.

In the case where an oxide semiconductor is used for the semiconductor layer 208, an insulating layer containing oxygen is preferably used as an insulating layer in contact with the semiconductor layer 208. For the insulating layer in contact with the semiconductor layer 208, it is particularly preferable to use an insulating layer from which oxygen is released by heat treatment.

An insulating layer 210 is formed over the transistor 232 and the transistor 252, and an insulating layer 211 is formed over the insulating layer 210. The insulating layers 210 and 211 each function as a protective insulating layer and can prevent or reduce diffusion of impurity elements from a layer above the insulating layer 211 to the transistor 232 and the transistor 252. The insulating layers 210 and 211 each can be formed using a material and a method similar to those of the insulating layer 205.

An interlayer insulating layer 212 is formed over the insulating layer 211. The interlayer insulating layer 212 can cover the unevenness caused by the transistor 232 and the transistor 252. Planarization treatment may be performed on a surface of the interlayer insulating layer 212. The planarization treatment may be, but not particularly limited to, polishing treatment (e.g., chemical mechanical polishing (CMP)) or dry etching treatment.

Forming the interlayer insulating layer 212 using an insulating material having a planarization function can omit polishing treatment. As the insulating material having a planarization function, for example, an organic material such as a polyimide resin or an acrylic resin can be used. Other than the above-described organic materials, it is also possible to use a low-dielectric constant material (low-k material) or the like. Note that the interlayer insulating layer 212 may be formed by stacking a plurality of insulating layers formed of these materials.

Over the interlayer insulating layer 212, the light-emitting element 125 and the partition 114 for separating the adjacent light-emitting elements 125 are formed. The electrode 115 is also formed in the opening 132 so as to overlap with the electrode 116.

The substrate 121 is provided with the light-blocking layer 264, the coloring layer 266, and the overcoat layer 268. The display device 200 is what is called a top-emission display device, in which light emitted from the light-emitting element 125 is extracted from the substrate 121 side through the coloring layer 266.

The light-emitting element 125 is electrically connected to the transistor 232 through an opening formed in the interlayer insulating layer 212 and insulating layers 211 and 210.

With a micro optical resonator (also referred to as microcavity) structure which allows light emitted from the EL layer 117 to resonate, lights with different wavelengths and narrowed spectra can be extracted even when one EL layer 117 is used for different light-emitting elements 125.

FIGS. 29A and 29B are cross-sectional views of the display device 200 in which the light-emitting element 125 has a microcavity structure, for example. Note that FIG. 29A corresponds to a cross-sectional view taken along the vicinity of the dashed-dotted line A9-A10 in FIG. 28A. FIG. 29B is an enlarged view of a portion 280 in FIG. 29A. Note that the display device 200 illustrated in FIGS. 29A and 29B includes the electrode 116a over the electrode 116.

In the case where the light-emitting element 125 has a microcavity structure, the electrode 118 is formed using a conductive material (a semi-transmissive material) which transmits and reflect a certain amount of light of the incident light, and the electrode 115 is formed using a stack of a conductive material having high reflectance (the reflectance of visible light is 50% or more and 100% or less, or preferably 70% or more and 100% or less) and a conductive material having high transmittance (the transmittance of visible light is 50% or more and 100% or less, or preferably 70% or more and 100% or less). Here, the electrode 115 is formed of a stack of an electrode 115a formed using a conductive material that reflects light and an electrode 115b formed using a conductive material that transmits light. The electrode 115b is provided between the EL layer 117 and the electrode 115a (see FIG. 29B). The electrode 115a functions as a reflective electrode, and the electrode 118 functions as a semi-reflective electrode.

For example, the electrode 118 may be formed using a conductive material containing silver (Ag) or a conductive material containing aluminum (Al) having a thickness of 1 nm to 30 nm, or preferably 1 nm to 15 nm. In this embodiment, as the electrode 118, a 10-nm-thick conductive material containing silver and magnesium is used.

The electrode 115a may be formed using a conductive material containing silver (Ag) or a conductive material containing aluminum (Al) having a thickness of 50 nm to 500 nm, or preferably 50 nm to 200 nm. In this embodiment, the electrode 115a is formed using a 100-nm-thick conductive material containing silver.

For the electrode 115b, a conductive oxide containing indium (In) or a conductive oxide containing zinc (Zn) having a thickness of 1 nm to 200 nm or preferably 5 nm to 100 nm may be used. In this embodiment, indium tin oxide is used for the electrode 115b. Furthermore, a conductive oxide may be provided under the electrode 115a.

By changing the thickness t of the electrode 115b, a distance d from the interface between the electrode 118 and the EL layer 117 to the interface between the electrode 115a and the electrode 115b can be set to an arbitral value. By changing the thickness t of the electrode 115b in each pixel, the light-emitting elements 125 having different emission spectra for respective pixels can be provided even when one EL layer 117 is used. Thus, color purity of each emission color is improved and a display device having favorable color reproducibility can be achieved. It is not necessary to independently form the EL layer 117 in each pixel depending on the emission color; therefore, the number of manufacturing steps of the display device can be reduced and thus the productivity can be improved. Furthermore, a high-definition display device can be achieved easily.

Note that a method for adjusting the distance d is not limited to the above method. For example, the distance d may be adjusted by changing the film thickness of the EL layer 117.

FIG. 29A shows an example in which the pixel 130R, the pixel 130G, the pixel 130B, and the pixel 130Y that emit red light 151R, green light 151G, blue light 151B, and yellow light 151Y, respectively, are used as one pixel 140. Note that one embodiment of the present invention is not limited to this example. As the pixel 140, subpixels that emit lights of red, green, blue, yellow, cyan, magenta, and white may be combined as appropriate. For example, the pixel 140 may be formed of the following three subpixels: the pixel 130R, the pixel 130G, and the pixel 130B.

Figure 30:
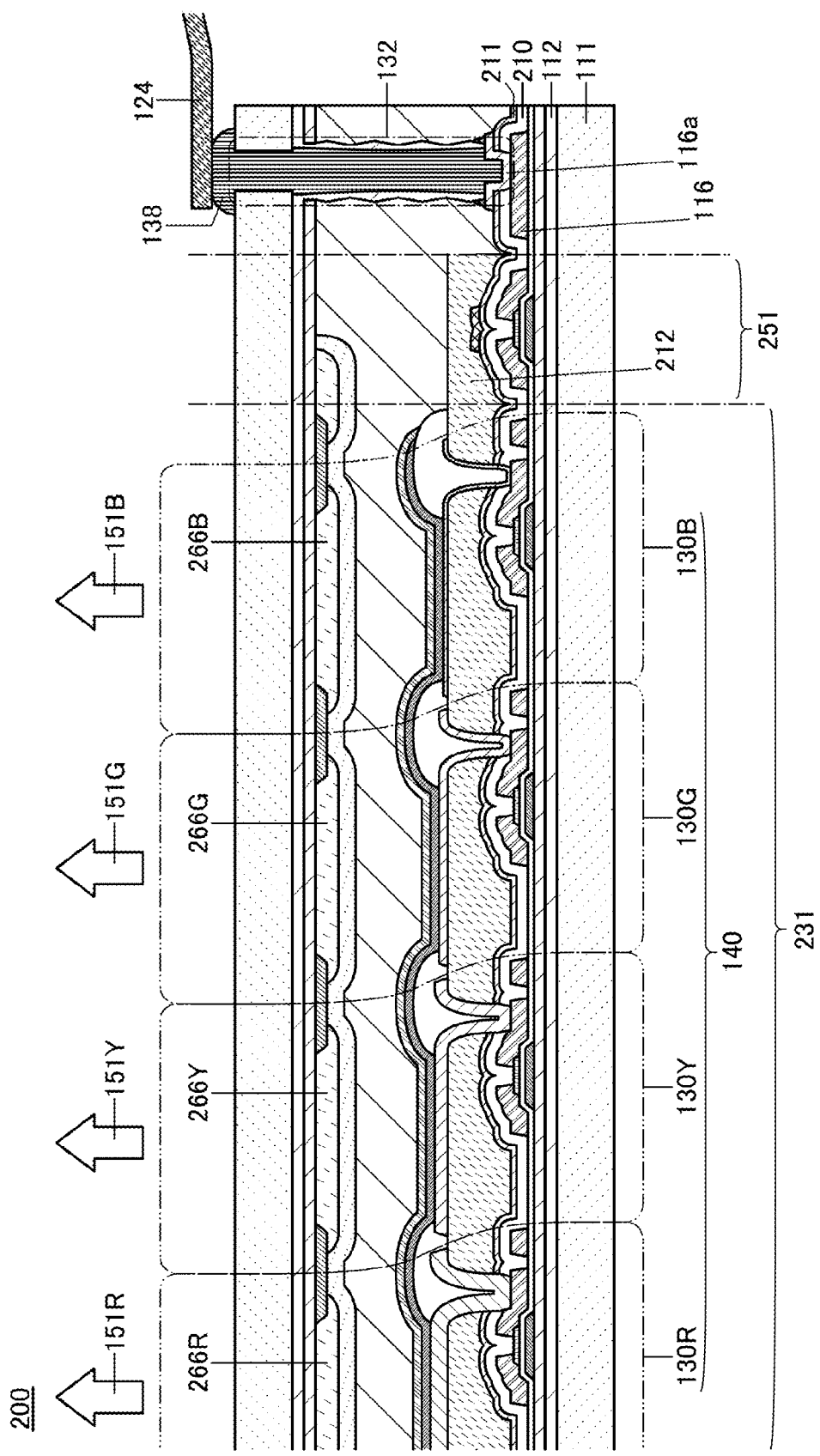
FIG. 30 is a cross-sectional view illustrating one embodiment of a display device.

The coloring layer 266 may be provided in a position overlapping with the light-emitting element 125 so that the light 151 is emitted outside through the coloring layer 266. FIG. 30 shows a structure example in the case where the coloring layer 266 is combined with the display device 200 illustrated in FIGS. 29A and 29B. In the display device 200 illustrated in FIG. 30, a coloring layer 266R, a coloring layer 266G, a coloring layer 266B, and a coloring layer 266Y that transmit light in a red wavelength band, light in a green wavelength band, light in a blue wavelength band, and light in a yellow wavelength band, respectively, are provided so as to overlap with the pixel 130R that emits the red light 151R, the pixel 130G that can emit the green light 151G, the pixel 130B that can emit the blue light 151B, and the pixel 130Y that can emit the yellow light 151Y, respectively.

By using the pixel 130Y in addition to the pixel 130R, the pixel 130G, and the pixel 130B, the color reproducibility of the display device can be increased. In the case where the pixel 140 is formed of only the pixel 130R, the pixel 130G, and the pixel 130B, all of the pixels 130R, 130G, and 130B need to emit light when white light is emitted from the pixel 140. When the pixel 130Y is provided in addition to the pixel 130R, the pixel 130G, and the pixel 130B, white light can be obtained by emitting light only from the pixel 130B and the pixel 130Y. Thus, since white light can be obtained even without light emission from the pixel 130R and the pixel 130G, power consumption of the display device can be reduced.

Moreover, the pixel 130W that can emit white light 151W may be used instead of the pixel 130Y. The use of the pixel 130W instead of the pixel 130Y allows emission of white light by emitting light only from the pixel 130W; therefore, power consumption of the display device can be further reduced.

Note that in the case of using the pixel 130W, a coloring layer is not necessarily provided in the pixel 130W. Without a coloring layer, the luminance of the display region is improved and a display device having favorable visibility can be achieved. Moreover, power consumption of the display device can be further reduced.

The pixel 130W may be provided with a coloring layer 266W that transmits light of substantially whole of the visible region, by which the color temperature of the white light 151W can be changed. Accordingly, a display device having a high display quality can be achieved.

The color purity of the light 151 can be further improved by using the light-emitting element 125 having a microcavity structure and the coloring layer 266 in combination. Therefore, the color reproducibility of the display device 200 can be improved. In addition, light that enters from the outside is mostly absorbed by the coloring layer 266; therefore, reflection of the light that enters from the outside on the display region 231 is suppressed and thus the visibility of the display device can be improved. Accordingly, a display device having a high display quality can be achieved.

Although an active matrix display device is described as an example of the display device in this embodiment, one embodiment of the present invention can also be applied to a passive matrix display device. Moreover, one embodiment of the present invention can also be applied to a display device having a bottom-emission structure or a dual-emission structure.

The display device 200 may include a touch sensor. In the following description, a touch panel in which a touch sensor 160 is provided over the substrate 121 of the display device 200 illustrated in FIGS. 28A and 28B is described with reference to FIG. 31. The structure of the display device 200 is similar to that described above and thus is not described here.

<Structure of Touch Panel>

Figure 31:
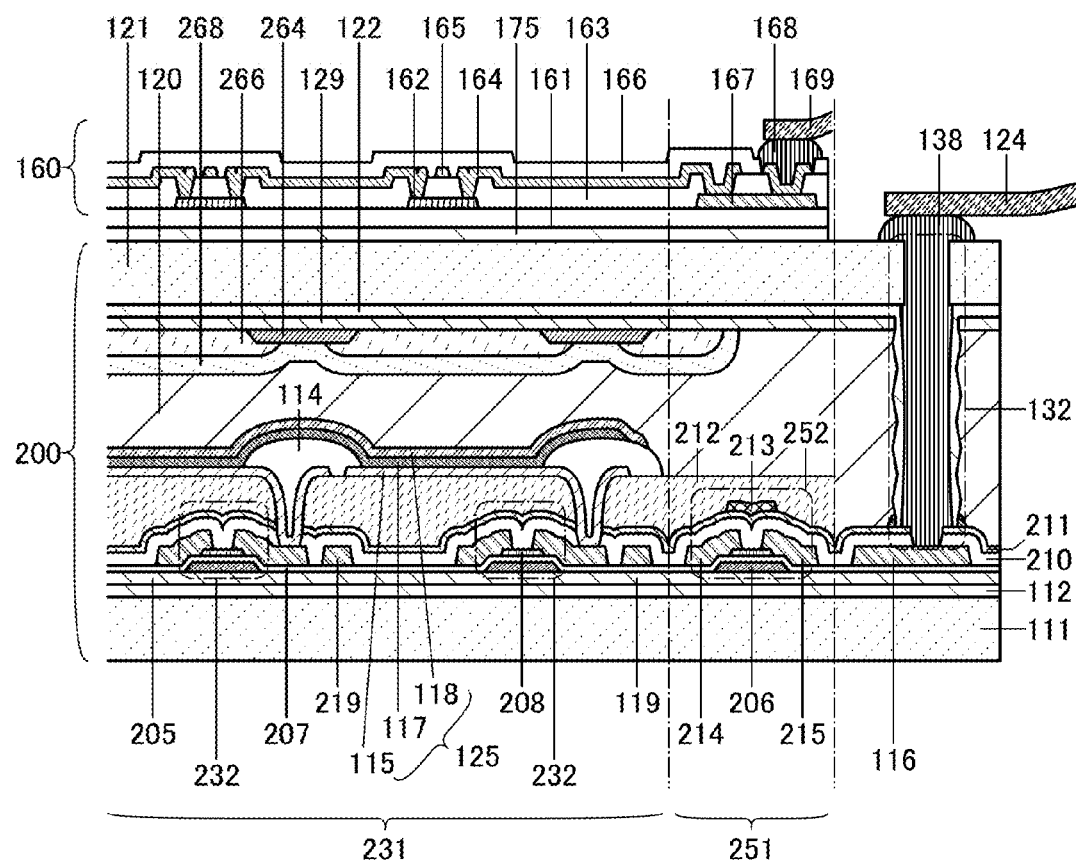
FIG. 31 is a cross-sectional view illustrating one embodiment of a display device.

The touch panel illustrated in FIG. 31 includes the display device 200 and the touch sensor 160. The touch sensor 160 is provided over a substrate 161. The substrate 161 preferably has flexibility like the substrate 111 and the substrate 121.

A plurality of wirings 167 are electrically connected to the touch sensor 160. The plurality of wirings 167 are led to a peripheral portion of the substrate 161, and part of the plurality of wirings 167 form a terminal. The terminal is electrically connected to an external electrode 169 through an anisotropic conductive connection layer 168.

As the touch sensor 160, for example, a capacitive touch sensor can be used. Examples of the capacitive touch sensor are a surface capacitive touch sensor and a projected capacitive touch sensor.

Examples of the projected capacitive touch sensor are a self capacitive touch sensor and a mutual capacitive touch sensor, which differ mainly in the driving method. The use of the mutual capacitive type is preferable because multiple points can be sensed simultaneously.

The case of using a projected capacitive touch sensor is described below.

Note that the structure of the touch sensor is not limited to the above structure, and a variety of sensors that can sense the proximity or the contact of a sensing target such as a finger, can be used.

The touch sensor 160 of a projected capacitive type includes electrodes 164 and electrodes 165. The electrodes 164 are electrically connected to any of the plurality of wirings 167, and the electrodes 165 are electrically connected to any of the other wirings 167.

A wiring 162 electrically connects two electrodes 164 between which the electrode 165 is positioned. The intersecting area of the wiring 162 and the electrode 165 is preferably as small as possible. Such a structure allows a reduction in the area of a region where the electrodes are not provided, reducing unevenness in transmittance. As a result, unevenness in luminance of light emitted from the light-emitting element 125 and transmitted through the touch sensor 160 can be reduced.

Note that the shapes of the electrodes 164 and the electrodes 165 can be any of a variety of shapes. For example, the plurality of electrodes 164 may be provided so that space between the electrodes 164 is reduced as much as possible, and the electrodes 165 may be spaced apart from the electrodes 164 with an insulating layer interposed therebetween to have regions not overlapping with the electrodes 164. In this case, it is preferable to provide, between two adjacent electrodes 165, a dummy electrode electrically insulated from these electrodes because the area of regions having different transmittances can be reduced.

The touch sensor 160 includes, over the substrate 161, the wiring 162 which electrically connects adjacent electrodes 164, an insulating layer 163, the electrodes 164 and the electrodes 165 which are provided in a staggered arrangement over the insulating layer 163, and an insulating layer 166.

An adhesive layer 175 bonds the substrate 161 to the surface of the substrate 121 that does not face the light-emitting element 125 so that the touch sensor 160 overlaps with the display region 231.

In this structure example, a top emission light-emitting module is used as the display device 200. In the case where the display device 200 is a bottom emission module, the adhesive layer 175 bonds the substrate 161 to the surface of the substrate 111 that does not face the light-emitting element 125.

The wiring 162 is preferably formed using a light-transmitting conductive material, in which case the aperture ratio of the light-emitting module can be increased. As the light-transmitting conductive material, a conductive oxide such as indium oxide, indium tin oxide, indium zinc oxide, zinc oxide, or zinc oxide to which gallium is added, or graphene can be used.

The wiring 162 may be formed by depositing a light-transmitting conductive material on the substrate 161 by a sputtering method and then removing an unnecessary portion by a variety of patterning technique such as photolithography. Graphene may be formed by a CVD method or by applying a solution in which graphene oxide is dispersed and then reducing the solution.

Examples of a material for the insulating layer 163 include a resin such as acrylic or epoxy resin, a resin having a siloxane bond such as silicone, and an inorganic insulating material such as silicon oxide, silicon oxynitride, or aluminum oxide.

Furthermore, an opening reaching the wiring 162 is formed in the insulating layer 163, and the electrodes 164 and 165 are formed using a material and a method similar to those of the wiring 162.

One of the electrodes 165 extends in one direction, and a plurality of electrodes 165 are provided in the form of stripes.

The wiring 162 intersects with the electrode 165.

Adjacent electrodes 164 are provided with one of the electrodes 165 provided therebetween. The wiring 162 electrically connects the adjacent electrodes 164.

Note that the plurality of electrodes 164 are not necessarily arranged in the direction orthogonal to one electrode 165 and may be arranged to intersect with one electrode 165 at an angle of less than 90°.

One wiring 167 is electrically connected to any of the electrodes 164 and the electrodes 165. Part of the wiring 167 serves as a terminal. For the wiring 167, a metal material such as aluminum, gold, platinum, silver, nickel, titanium, tungsten, chromium, molybdenum, iron, cobalt, copper, or palladium or an alloy material containing any of these metal materials can be used.

Note that an insulating layer for protecting the touch sensor 160 may be provided. In this structure example, the insulating layer 166 is provided to cover the insulating layer 163, the electrode 164, and the electrode 165.

The wiring 167 is electrically connected to the external electrode 169 by the anisotropic conductive connection layer 168.

The anisotropic conductive connection layer 168 can be formed using any of various kinds of anisotropic conductive films (ACF), anisotropic conductive pastes (ACP), and the like.

The adhesive layer 175 has a light-transmitting property. For example, a thermosetting resin or an ultraviolet curable resin can be used; specifically, a resin such as an acrylic resin, polyurethane, an epoxy resin, or a resin having a siloxane bond can be used.

This embodiment can be implemented in an appropriate combination with any of the structures described in the other embodiments.

Embodiment 5

Figure 32A:
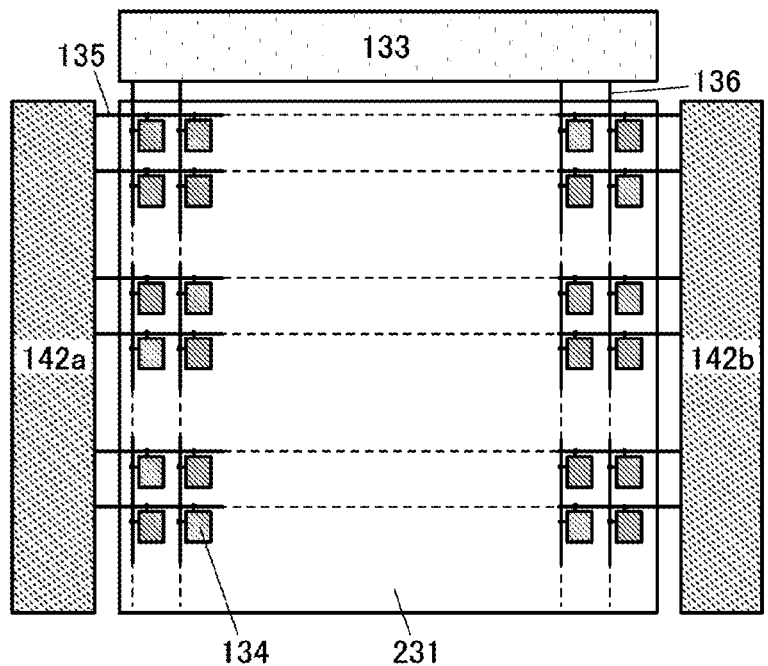
FIGS. 32A to 32C are a block diagram and circuit diagrams illustrating embodiments of a display device.

In this embodiment, a specific structure example of the display device 200 will be described with reference to FIGS. 32A to 32C. FIG. 32A is a block diagram illustrating the structure example of the display device 200.

The display device 200 illustrated in FIG. 32A includes the display region 231, a driver circuit 142a, a driver circuit 142b, and a driver circuit 133. The driver circuits 142a, 142b, and 133 collectively correspond to the peripheral circuit 251 described in the above embodiment. The driver circuits 142a, 142b, and 133 are collectively referred to as a driver circuit portion in some cases.

The driver circuits 142a and 142b function as, for example, scan line driver circuits. The driver circuit 133 functions as, for example, a signal line driver circuit. Note that one of the driver circuits 142a and 142b may be omitted. Alternatively, some sort of circuit facing the driver circuit 133 may be provided with the display region 231 provided between the circuit and the driver circuit 133.

The display device 200 includes m wirings 135 that are arranged substantially parallel to each other and whose potentials are controlled by the driver circuit 142a and/or the driver circuit 142b, and n wirings 136 that are arranged substantially parallel to each other and whose potentials are controlled by the driver circuit 133. The display region 231 includes a plurality of pixel circuits 134 arranged in matrix. One pixel circuit 134 is used for driving one subpixel (the pixel 130).

Each of the wirings 135 is electrically connected to the n pixel circuits 134 in a given row among the pixel circuits 134 arranged in m rows and n columns in the display region 231. Each of the wirings 136 is electrically connected to the m pixel circuits 134 in a given column among the pixel circuits 134 arranged in m rows and n columns. Note that m and n are each an integer of 1 or more.

Example of Pixel Circuit for Display Device

Figure 32B:
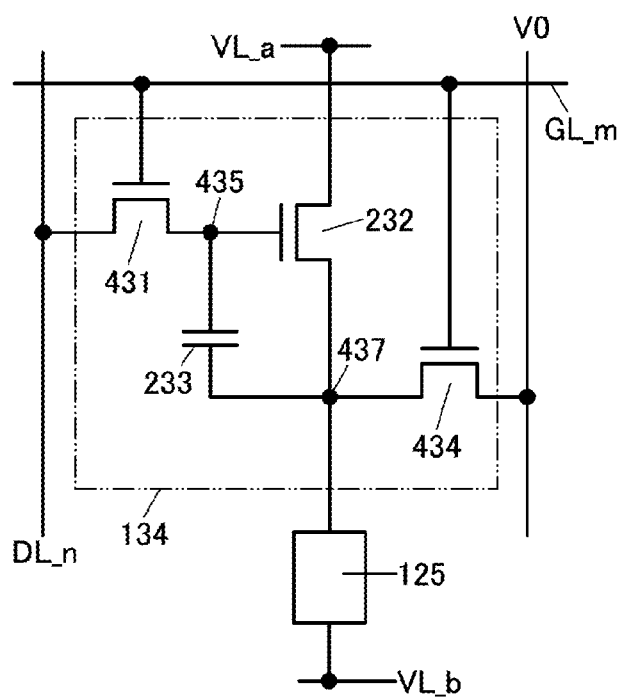
Figure 32C:
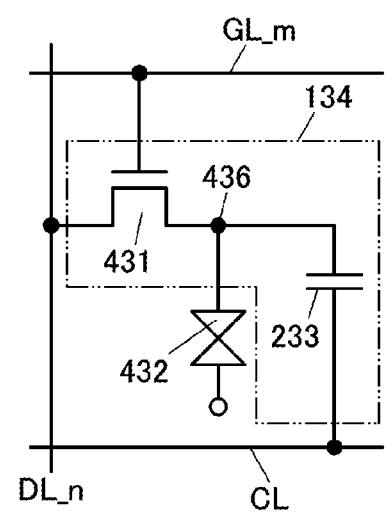

FIGS. 32B and 32C show examples of a circuit structure that can be used for the pixel circuits 134 in the display device in FIG. 32A.

The pixel circuit 134 illustrated in FIG. 32B includes a transistor 431, a capacitor 233, the transistor 232, and a transistor 434. The pixel circuit 134 is electrically connected to the light-emitting element 125.

One of a source electrode and a drain electrode of the transistor 431 is electrically connected to a wiring to which a data signal is supplied (hereinafter referred to as a signal line DL_n). A gate electrode of the transistor 431 is electrically connected to a wiring to which a gate signal is supplied (hereinafter referred to as a scan line GL_m). The signal line DL_n and the scan line GL_m correspond to the wiring 136 and the wiring 135, respectively.

The transistor 431 has a function of controlling whether to write a data signal to a node 435.

One of a pair of electrodes of the capacitor 233 is electrically connected to the node 435, and the other of the pair of electrodes of the capacitor 233 is electrically connected to a node 437. The other of the source electrode and the drain electrode of the transistor 431 is electrically connected to the node 435.

The capacitor 233 functions as a storage capacitor for storing data written to the node 435.

One of a source electrode and a drain electrode of the transistor 232 is electrically connected to a potential supply line VL_a, and the other is electrically connected to the node 437. A gate electrode of the transistor 232 is electrically connected to the node 435.

One of a source electrode and a drain electrode of the transistor 434 is electrically connected to a potential supply line V0, and the other is electrically connected to the node 437. A gate electrode of the transistor 434 is electrically connected to the scan line GL_m.

One of an anode and a cathode of the light-emitting element 125 is electrically connected to a potential supply line VL_b, and the other is electrically connected to the node 437.

As the light-emitting element 125, an organic electroluminescent element (also referred to as an organic EL element) can be used, for example. Note that the light-emitting element 125 is not limited thereto and may be an inorganic EL element containing, for example, an inorganic material.

As a power supply potential, a potential on the comparatively high potential side or a potential on the comparatively low potential side can be used, for example. A power supply potential on the high potential side is referred to as a high power supply potential (also referred to as VDD), and a power supply potential on the low potential side is referred to as a low power supply potential (also referred to as VSS). A ground potential can be used as the high power supply potential or the low power supply potential. For example, in the case where a ground potential is used as the high power supply potential, the low power supply potential is a potential lower than the ground potential, and in the case where a ground potential is used as the low power supply potential, the high power supply potential is a potential higher than the ground potential.

A high power supply potential VDD is supplied to one of the potential supply line VL_a and the potential supply line VL_b, and a low power supply potential VSS is supplied to the other, for example.

In the display device including the pixel circuit 134 in FIG. 32B, the pixel circuits 134 are sequentially selected row by row by the driver circuit 142a and/or the driver circuit 142b, so that the transistors 431 and 434 are turned on and a data signal is written to the nodes 435.

When the transistors 431 and 434 are turned off, the pixel circuits 134 in which the data has been written to the nodes 435 are brought into a holding state. The amount of current flowing between the source electrode and the drain electrode of the transistor 232 is controlled in accordance with the potential of the data written to the node 435. The light-emitting element 125 emits light with luminance corresponding to the amount of the flowing current. This operation is sequentially performed row by row; thus, an image can be displayed.

Example of Pixel Circuit for Liquid Crystal Display Device

The pixel circuit 134 in FIG. 32C includes the transistor 431 and the capacitor 233. The pixel circuit 134 is electrically connected to a liquid crystal element 432.

The potential of one of a pair of electrodes of the liquid crystal element 432 is set in accordance with the specifications of the pixel circuit 134 as appropriate. The alignment state of the liquid crystal element 432 depends on data written to a node 436. A common potential may be applied to one of the pair of electrodes of the liquid crystal element 432 included in each of the plurality of pixel circuits 134. The potential supplied to one of a pair of electrodes of the liquid crystal element 432 in the pixel circuit 134 may change row by row.

Examples of a method for driving the display device including the liquid crystal element 432 include a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, and a transverse bend alignment (TBA) mode. Other examples of the method for driving the display device include an electrically controlled birefringence (ECB) mode, a polymer-dispersed liquid crystal (PDLC) mode, a polymer network liquid crystal (PNLC) mode, and a guest-host mode. Note that one embodiment of the present invention is not limited thereto, and various liquid crystal elements and driving methods can be used.

The liquid crystal element 432 may be formed using a liquid crystal composition including liquid crystal exhibiting a blue phase and a chiral material. The liquid crystal exhibiting a blue phase has a short response time of 1 ms or less and has optical isotropy; thus, an alignment process is not necessary. A liquid crystal display device including a liquid crystal exhibiting a blue phase has small viewing angle dependence because the liquid crystal has optical isotropy.

In the pixel circuit 134 in the m-th row and the n-th column, one of the source electrode and the drain electrode of the transistor 431 is electrically connected to the signal line DL_n, and the other of the source electrode and the drain electrode of the transistor 431 is electrically connected to the node 436. The gate electrode of the transistor 431 is electrically connected to the scan line GL_m. The transistor 431 has a function of controlling whether to write a data signal to the node 436.

One of the pair of electrodes of the capacitor 233 is electrically connected to a wiring to which a specific potential is supplied (hereinafter referred to as a capacitor line CL), and the other of the pair of electrodes of the capacitor 233 is electrically connected to the node 436. The other of the pair of electrodes of the liquid crystal element 432 is electrically connected to the node 436. The potential of the capacitor line CL is set in accordance with the specifications of the pixel circuit 134 as appropriate. The capacitor 233 functions as a storage capacitor for storing data written to the node 436.

For example, in the display device including the pixel circuit 134 in FIG. 32C, the pixel circuits 134 are sequentially selected row by row by the driver circuit 142a and/or the driver circuit 142b, so that the transistors 431 are turned on and a data signal is written to the nodes 436.

When the transistors 431 are turned off, the pixel circuits 134 in which the data signal has been written to the nodes 436 are brought into a holding state. This operation is sequentially performed row by row; thus, an image can be displayed on the display region 231.

[Display Element]

The display device of one embodiment of the present invention can employ various modes and can include various display elements. Examples of the display element include an electroluminescence (EL) element (e.g., an EL element including organic and inorganic materials, an organic EL element, or an inorganic EL element) including, an LED (e.g., a white LED, a red LED, a green LED, or a blue LED), a transistor (a transistor that emits light depending on current), a plasma display panel (PDP), an electron emitting element, a liquid crystal element, an electrophoretic element, a display element using micro electro mechanical system (MEMS) such as a grating light valve (GLV), a digital micromirror device (DMD), a digital micro shutter (DMS) element, a MIRASOL (registered trademark) display, an interferometric modulator display (IMOD) element, and a piezoelectric ceramic display, an electrowetting element, and the like. Other than the above, the display device may contain a display medium whose contrast, luminance, reflectance, transmittance, or the like is changed by electrical or magnetic action. Alternatively, quantum dots may be used as the display element. Examples of display devices having EL elements include an EL display. Examples of a display device including an electron emitter include a field emission display (FED) and an SED-type flat panel display (SED: surface-conduction electron-emitter display). Examples of display devices including quantum dots include a quantum dot display. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of display devices having electrophoretic elements include electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

This embodiment can be implemented in an appropriate combination with any of the structures described in the other embodiments.

Embodiment 6

In this embodiment, structure examples of a light-emitting element that can be used as the light-emitting element 125 will be described. Note that an EL layer 320 described in this embodiment corresponds to the EL layer 117 described in the other embodiments.

<Structure of Light-Emitting Element>

Figure 33A:
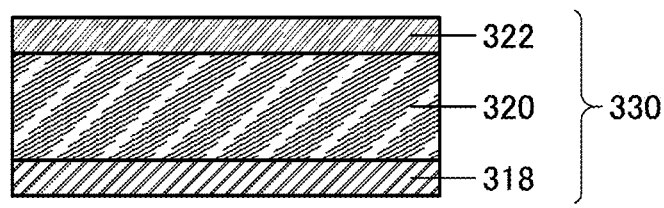
FIGS. 33A and 33B each illustrate a structure example of a light-emitting element.

In a light-emitting element 330 illustrated in FIG. 33A, the EL layer 320 is sandwiched between a pair of electrodes (electrodes 318 and 322). Note that the electrode 318 is used as an anode and the electrode 322 is used as a cathode as an example in the following description of this embodiment.

The EL layer 320 includes at least a light-emitting layer and may have a stacked-layer structure including a functional layer other than the light-emitting layer. As the functional layer other than the light-emitting layer, a layer containing a substance having a high hole-injection property, a substance having a high hole-transport property, a substance having a high electron-transport property, a substance having a high electron-injection property, a bipolar substance (a substance having high electron and hole transport properties), or the like can be used. Specifically, functional layers such as a hole-injection layer, a hole-transport layer, an electron-transport layer, and an electron-injection layer can be used in appropriate combination.

The light-emitting element 330 illustrated in FIG. 33A emits light when current flows by applying a potential difference between the electrode 318 and the electrode 322 and holes and electrons are recombined in the EL layer 320. In other words, a light-emitting region is formed in the EL layer 320.

In one embodiment of the present invention, light emitted from the light-emitting element 330 is extracted to the outside from the electrode 318 side or the electrode 322 side. Thus, one of the electrodes 318 and 322 is formed using a light-transmitting substance.

Figure 33B:
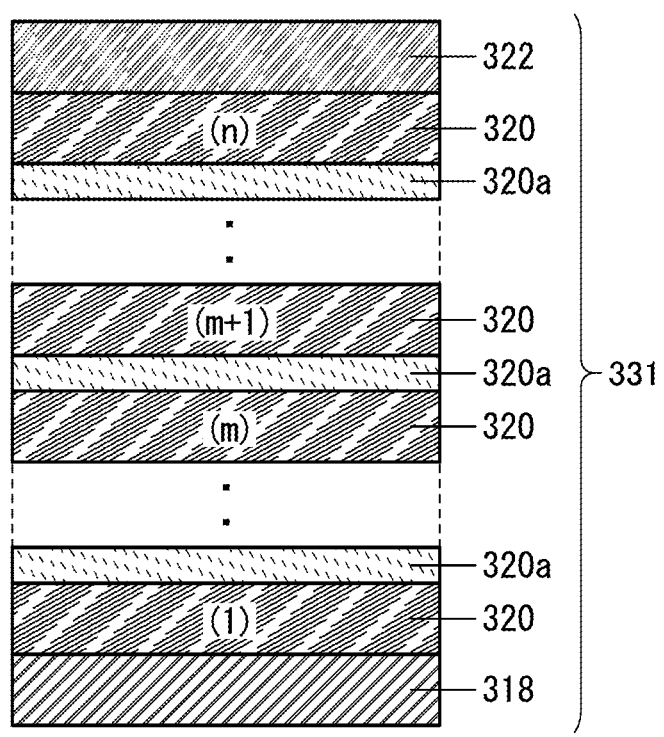

Note that a plurality of EL layers 320 may be stacked between the electrode 318 and the electrode 322 as in a light-emitting element 331 illustrated in FIG. 33B. In the case where n (n is a natural number of 2 or more) layers are stacked, an electric charge generation layer 320a is preferably provided between an m-th EL layer 320 and an (m+1)-th EL layer 320. Note that m is a natural number greater than or equal to 1 and less than n. The components other than the electrode 318 and the electrode 322 correspond to the EL layer 117 of the aforementioned embodiments.

The electric charge generation layer 320a can be formed using a composite material of an organic compound and a metal oxide. Examples of the metal oxide are vanadium oxide, molybdenum oxide, tungsten oxide, and the like. As the organic compound, a variety of compounds can be used; for example, an aromatic amine compound, a carbazole derivative, an aromatic hydrocarbon, and an oligomer, a dendrimer, and a polymer having a basic skeleton of these compounds can be used. Note that as the organic compound, it is preferable to use an organic compound that has a hole-transport property and has a hole mobility of $10^{-6}$ cm$^2$/Vs or higher. However, other substances may be used as long as their hole-transport properties are higher than their electron-transport properties. These materials used for the electric charge generation layer 320a have excellent carrier-injection properties and carrier-transport properties; thus, the light-emitting element 331 can be driven with low current and with low voltage. Other than the composite material, a material obtained by adding an alkali metal, an alkaline earth metal, a compound of the alkali metal, a compound of an alkaline earth metal, or the like to the above-described composite material can be used for the electric charge generation layer 320a.

Note that the electric charge generation layer 320a may be formed by a combination of a composite material of an organic compound and a metal oxide with another material. For example, the electric charge generation layer 320a may be formed by a combination of a layer containing the composite material of an organic compound and a metal oxide with a layer containing one compound selected from electron-donating substances and a compound having a high electron-transport property. Furthermore, the electric charge generation layer 320a may be formed by a combination of a layer containing the composite material of an organic compound and a metal oxide with a transparent conductive film.

The light-emitting element 331 having such a structure is unlikely to result in energy transfer between the neighboring EL layer 320 and can easily realize high emission efficiency and a long lifetime. Furthermore, it is easy to obtain phosphorescence from one light-emitting layer and fluorescence from the other light-emitting layer.

The electric charge generation layer 320a has a function of injecting holes to one of the EL layers 320 that is in contact with the electric charge generation layer 320a and a function of injecting electrons to the other EL layer 320 that is in contact with the electric charge generation layer 320a, when voltage is applied to the electrodes 318 and 322.

The light-emitting element 331 illustrated in FIG. 33B can provide a variety of emission colors by changing the type of the light-emitting substance used for the EL layers 320. In addition, a plurality of light-emitting substances having different emission colors may be used as the light-emitting substances, so that light emission having a broad spectrum or white light emission can be obtained.

In the case of obtaining white light emission using the light-emitting element 331 in FIG. 33B, as for a combination of a plurality of EL layers, a structure for emitting white light including red light, blue light, and green light may be used. For example, the structure may include an EL layer containing a blue fluorescent substance as a light-emitting substance and an EL layer containing green and red phosphorescent substances as light-emitting substances. Alternatively, the structure may include an EL layer emitting red light, an EL layer emitting green light, and an EL layer emitting blue light. Further alternatively, with a structure including EL layers emitting light of complementary colors, white light emission can be obtained. In a stacked-layer element including two EL layers which emit lights with complementary colors, the combination of colors are, for example, blue and yellow, or blue-green and red.

Note that in the structure of the above stacked-layer element, by providing the electric charge generation layer between the stacked light-emitting layers, the element can give a high-luminance region at a low current density, and have a long lifetime.

This embodiment can be implemented in an appropriate combination with any of the structures described in the other embodiments.

Embodiment 7

In this embodiment, an example of a transistor which can be used instead of the transistor 232 and/or the transistor 252 described in the above embodiments will be described with reference to FIGS. 34A1, 34A2, 34B1, and 34B2. A transistor disclosed in this specification and the like can be used as the transistors 431, 434, and the like.

[Bottom-Gate Transistor]

A transistor 410 shown in FIG. 34A1 as an example is a channel-protective transistor that is a type of bottom-gate transistor. The transistor 410 includes an insulating layer 209 that can function as a channel protective layer over a channel formation region in the semiconductor layer 208. The insulating layer 209 can be formed using a material and a method that are similar to those of the insulating layer 205 described in Embodiment 2. Part of the electrode 214 and part of the electrode 215 are formed over the insulating layer 209.

With the insulating layer 209 provided over the channel formation region, the semiconductor layer 208 can be prevented from being exposed at the time of forming the electrode 214 and the electrode 215. Thus, the semiconductor layer 208 can be prevented from being reduced in thickness at the time of forming the electrode 214 and the electrode 215.

A transistor 411 illustrated in FIG. 34A2 is different from the transistor 410 in that an electrode 213 that can function as a back gate electrode is provided over the insulating layer 211. The electrode 213 can be formed using a material and a method that are similar to those of the electrode 206. The electrode 213 may be formed between the insulating layer 210 and the insulating layer 211.

In general, the back gate electrode is formed using a conductive layer and positioned so that the channel formation region of the semiconductor layer is provided between the gate electrode and the back gate electrode. Thus, the back gate electrode can function in a manner similar to that of the gate electrode. The potential of the back gate electrode may be the same as that of the gate electrode or may be a GND potential or a predetermined potential. By changing a potential of the back gate electrode independently of the potential of the gate electrode, the threshold voltage of the transistor can be changed.

The electrodes 206 and 213 can both function as a gate electrode. Thus, the insulating layers 207, 209, 210, and 211 can all function as a gate insulating layer.

In the case where one of the electrode 206 and the electrode 213 is simply referred to as a "gate electrode", the other can be referred to as a "back gate electrode". For example, in the transistor 411, in the case where the electrode 213 is referred to as a "gate electrode", the electrode 206 is referred to as a "back gate electrode". In the case where the electrode 213 is used as a "gate electrode", the transistor 411 is a kind of bottom-gate transistor. Furthermore, one of the electrode 206 and the electrode 213 might be referred to as a "first gate electrode", and the other might be referred to as a "second gate electrode".

By providing the electrode 206 and the electrode 213 with the semiconductor layer 208 provided therebetween and setting the potentials of the electrode 206 and the electrode 213 to be the same, a region of the semiconductor layer 208 through which carriers flow is enlarged in the film thickness direction; thus, the number of transferred carriers is increased. As a result, the on-state current and the field-effect mobility of the transistor 411 are increased.

Therefore, the transistor 411 has large on-state current for the area occupied thereby. That is, the area occupied by the transistor 411 can be small for required on-state current.

Furthermore, the gate electrode and the back gate electrode are formed using conductive layers and thus each have a function of preventing an electric field generated outside the transistor from influencing the semiconductor layer in which the channel is formed (in particular, a function of blocking static electricity).

Since the electrode 206 and the electrode 213 each have a function of blocking an electric field generated outside, charges of charged particles and the like generated on the substrate 111 side or above the electrode 213 do not influence the channel formation region in the semiconductor layer 208. Therefore, degradation in a BT stress test (e.g., a negative gate bias temperature (−GBT) stress test in which negative charges are applied to a gate) can be reduced, and changes in the threshold voltage can be reduced. Note that this effect is caused when the electrodes 206 and 213 have the same potential or different potentials.

The BT stress test is one kind of accelerated test and can evaluate, in a short time, a change by long-term use (i.e., a change over time) in characteristics of transistors. In particular, the change in the threshold voltage of the transistor between before and after the BT stress test is an important indicator when examining the reliability of the transistor. If the change in the threshold voltage between before and after the BT stress test is smaller, the transistor has higher reliability.

By providing the electrode 206 and the electrode 213 and setting the potentials of the electrode 206 and the electrode 213 to be the same, the change in threshold voltage is reduced. Accordingly, variation in electrical characteristics among a plurality of transistors is also reduced.

The transistor including the back gate electrode has a smaller change in threshold voltage between before and after a positive GBT stress test in which positive charges are applied to a gate than a transistor including no back gate electrode.

When the back gate electrode is formed using a light-blocking conductive film, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

A transistor 420 shown in FIG. 34B1 as an example is a channel-protective transistor that is a type of bottom-gate transistor. The transistor 420 has substantially the same structure as the transistor 410 but is different from the transistor 410 in that the insulating layer 209 covers the side surfaces of the semiconductor layer 208.

The semiconductor layer 208 is electrically connected to the electrode 214 in an opening which is formed by selectively removing part of the insulating layer 209. The semiconductor layer 208 is electrically connected to the electrode 215 in the opening which is formed by selectively removing part of the insulating layer 209. A region of the insulating layer 209 which overlaps with the channel formation region can function as a channel protective layer.

A transistor 421 illustrated in FIG. 34B2 is different from the transistor 420 in that the electrode 213 that can function as a back gate electrode is provided over the insulating layer 211.

With the insulating layer 209, the semiconductor layer 208 can be prevented from being exposed at the time of forming the electrode 214 and the electrode 215. Thus, the semiconductor layer 208 can be prevented from being reduced in thickness at the time of forming the electrode 214 and the electrode 215.

The length between the electrode 214 and the electrode 206 and the length between the electrode 215 and the electrode 206 in the transistors 420 and 421 are longer than those in the transistors 410 and 411. Thus, the parasitic capacitance generated between the electrode 214 and the electrode 206 can be reduced. Moreover, the parasitic capacitance generated between the electrode 215 and the electrode 206 can be reduced.

[Top-Gate Transistor]

A transistor 430 shown in FIG. 35A1 as an example is a type of top-gate transistor. The transistor 430 includes the semiconductor layer 208 over the insulating layer 119; the electrode 214 in contact with part of the semiconductor layer 208 and the electrode 215 in contact with part of the semiconductor layer 208, over the semiconductor layer 208 and the insulating layer 119; the insulating layer 207 over the semiconductor layer 208, the electrode 214 and the electrode 215; and the electrode 206 over the insulating layer 207. The insulating layer 210 and the insulating layer 211 are formed over the electrode 206.

Since, in the transistor 430, the electrode 206 overlaps with neither the electrode 214 nor the electrode 215, the parasitic capacitance generated between the electrode 206 and the electrode 214 and the parasitic capacitance generated between the electrode 206 and the electrode 215 can be reduced. After the formation of the electrode 206, an impurity element 221 is introduced into the semiconductor layer 208 using the electrode 206 as a mask, so that an impurity region can be formed in the semiconductor layer 208 in a self-aligned manner (see FIG. 35A3).

The introduction of the impurity element 221 can be performed with an ion implantation apparatus, an ion doping apparatus, or a plasma treatment apparatus.

As the impurity element 221, for example, at least one element of a Group 13 element and a Group 15 element can be used. In the case where an oxide semiconductor is used for the semiconductor layer 208, it is possible to use at least one kind of element selected from a rare gas, hydrogen, and nitrogen as the impurity element 221.

A transistor 431 illustrated in FIG. 35A2 is different from the transistor 430 in that the electrode 213 and an insulating layer 217 are included. The transistor 431 includes the electrode 213 formed over the insulating layer 119 and the insulating layer 217 formed over the electrode 213. As described above, the electrode 213 can function as a back gate electrode. Thus, the insulating layer 217 can function as a gate insulating layer. The insulating layer 217 can be formed using a material and a method that are similar to those of the insulating layer 205.

The transistor 431 as well as the transistor 411 has large on-state current for the area occupied thereby. That is, the area occupied by the transistor 431 can be small for required on-state current. According to one embodiment of the present invention, the area occupied by a transistor can be reduced. Therefore, according to one embodiment of the present invention, a semiconductor device having a high degree of integration can be provided.

Transistors 440 and 441 exemplified in FIGS. 35B1 and 35B2 are each a type of top-gate transistor. The transistors 440 and 441 are different from the transistors 430 and 431, respectively, in that the semiconductor layers 208 are formed after the formation of the electrodes 214 and the electrodes 215. Thus, in the transistors 440 and 441, part of the semiconductor layer 208 is formed over the electrode 214 and another part of the semiconductor layer 208 is formed over the electrode 215.

The transistor 441 as well as the transistor 411 has large on-state current for the area occupied thereby. That is, the area occupied by the transistor 441 can be small for required on-state current. Therefore, a semiconductor device having a high degree of integration can be provided.

In the transistors 440 and 441, after the formation of the electrode 206, the impurity element 221 is introduced into the semiconductor layer 208 using the electrode 206 as a mask, so that an impurity region can be formed in the semiconductor layer 208 in a self-aligned manner.

Although the variety of films such as the metal film, the semiconductor film, the inorganic insulating layer which are disclosed in this specification and the like can be formed by a sputtering method or a plasma chemical vapor deposition (CVD) method, such films may be formed by another method, for example, a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated because it does not utilize plasma for forming a film.

Deposition by a thermal CVD method may be performed in such a manner that a source gas and an oxidizer are supplied to a chamber at a time, the pressure in the chamber is set to an atmospheric pressure or a reduced pressure, and they are reacted with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first source gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on a surface of the substrate to form a first thin layer; then the second source gas is introduced to react with the first thin layer; as a result, a second thin layer is stacked over the first thin layer, so that a thin film is formed. The sequence of the gas introduction is controlled and repeated a plurality of times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust the film thickness and thus is suitable for manufacturing a minute FET.

The variety of films such as the metal film, the semiconductor film, and the inorganic insulating layer which are described in the above embodiments can be formed by a thermal CVD method such as a MOCVD method or an ALD method. For example, in the case where an In—Ga—Zn—O film is formed, trimethylindium ($In(CH_3)_3$), trimethylgallium ($Ga(CH_3)_3$), and dimethylzinc ($Zn(CH_3)_2$) are used. Without limitation to the above combination, triethylgallium ($Ga(C_2H_5)_3$) can be used instead of trimethylgallium, and diethylzinc ($Zn(C_2H_5)_2$) can be used instead of dimethylzinc.

For example, in the case where a hafnium oxide film is formed by a deposition apparatus using an ALD method, two kinds of gases, i.e., ozone ($O_3$) as an oxidizer and a source gas which is obtained by vaporizing liquid containing a solvent and a hafnium precursor compound (a hafnium alkoxide or hafnium amide such as tetrakis(dimethylamide) hafnium (TDMAH, $Hf[N(CH_3)_2]_4$)) are used. Examples of another material include tetrakis(ethylmethylamide)hafnium.

For example, in the case where an aluminum oxide film is formed by a deposition apparatus using an ALD method, two kinds of gases, e.g., $H_2O$ as an oxidizer and a source gas which is obtained by vaporizing a solvent and liquid containing an aluminum precursor compound (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, and radicals of an oxidizing gas (e.g., $O_2$ or dinitrogen monoxide) are supplied to react with the adsorbate.

For example, in the case where a tungsten film is formed by a deposition apparatus using an ALD method, a $WF_6$ gas and a $B_2H_6$ gas are sequentially introduced a plurality of times to form an initial tungsten film, and then a $WF_6$ gas and an $H_2$ gas are sequentially introduced a plurality of times to form a tungsten film. Note that an $SiH_4$ gas may be used instead of a $B_2H_6$ gas.

For example, in the case where an oxide semiconductor film, for example, an In—Ga—Zn—O film is formed by a deposition apparatus using an ALD method, an $In(CH_3)_3$ gas and an $O_3$ gas are sequentially introduced a plurality of times to form an In-O layer, a $Ga(CH_3)_3$ gas and an $O_3$ gas are sequentially introduced a plurality of times to form a GaO layer, and then a $Zn(CH_3)_2$ gas and an $O_3$ gas are sequentially introduced a plurality of times to form a ZnO layer. Note that the order of these layers is not limited to this example. A mixed oxide layer such as an In—Ga-0 layer, an In—Zn—O layer, or a Ga—Zn—O layer may be formed by using these gases. Note that although an $H_2O$ gas which is obtained by bubbling water with an inert gas such as Ar may be used instead of an $O_3$ gas, it is preferable to use an $O_3$ gas, which does not contain H. Furthermore, instead of an $In(CH_3)_3$ gas, an $In(C_2H_5)_3$ gas may be used. Instead of a $Ga(CH_3)_3$ gas, a $Ga(C_2H_5)_3$ gas may be used. Alternatively, a $Zn(CH_3)_2$ gas may be used.

This embodiment can be implemented in an appropriate combination with any of the structures described in the other embodiments.

Embodiment 8

In this embodiment, a display module using the display device of one embodiment of the present invention will be described with reference to FIG. 36.

Figure 36:
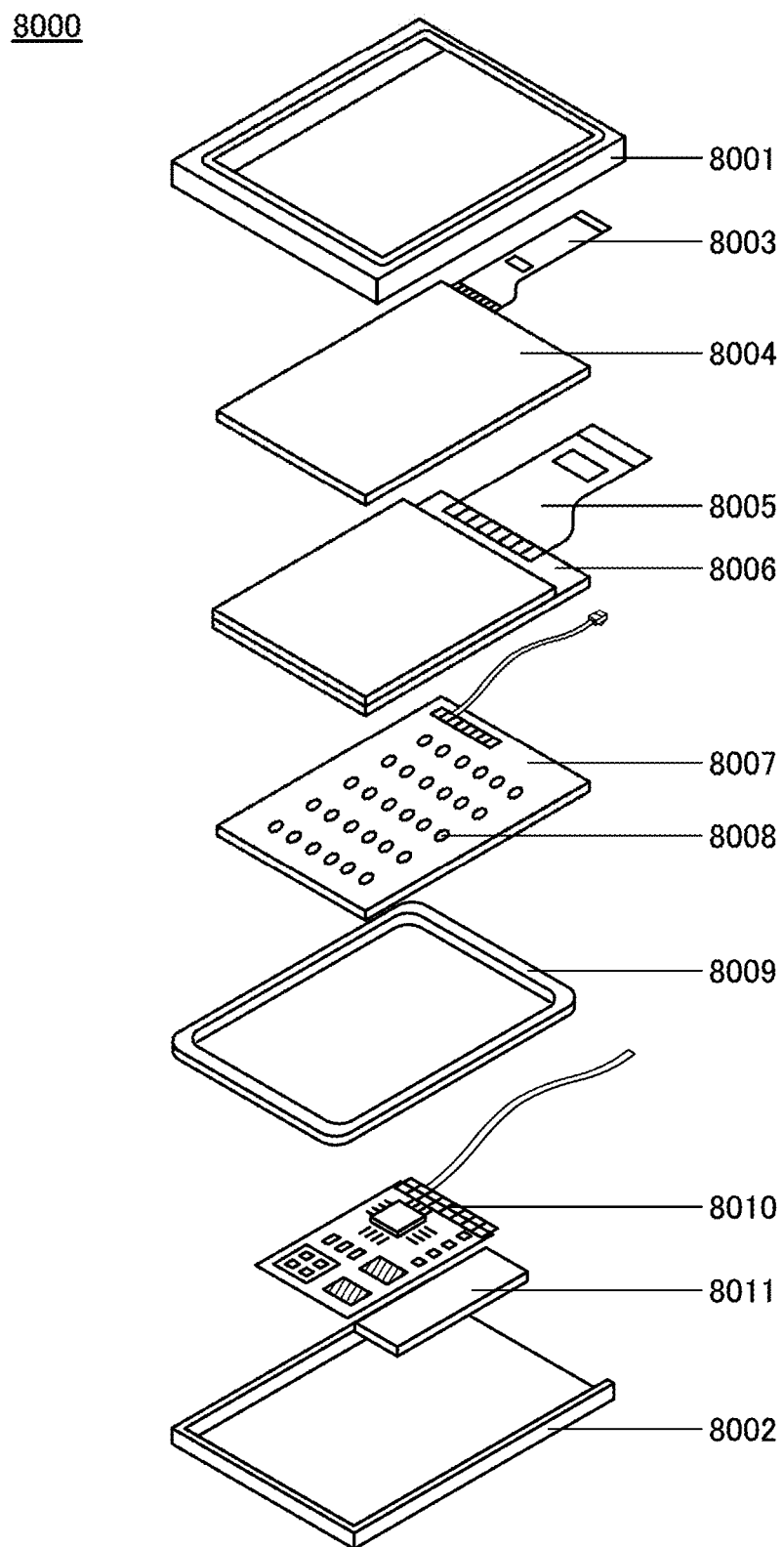
FIG. 36 illustrates a display module.

In a display module 8000 illustrated in FIG. 36, a touch sensor 8004 connected to an FPC 8003, a cell 8006 connected to an FPC 8005, a backlight unit 8007, a frame 8009, a printed board 8010, and a battery 8011 are provided between an upper cover 8001 and a lower cover 8002. At least one of the upper cover 8001, the lower cover 8002, the backlight unit 8007, the frame 8009, the printed board 8010, the battery 8011, the touch sensor 8004, and the like is not provided in some cases.

The display device of one embodiment of the present invention can be used for the cell 8006, for example.

The shapes and sizes of the upper cover 8001 and the lower cover 8002 can be changed as appropriate in accordance with the sizes of the touch sensor 8004 and the cell 8006.

The touch sensor 8004 can be a resistive touch sensor or a capacitive touch sensor and may be formed to overlap with the cell 8006. A counter substrate (sealing substrate) of the cell 8006 can have a touch sensor function. A photosensor may be provided in each pixel of the cell 8006 so that an optical touch sensor is obtained. An electrode for a touch sensor may be provided in each pixel of the cell 8006 so that a capacitive touch sensor is obtained.

The backlight unit 8007 includes a light source 8008. The light source 8008 may be provided at an end portion of the backlight unit 8007 and a light diffusing plate may be used. In the case where a display device including a light-emitting element and the like is used for the cell 8006, the backlight unit 8007 is not necessarily provided.

The frame 8009 may protect the cell 8006 and also function as an electromagnetic shield for blocking electromagnetic waves generated by the operation of the printed board 8010. The frame 8009 may function as a radiator plate.

The printed board 8010 has a power supply circuit and a signal processing circuit for outputting a video signal and a clock signal. As a power source for supplying power to the power supply circuit, an external power source or a power source using the battery 8011 provided separately may be used. The battery 8011 can be omitted in the case of using an external power source.

The display module 8000 can be additionally provided with a member such as a polarizing plate, a retardation plate, or a prism sheet.

This embodiment can be implemented in an appropriate combination with any of the structures described in the other embodiments.

Embodiment 9

In this embodiment, examples of an electronic device and a lighting device including the display device of one embodiment of the present invention will be described with reference to the drawings.

Specific examples of the electronic device that uses the display device of one embodiment of the present invention are as follows: display devices of televisions, monitors, and the like, lighting devices, desktop and laptop personal computers, word processors, image reproduction devices which reproduce still images and moving images stored in recording media such as digital versatile discs (DVDs), portable CD players, radios, tape recorders, headphone stereos, stereos, table clocks, wall clocks, cordless phone handsets, transceivers, mobile phones, car phones, portable game machines, tablet terminals, large game machines such as pachinko machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electrical tools such as a chain saw, smoke detectors, and medical equipment such as dialyzers. Other examples are as follows: industrial equipment such as guide lights, traffic lights, conveyor belts, elevators, escalators, industrial robots, power storage systems, and power storage devices for leveling the amount of power supply and smart grid. In addition, moving objects and the like driven by electric motors using power from a power storage unit are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts.

In particular, as examples of electronic devices including a display device with flexibility, the following can be given: television devices (also referred to as televisions or television receivers), monitors of computers or the like, digital cameras, digital video cameras, digital photo frames, mobile phones (also referred to as cellular phones or mobile phone devices), portable game machines, portable information terminals, audio reproducing devices, large game machines such as pachinko machines, and the like.

In addition, a lighting device or a display device can be incorporated along a curved inside/outside wall surface of a house or a building or a curved interior/exterior surface of a car.

Figure 37A:
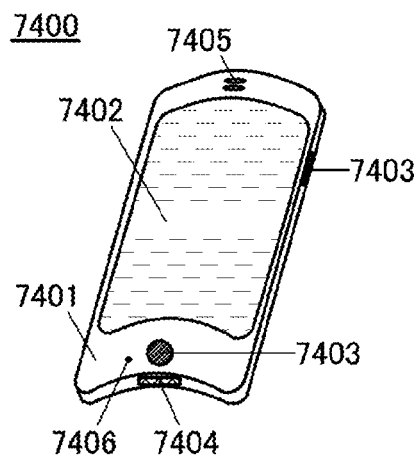
FIGS. 37A to 37E illustrate examples of electronic devices and lighting devices.

FIG. 37A is an example of a mobile phone. A mobile phone 7400 includes a display portion 7402 that is incorporated in a housing 7401. The mobile phone 7400 further includes operation buttons 7403, an external connection port 7404, a speaker 7405, a microphone 7406, and the like. The mobile phone 7400 is manufactured using the display device for the display portion 7402.

When the display portion 7402 is touched with a finger or the like, data can be input into the mobile phone 7400 in FIG. 37A. Furthermore, operations such as making a call and inputting a letter can be performed by touch on the display portion 7402 with a finger or the like.

With the operation buttons 7403, power ON/OFF can be switched. In addition, types of images displayed on the display portion 7402 can be switched; for example, switching images from a mail creation screen to a main menu screen.

Here, the display portion 7402 includes the display device of one embodiment of the present invention. Thus, the mobile phone can have a curved display portion and high reliability.

Figure 37B:
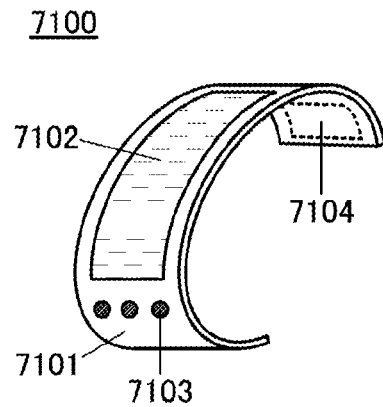

FIG. 37B is an example of a wristband-type display device. A portable display device 7100 includes a housing 7101, a display portion 7102, operation buttons 7103, and a transceiver 7104.

The portable display device 7100 can receive a video signal with the transceiver 7104 and can display the received video on the display portion 7102. In addition, with the transceiver 7104, the portable display device 7100 can send an audio signal to another receiving device.

With the operation button 7103, power ON/OFF, switching displayed videos, adjusting volume, and the like can be performed.

Here, the display portion 7102 includes the display device of one embodiment of the present invention. Thus, the portable display device can have a curved display portion and high reliability.

Figure 37C:
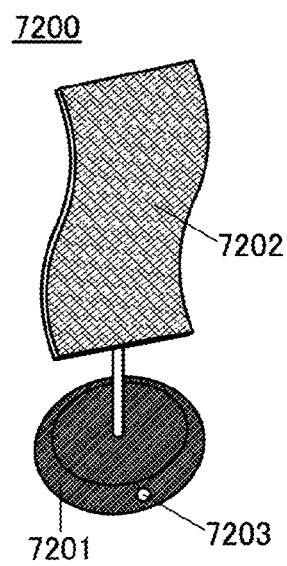
Figure 37D:
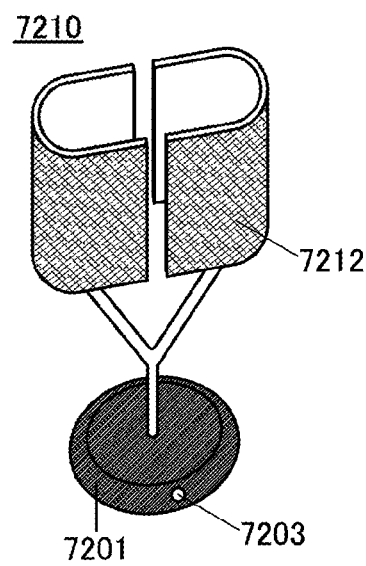
Figure 37E:
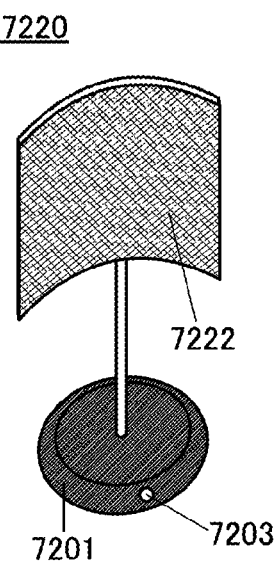

FIGS. 37C to 37E show examples of lighting devices. Lighting devices 7200, 7210, and 7220 each include a stage 7201 provided with an operation switch 7203 and a light-emitting portion supported by the stage 7201.

The lighting device 7200 illustrated in FIG. 37C includes a light-emitting portion 7202 with a wave-shaped light-emitting surface and thus is a good-design lighting device.

A light-emitting portion 7212 included in the lighting device 7210 illustrated in FIG. 37D has two convex-curved light-emitting portions symmetrically placed. Thus, light radiates from the lighting device 7210 in all directions.

The lighting device 7220 illustrated in FIG. 37E includes a concave-curved light-emitting portion 7222. This is suitable for illuminating a specific range because light emitted from the light-emitting portion 7222 is collected to the front of the lighting device 7220.

The light-emitting portion included in each of the lighting devices 7200, 7210, and 7220 is flexible; thus, the light-emitting portion can be fixed on a plastic member, a movable frame, or the like so that an emission surface of the light-emitting portion can be curved freely depending on the intended use.

The light-emitting portions included in the lighting devices 7200, 7210, and 7220 each include the display device of one embodiment of the present invention. Thus, the light-emitting portions can be curved or bent into any shape and the lighting devices can have high reliability.

Figure 38A:
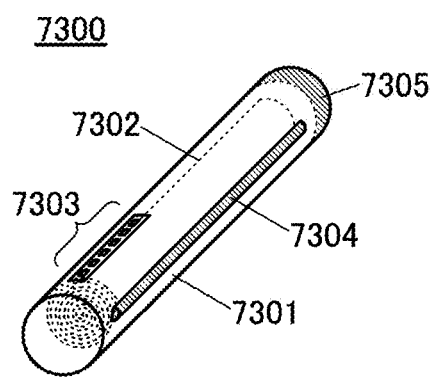
FIGS. 38A and 38B illustrate an example of an electronic device.

FIG. 38A shows an example of a portable display device. A display device 7300 includes a housing 7301, a display portion 7302, operation buttons 7303, a display portion pull 7304, and a control portion 7305.

The display device 7300 includes the rolled flexible display portion 7302 in the cylindrical housing 7301.

The display device 7300 can receive a video signal with the control portion 7305 and can display the received video on the display portion 7302. In addition, a power storage device is included in the control portion 7305. Moreover, a connector may be included in the control portion 7305 so that a video signal or power can be supplied directly.

With the operation buttons 7303, power ON/OFF, switching of displayed videos, and the like can be performed.

Figure 38B:
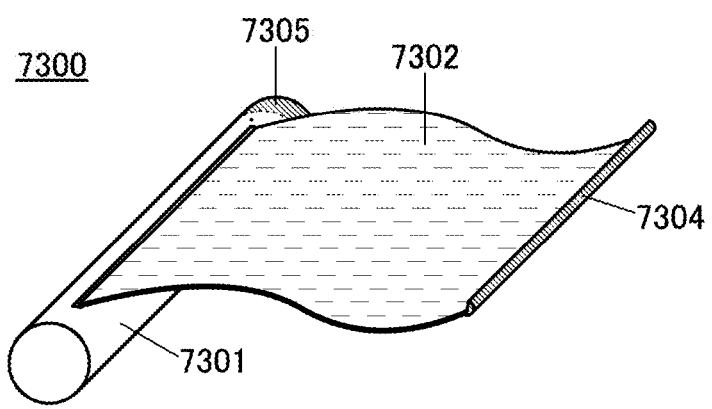

FIG. 38B illustrates a state where the display portion 7302 is pulled out with the display portion pull 7304. Videos can be displayed on the display portion 7302 in this state. Furthermore, the operation buttons 7303 on the surface of the housing 7301 allow one-handed operation.

Note that a reinforcement frame may be provided for an edge portion of the display portion 7302 in order to prevent the display portion 7302 from being curved when pulled out.

Note that in addition to this structure, a speaker may be provided for the housing so that sound is output with an audio signal received together with a video signal.

The display portion 7302 includes the display device of one embodiment of the present invention. Thus, the display portion 7302 is a display device which is flexible and highly reliable, which makes the display device 7300 lightweight and highly reliable.

Figure 39A:
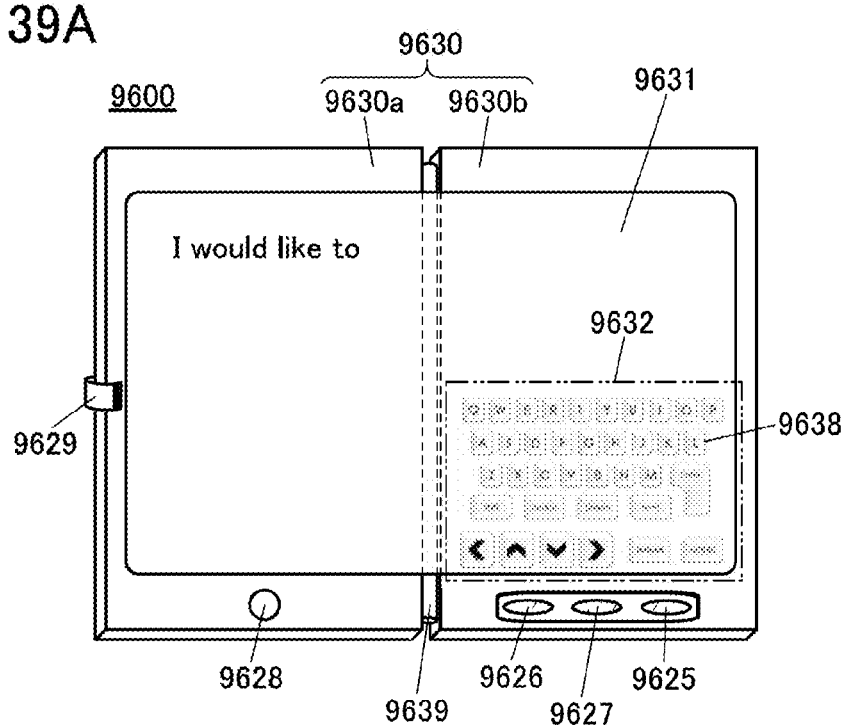
FIGS. 39A to 39C illustrate an example of an electronic device.
Figure 39B:
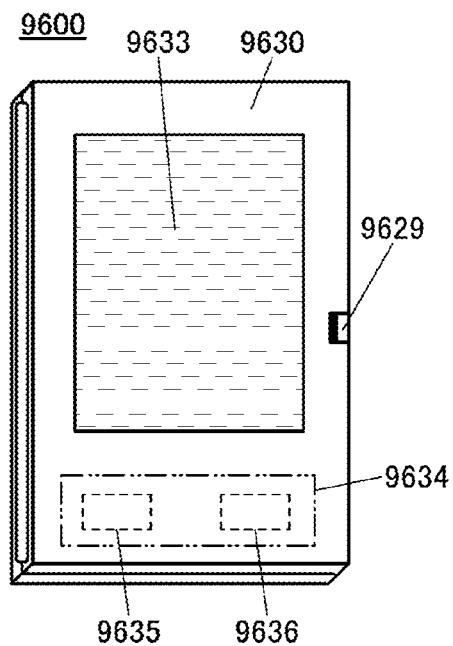

FIGS. 39A and 39B show a double foldable tablet terminal 9600 as an example. FIG. 39A illustrates the tablet terminal 9600 which is unfolded. The tablet terminal 9600 includes a housing 9630, a display portion 9631, a display mode switch 9626, a power switch 9627, a power-saving mode switch 9625, a clasp 9629, and an operation switch 9628.

The housing 9630 includes a housing 9630a and a housing 9630b, which are connected with a hinge portion 9639. The hinge portion 9639 makes the housing 9630 double foldable.

The display portion 9631 is provided on the housing 9630a, the housing 9630b, and the hinge portion 9639. By the use of the display device disclosed in this specification and the like for the display portion 9631, the tablet terminal in which the display portion 9631 is foldable and which has high reliability can be provided.

Part of the display portion 9631 can be a touchscreen region 9632 and data can be input when a displayed operation key 9638 is touched. A structure can be employed in which half of the display portion 9631 has only a display function and the other half has a touchscreen function. The whole display portion 9631 may have a touchscreen function. For example, keyboard buttons may be displayed on the entire region of the display portion 9631 so that the display portion 9631 can be used as a data input terminal.

The display mode switch 9626 can switch the display between a portrait mode and a landscape mode, and between monochrome display and color display, for example. The power-saving mode switch 9625 can control display luminance in accordance with the amount of external light in use of the tablet terminal detected by an optical sensor incorporated in the tablet terminal. Another detection device including a sensor for detecting inclination, such as a gyroscope or an acceleration sensor, may be incorporated in the tablet terminal, in addition to the optical sensor.

FIG. 39B illustrates the tablet terminal 9600 which is folded. The tablet terminal 9600 includes the housing 9630, a solar cell 9633, and a charge and discharge control circuit 9634. As an example, FIG. 39B illustrates the charge and discharge control circuit 9634 including a battery 9635 and a DC-to-DC converter 9636.

By including the display device that is disclosed in this specification and the like, the display portion 9631 is foldable. Since the tablet terminal 9600 is double foldable, the housing 9630 can be closed when the tablet terminal is not in use, for example; thus, the tablet terminal is highly portable. Moreover, since the display portion 9631 can be protected when the housing 9630 is closed, the tablet terminal can have high durability and high reliability for long-term use.

The tablet terminal illustrated in FIGS. 39A and 39B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar cell 9633 provided on a surface of the tablet terminal can supply power to the touch sensor, the display portion, a video signal processing portion, or the like. Note that the solar cell 9633 is preferably provided on one or both surfaces of the housing 9630, in which case the battery 9635 can be charged efficiently. When a lithium ion battery is used as the battery 9635, there is an advantage of downsizing or the like.

Figure 39C:
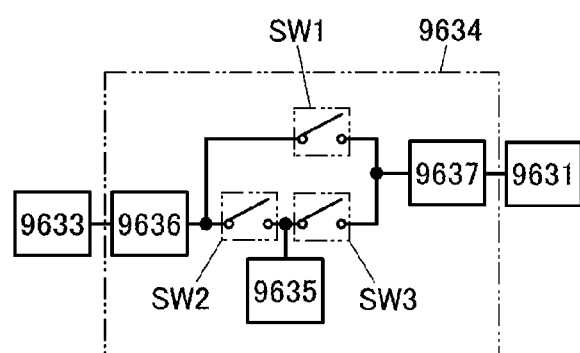

The structure and operation of the charge and discharge control circuit 9634 illustrated in FIG. 39B is described with reference to a block diagram of FIG. 39C. FIG. 39C illustrates the solar cell 9633, the battery 9635, the DC-to-DC converter 9636, a converter 9637, switches SW1 to SW3, and the display portion 9631. The battery 9635, the DC-to-DC converter 9636, the converter 9637, and the switches SW1 to SW3 correspond to the charge and discharge control circuit 9634 illustrated in FIG. 39B.

First, description is made on an example of the operation in the case where power is generated by the solar cell 9633 with the use of external light. The voltage of the power generated by the solar cell is raised or lowered by the DC-to-DC converter 9636 so as to be the voltage for charging the battery 9635. Then, when power from the solar cell 9633 is used for the operation of the display portion 9631, the switch SW1 is turned on and the voltage of the power is raised or lowered by the converter 9637 so as to be voltage needed for the display portion 9631. When images are not displayed on the display portion 9631, the switch SW1 is turned off and the switch SW2 is turned on so that the battery 9635 is charged.

Although the solar cell 9633 is described as an example of a power generation unit, the power generation unit is not particularly limited, and the battery 9635 may be charged by another power generation unit such as a piezoelectric element or a thermoelectric conversion element (Peltier element). For example, the battery 9635 may be charged using a non-contact power transmission module that transmits and receives power wirelessly (without contact) or using another charge unit in combination.

Figure 40A:
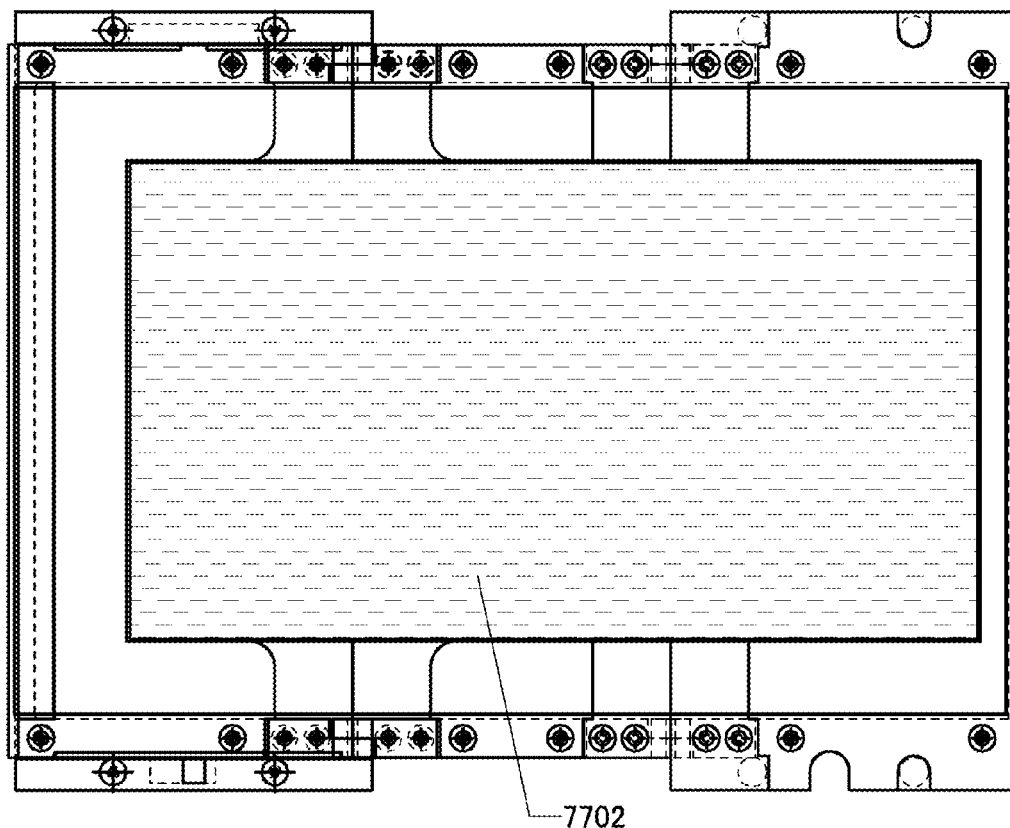
FIGS. 40A to 40C are a plan view and cross-sectional views illustrating an example of an electronic device.
Figure 40B:
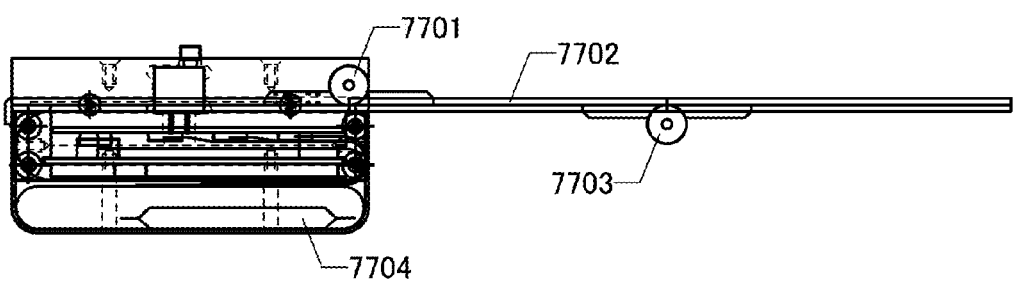
Figure 40C:
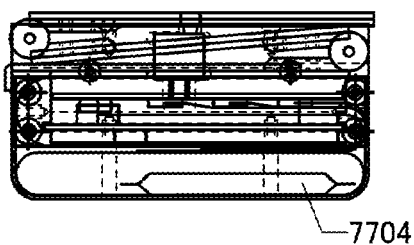
Figure 41A:
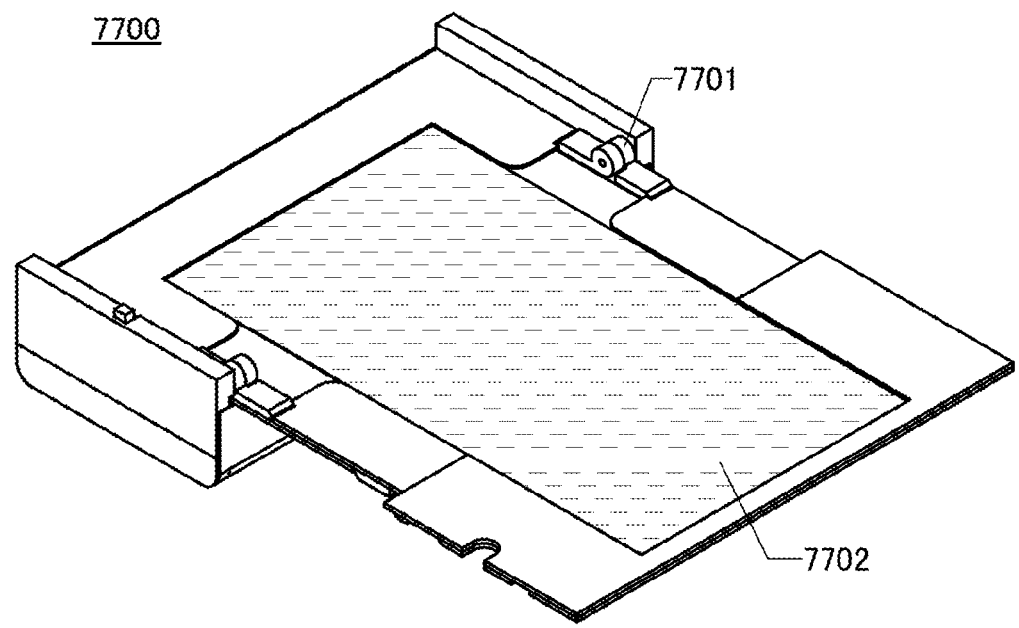
FIGS. 41A and 41B are perspective views illustrating an example of an electronic device.

An electronic device 7700 illustrated in FIGS. 40A to 40C and FIGS. 41A and 41B has the display portion 7702 including the foldable display device disclosed in the above embodiments. FIG. 40A is a plan view showing a state where the display portion 7702 is unfolded. A cross-sectional view of the electronic device 7700 is illustrated in FIG. 40B. A power storage device 7704 is provided inside the electronic device 7700. FIG. 41A corresponds to an external perspective view showing a state where the display portion 7702 is unfolded.

Furthermore, hinges 7701 and 7703 that allow the display portion 7702 to be folded are provided. The display portion 7702 is an active matrix display device including an organic EL element over a plastic substrate and is a flexible display panel. For example, a transistor having an oxide semiconductor layer is included, the transistor and the organic EL element are electrically connected to each other, and the transistor and the organic EL element are placed between two plastic substrates. The electronic device illustrated in FIGS. 40A to 40C and FIGS. 41A and 41B is an example of the electronic device 7700 which can be reduced in size by folding at portions where the hinges 7701 and 7703 are provided.

Figure 41B:
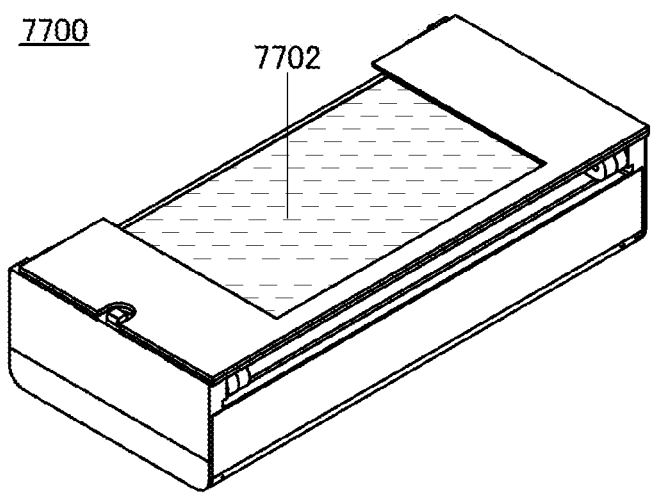

FIG. 40C is a cross-sectional view of the electronic device in a folded state. FIG. 41B corresponds to an external perspective view of the electronic device in the state. The example of folding two places using the two hinges 7701 and 7703 is given; however, folding of the electronic device is not limited thereto. An electronic device which can be folded at three or more places may be obtained by increasing the size of the display portion 7702 and the number of hinges. Alternatively, an electronic device which can be folded at one place using one hinge may be obtained.

By selecting a material (a silicone rubber or a plastic material) of the housing of the electronic device 7700 so that a flexible housing is obtained and using a foldable power storage device as the power storage device 7704 provided inside the housing, the electronic device 7700 can be folded wholly or partly. According to one embodiment of the present invention, an electronic device with high portability can be provided.

It is needless to say that one embodiment of the present invention is not limited to the above-described electronic devices and lighting devices as long as the display device of one embodiment of the present invention is included.

This embodiment can be implemented in an appropriate combination with any of the structures described in the other embodiments.

Embodiment 10

In this embodiment, a separation apparatus for manufacturing a display device of one embodiment of the present invention is described with reference to FIG. 42.

In mass production of flexible devices, functional elements and circuits are formed using a large support substrate and they are automatically separated from the support substrate, so that a reduction in working hours or an improvement in manufacturing yields of products can be achieved. Furthermore, a reduction in manufacturing costs of the products can be achieved.

When a separation base layer including functional elements and circuits is separated from a support substrate, a carrier tape attached to the separation base layer before the separation in advance is pulled. The carrier tape is not needed after separation and thus is removed.

When force is applied to the carrier tape because of the pulling and removal of the carrier tape, defective separation or a crack in the functional elements and circuits might be caused depending on the speed of the carrier tape or the direction in which the carrier tape is sent.

A process in which the carrier tape is attached and a process in which the carrier tape is removed are automated utilizing a separation apparatus in which the force applied to the carrier tape, the speed of the carrier tape, and the direction in which the carrier tape is sent are adjusted. In this embodiment, an example of a separation apparatus capable of automization of these processes is described.

A separation apparatus described in this embodiment can divide a process member into a first member and a second member. The separation apparatus includes a structure body having a convex surface, a support body supply unit, a support body hold unit, and a cleaning unit. The structure body is positioned between the support body supply unit and the support body hold unit. The cleaning unit is positioned between the structure body and the support body hold unit. The support body supply unit can send out a sheet-shaped support body. The support body supply unit includes one of a pair of tension applying mechanisms. The support body hold unit includes the other of the pair of tension applying mechanisms. The pair of tension applying mechanisms can apply tension to a structure body. The structure body changes the delivery direction of a support body along the convex surface, whereby a process member can be divided into the first member and the second member.

In this embodiment, an example in which a first member 71 and a second member 72 are separated from each other by separating the first member 71 from a process member 70 is described. Note that the first member 71 and the second member 72 may be separated from each other by separating the second member 72 from the process member 70.

The process member 70 has a sheet-like shape and includes the first member 71 and the second member 72 each having a sheet-like shape. The first member 71 and the second member 72 may each have a single-layer structure or a stacked-layer structure. In the process member 70, a separation trigger is preferably formed. With this trigger, the separation is easily performed at the interface between the first member 71 and the second member 72. The first member 71 includes at least one of a circuit, a functional element, and a functional layer, for example. For example, the first member 71 can include at least one of a pixel circuit, a pixel driver circuit, a display element, a color filter, and a moisture-proof film of a display device.

Figure 42:
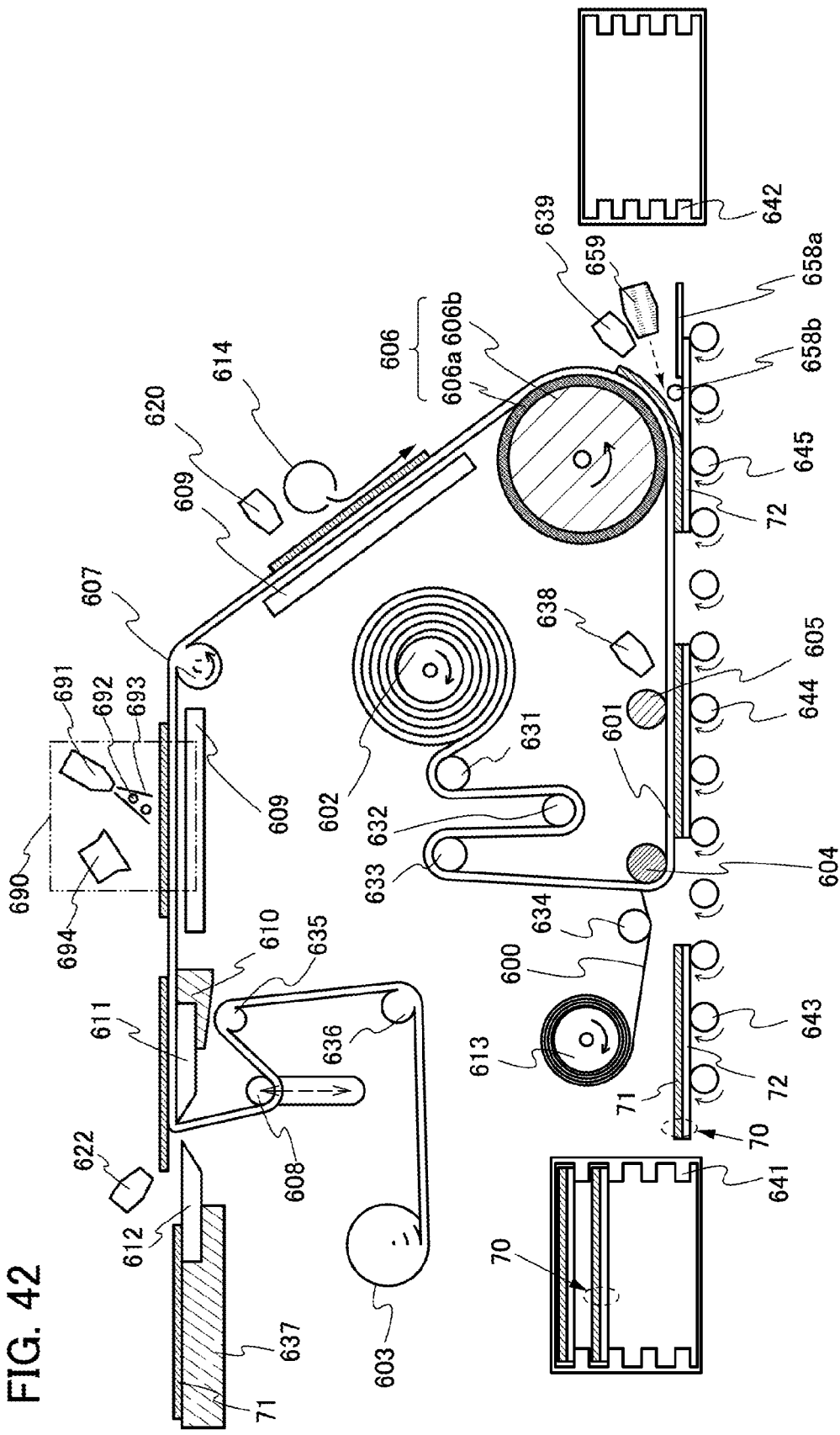
FIG. 42 illustrates an example of a separation apparatus.

The separation apparatus in FIG. 42 includes a plurality of transfer rollers (e.g., transfer rollers 643, 644, and 645), a tape reel 602, a first wind-up reel 603, a first press roller 606, and a cleaning unit 690.

The tape reel 602 is an example of the support body supply unit. The tape reel 602 can unwind a support body 601 in a rolled sheet form. The speed at which the support body 601 is unwound is preferably adjustable. When the speed is set relatively low, for example, separation failure of the process member or a crack in a separated member can be inhibited.

The support body supply unit can send out the support body 601 intermittently or continuously. It is preferable to continuously send out the support body 601 in the case where sending out of the support body 601 does not need to be stopped during the process. By continuously sending out the support body 601, separation can be performed at a uniform speed with a uniform force. Note that in a separation step, the separation is preferably performed successively without a stop, and is further preferably performed at a constant speed. When the separation is stopped in the middle and then started from the stopped region, distortion or the like occurs in that region, which does not occur in the case where the separation is successively performed. Thus, a minute structure of the region and the characteristics of an electronic device in the region are changed, which might influence display of a display device, for example.

As the support body 601, a film in a sheet form made of an organic resin, a metal, an alloy, glass, or the like can be used.

The support body 601 may be a carrier tape or the like, which is a member that is not a constituent of the device to be manufactured (e.g., flexible device). Alternatively, the support body 601 may be a flexible substrate or the like, which is a member that is a constituent of the device to be manufactured, like the first member 71.

The first wind-up reel 603 is an example of the support body hold unit. The first wind-up reel 603 can wind up the support body 601. The support body hold unit can wind up the support body 601, can wind up the support body 601 and the first member 71, or can hold an end portion of the support body 601, for example.

The tape reel 602 includes one of a pair of tension applying mechanisms. The first wind-up reel 603 includes the other of the pair of tension applying mechanisms. The pair of tension applying mechanisms can apply tension to the support body 601.

The plurality of transfer rollers are an example of the transfer mechanism. The plurality of transfer rollers can transfer the process member 70. The mechanism that transfers the process member 70 is not limited to a transfer roller and may be a different transfer mechanism such as a conveyor belt or a transfer robot. Furthermore, the process member 70 may be placed over a stage over the transfer mechanism.

The transfer roller 643, the transfer roller 644, and the transfer roller 645, each of which is one of the arranged transfer rollers, are provided at predetermined intervals and rotate in the direction in which the process member 70 (or the second member 72) is sent (the clockwise direction as indicated by solid arrows). The plurality of arranged transfer rollers are each rotated by a driving portion (e.g., a motor) which is not illustrated.

The first press roller 606 is an example of the structure body having a convex surface. The first press roller 606 is rotated by a driving portion (e.g., a motor) which is not illustrated.

When the first press roller 606 rotates, the force of separating the first member 71 is applied to the process member 70; thus, the first member 71 is separated. At this time, the process member 70 preferably has a separation trigger. Separation of the first member 71 starts from the separation trigger. As a result, the process member 70 is divided into the first member 71 and the second member 72.

The mechanism that separates the first member 71 from the process member 70 is not limited to the first press roller 606, and it is acceptable as long as the mechanism is a structure body having a convex surface (or a convex curved surface). For example, the mechanism is a cylindrical (e.g., circular cylindrical, right circular cylindrical, elliptic cylindrical, or parabolic cylindrical) or spherical structure body. The mechanism can be a roller such as a drum type roller, for example. Examples of the shape of the structure body include a column with a bottom surface whose perimeter consists of a curved line (e.g., a cylinder with a perfect circle-shaped bottom surface and an elliptic cylinder with an ellipse-shaped bottom surface), and a column with a bottom surface whose perimeter consists of a curved line and a straight line (e.g., a column with a semicircular bottom surface or a semi-elliptical bottom surface). If the shape of the structure body is any of such columns, the convex surface corresponds to a curved surface of the column.

As a material of the structure body having the convex surface, a metal, an alloy, an organic resin, rubber, or the like can be used. The structure body having the convex surface may have a space or a hollow inside. Examples of the rubber include natural rubber, urethane rubber, nitrile rubber, and neoprene rubber. When rubber is used, it is preferable that a material that is unlikely to be charged by friction or separation be used or that countermeasures to prevent static electricity be taken. For example, the first press roller 606 illustrated in FIG. 42 includes a hollow cylinder 606*a* formed of rubber or an organic resin and a circular cylinder 606*b* formed of a metal or an alloy and positioned inside the cylinder 606*a*.

The radius of curvature of the convex surface of the structure body having the convex surface can be, for example, greater than or equal to 0.5 mm and less than or equal to 3000 mm. In the case where a film is separated, for example, the radius of curvature of the convex surface can be greater than or equal to 0.5 mm and less than or equal to 1000 mm, and specifically can be 150 mm, 225 mm, or 300 mm. As an example of the structure body having such a convex surface, a roller with a diameter of 300 mm, 450 mm, or 600 mm can be given. Note that a preferred radius of curvature of the convex surface depends on the thickness or the size of a process member.

When the radius of curvature of the convex surface is too small, an element included in the first member 71 which is separated along the convex surface might be broken. For this reason, the radius of curvature of the convex surface is preferably greater than or equal to 0.5 mm.

When the radius of curvature of the convex surface is large, a substrate of glass, sapphire, quartz, silicon, or the like, which has low flexibility and high stiffness, can be separated along the convex surface. For this reason, the radius of curvature of the convex surface is preferably greater than or equal to 300 mm, for example.

However, when the radius of curvature of the convex surface is large, the size of the separation apparatus might be increased, which might limit the installation location. For this reason, the radius of curvature of the convex surface is preferably less than or equal to 3000 mm, further preferably less than or equal to 1000 mm, still further preferably less than or equal to 500 mm, for example.

A larger radius of curvature of the convex surface is preferable because the angle at which the first press roller 606 bends the support body 601 can be more easily made large. For this reason, the radius of curvature of the convex surface is preferably greater than or equal to 300 mm, for example.

The rotation speed of the first press roller 606 is preferably adjustable. By adjusting the rotation speed of the first press roller 606, the yield of separation can be further increased.

The first press roller 606 and the plurality of transfer rollers may be movable in at least one direction (e.g., the vertical direction, the horizontal direction, and the depth direction). The distance between the convex surface of the first press roller 606 and a supporting surface of the transfer roller is preferably adjustable because separation can be performed on process members with various thicknesses.

In the example illustrated in FIG. 42, the first press roller 606 bends the support body 601 at an acute angle; however, one embodiment of the present invention is not limited to this example.

The first member 71 that is separated from the second member 72 is warped or distorted in some cases. It is hard for a robot to transfer or deliver the warped or distorted first member 71. However, in one embodiment of the present invention, the first member 71 can be easily transferred because the first member 71 is attached to the support body 601.

The cleaning unit 690 has a function of cleaning a surface of the first member 71. The cleaning unit 690 includes a nozzle 691 and an exhaust mechanism 694. Particles 692 having a high sublimation property and dry air 693 are emitted from the nozzle 691 to a surface of the first member 71, so that a foreign substance, an organic film that should be removed, or the like over the first member 71 can be removed. The objects removed from over the first member 71 are collected by the exhaust mechanism 694 together with the sublimated particles 692 and the dry air 693.

Note that an ionizer may be provided inside the cleaning unit 690. Furthermore, the temperature inside the cleaning unit 690 may be adjusted so that the particles 692 can be sublimated after colliding with the first member 71. Specifically, a temperature adjusting mechanism such as a heater may be provided in the cleaning unit 690. Moreover, the temperature of the dry air 693 may be adjusted.

For example, the first member 71 and the second member 72 can be the first member 171 and the second member 172 described in Embodiment 3, respectively. The second member 172 is separated from the display device 100 by the first press roller 606, so that the separation layer 110*a* is exposed on a surface of the first member 171. Then, the separation layer 110*a* can be removed by the cleaning unit 690.

The separation apparatus illustrated in FIG. 42 further includes a direction changing roller 604, a second press roller 605, a roller 607, a flat plate 658*a*, a roller 658*b*, and a liquid feeding mechanism 659.

The delivery direction of the support body 601 can be changed by the direction changing roller 604.

The second press roller 605 can bond the process member 70 that is transferred by the transfer roller 644 and the support body 601 that is sent out by the tape reel 602 to each other while applying pressure to them. For example, with the use of the transfer roller 644 and the second press roller 605, a bonding surface (or an adhesive surface) of the support body 601 that has been exposed by separating the separation tape 600 can be pressed against the process member 70. With the use of the transfer roller 644 and the second press roller 605, a uniform force can be applied to the support body 601 and the process member 70 while the process member 70 is transferred. As a result, the support body 601 and the process member 70 can be bonded to each other. Moreover, inclusion of bubbles between the support body 601 and the process member 70 can be inhibited.

The pressure application mechanism that applies pressure to the process member 70 and the support body 601 is not limited to a roller and may be, for example, a flat plate or the like. Examples of a material for the roller include a metal, an alloy such as stainless steel, a resin, and rubber. Examples of the flat plate include a metal plate, a resin plate of an acrylic resin, plastic, or the like, and a glass plate. The pressure application mechanism may be formed using an elastic material such as rubber, a spring, or a resin.

Furthermore, the roller 607 can bend the support body 601 and change the delivery direction of the support body 601. For example, the delivery direction of the support body 601 may be changed to the horizontal direction.

The flat plate 658a and the roller 658b are each an example of a fixing mechanism that can fix the second member 72 exposed by the separation of the first member 71. Thus, the flat plate 658a and the roller 658b can prevent the second member 72 from leaving the supporting surface (the plurality of transfer rollers 645). When the second member 72 leaves the supporting surface, the separation position changes and separation does not proceed normally in some cases. The second member 72 is preferably held down because the second member 72 can be transferred in the state of being in contact with the supporting surface.

Examples of the flat plate 658a include a metal plate, an organic resin plate of acrylic, plastic, or the like, and a glass plate. Alternatively, an elastic flat plate using rubber, a spring, a resin, or the like may be used.

As the r roller 658b, a nip roller or the like can be used.

Note that the fixing mechanism of the second member 72 is not limited to the above examples, and a chuck such as a suction chuck, an electrostatic chuck, a mechanical chuck, or a porous chuck, or a table such as a suction table, a heater table, or a spinner table can also be used.

The liquid feeding mechanism 659 can supply liquid to a separation surface between the first member 71 and the second member 72.

The presence of the liquid in the portion where the separation proceeds can decrease the force required for the separation.

Moreover, electrostatic discharge damage to an electronic device or the like can be prevented. Specifically, an adverse effect of static electricity caused at the time of separation (e.g., damage to a semiconductor element from static electricity) on a functional element or the like included in the first member 71 can be suppressed. Note that liquid can be sprayed in the form of mist or vapor. As the liquid, pure water is preferably used. It is also possible to use an organic solvent or the like. For example, a neutral solution, an alkaline solution, an acid solution, a solution into which salt is melted, or the like may be used.

When the separation apparatus of one embodiment of the present invention includes the structure body having a convex surface, liquid does not need to be injected through a slight aperture in the process member 70. During the process using the separation apparatus, specifically, at the start of separation of the first member 71 and the second member 72, a portion to which liquid is to be injected appears, and thus, liquid can be supplied to the desired portion easily without fail.

Note that one embodiment of the present invention is not limited to the above, and the process member 70 may be transferred into the separation apparatus of one embodiment of the present invention after liquid is injected to the interface between the first member 71 and the second member 72. Alternatively, the separation apparatus of one embodiment of the present invention may include a liquid feeding mechanism that inject liquid to the interface between the first member 71 and the second member 72 so that the support body 601 can be bonded to the first member 71 after liquid is injected to the interface and then separation between the first member 71 and the second member 72 can be performed. In the separation process, liquid that has been stored in a groove reaches the interface between the first member 71 and the second member 72 by capillary action at the same time when the support body 601 moves, so that an area to be separated expands. The liquid that has been stored in the groove also has a function of inhibiting static electricity in a portion from which separation starts.

The separation apparatus of one embodiment of the present invention may further include the following components.

The separation apparatus in FIG. 42 includes guide rollers (e.g., guide rollers 631, 632, and 633), a second wind-up reel 613, a drying mechanism 614, and ionizers (e.g., ionizers 638, 639, 620, and 622).

The separation apparatus may include a guide roller that guides the support body 601 to the first wind-up reel 603. One guide roller may be used, or a plurality of guide rollers may be used.

A separation tape 600 (also called separate film) may be bonded to at least one surface of the support body 601. In this case, the separation apparatus preferably includes a reel that can wind up the separation tape 600 bonded to one surface of the support body 601. The reel is positioned between the support body supply unit and the support body hold unit. In the example of this embodiment, the second wind-up reel 613 is positioned between the tape reel 602 and the second press roller 605. Furthermore, the separation apparatus may include a guide roller 634. The guide roller 634 can guide the separation tape 600 to the second wind-up reel 613.

The separation apparatus may include the drying mechanism 614. Since a functional element or a circuit included in the first member 71 is vulnerable to static electricity as described above, it is preferable that liquid be supplied to the interface between the first member 71 and the second member 72 before the first member 71 is separated or that the separation be performed while liquid is supplied to the interface. Since a watermark might be formed if the liquid adhered to the first member 71 is vaporized, the liquid is preferably removed immediately after the separation. Thus, immediately after the separation from the second member 72, the first member 71 including a functional element is preferably blow-dried to remove a droplet left on the first member 71. Therefore, watermark generation can be suppressed. A carrier plate 609 may be provided to prevent slack in the support body 601.

As illustrated in FIG. 42, it is preferable to drop a droplet by letting air flow in the downward direction along the inclination of the support body 601 while the support body 601 is transferred obliquely to the horizontal plane.

Although the transfer direction of the support body 601 may be perpendicular to the horizontal plane, the transfer direction is preferably oblique to the horizontal plane for higher stability and less shaking of the support body 601 during the transfer.

In the process, at a position where static electricity might be generated, a static eliminator included in the separation apparatus is preferably used. There is no particular limitation on the static eliminator, and for example, a corona discharge ionizer, a soft X-ray ionizer, an ultraviolet ionizer, or the like can be used.

For example, it is preferable that the separation apparatus be provided with an ionizer and static elimination be performed by spraying the first member 71 with air, a nitrogen gas, or the like from the ionizer to reduce adverse effects of static electricity on a functional element or a circuit. It is preferable to use the ionizer particularly in a step of bonding two members to each other or a step of dividing one member.

For example, the process member 70 is preferably divided into the first member 71 and the second member 72 while the vicinity of the interface between the first member 71 and the second member 72 is irradiated with ions using the ionizer 639 to remove static electricity.

Pressure may be applied while static electricity is removed by irradiation of the vicinity of the interface between the support body 601 and the second press roller 605 with ions using the ionizer 638, for example.

The separation apparatus may include a substrate load cassette 641 and a substrate unload cassette 642. For example, the process member 70 can be supplied to the substrate load cassette 641. The substrate load cassette 641 can supply the process member 70 to the transfer mechanism or the like. Furthermore, the second member 72 can be supplied to the substrate unload cassette 642.

The process member 70 may be transferred from the substrate load cassette 641 onto the guide roller with the transfer mechanism of the separation apparatus. The second member 72 over the guide roller may be transferred to the substrate unload cassette 642 with the transfer mechanism. In the case where the separation apparatus is connected to a different apparatus, the process member 70 may be transferred from the different apparatus onto the guide roller with the transfer mechanism. In other words, the separation apparatus does not necessarily include the substrate load cassette 641. The second member 72 over the guide roller may be transferred to a different apparatus with the transfer mechanism. In other words, the separation apparatus does not necessarily include the substrate unload cassette 642.

In the separation apparatus of one embodiment of the present invention, the transfer rollers such as the transfer rollers 643, 644, and 645, the first press roller 606, and the like are driving rollers rotated by an electric motor or the like. The rotation speed of the tape reel 602 and the first wind-up reel 603 is also adjusted with a motor. These driving rollers, the tape reel 602, and the first wind-up reel 603 adjust the moving speed and tension of the support body 601. A plurality of guide rollers 631, 632, 633, 634, 635, and 636, the direction changing roller 604, a tension roller 608, and the like are driven rollers. Note that in one embodiment of the present invention, whether each roller is a driving roller or a driven roller can be determined as appropriate without being limited to the above-described example. Furthermore, the second press roller 605 may be a driving roller or a driven roller. The number of rollers of each kind included in the separation apparatus of one embodiment of the present invention is not particularly limited.

As described above, in the separation apparatus of one embodiment of the present invention, the support body that is attached to the process member is pulled to separate the first member from the second member. The process member can be automatically divided with the use of the support body, which shortens processing time and improves the manufacturing yield of products.

For example, the process member has a structure in which a formation substrate and a functional layer are stacked in this order. The first member corresponds to the functional layer and the second member corresponds to the formation substrate. Here, the support body may be used as a support body of the functional layer. In other words, the support body is not necessarily separated from the first member. When a flexible substrate and the functional layer that is exposed by being separated from the formation substrate are bonded to each other with the use of an adhesive, a flexible device in which the support body, the functional layer, and the flexible substrate are stacked in this order can be manufactured.

Alternatively, the process member has a structure in which a formation substrate, a functional layer, and a flexible substrate are stacked in this order, for example. The functional layer and the flexible substrate correspond to the first member and the formation substrate corresponds to the second member. Since the support body attached to the flexible substrate is unnecessary after separation, the support body is separated from the first member. When another flexible substrate and the functional layer that is exposed by being separated from the formation substrate are bonded to each other with the use of an adhesive, a flexible device in which the flexible substrate, the functional layer, and the flexible substrate are stacked in this order can be manufactured.

Here, when force is applied to the support body for separation of the support body, separation failure or a crack in the first member might occur depending on the delivery speed, delivery direction, or the like of the support body.

By including the components described below, the separation apparatus of one embodiment of the present invention can automatically separate the support body and the first member from each other and can have shorter processing time and a higher manufacturing yield of products.

The separation apparatus in FIG. 42 includes a carrier plate 610, a first wedge-shaped member 611, a second wedge-shaped member 612, a table 637, and the guide rollers 635 and 636.

The guide rollers 635 and 636 guide the support body 601 to the first wind-up reel 603.

The tension roller 608 is positioned between a roller 617 and the first wind-up reel 603. The tension roller 608 can apply tension in the direction in which the support body 601 is bent.

As a roller that guides the support body 601 to the first wind-up reel 603, at least one of the guide rollers 635 and 636 and the tension roller 608 is preferably provided.

The first wedge-shaped member 611 is preferably provided in a position where the support body 601 is bent with the guide roller 635 or 636 or the tension roller 608. The first wedge-shaped member 611 may be fixed to the carrier plate 610. The first wedge-shaped member 611 has a tapered portion. The bending direction of the support body 601 is determined by the angle between a flat surface of the carrier plate 610 and the tapered portion of the first wedge-shaped member 611.

The angle of the direction in which the support body 601 is bent is preferably, but not limited to, an acute angle to facilitate separation of the first member 71 from the support body 601.

The second wedge-shaped member 612 is fixed to the table 637. The first wind-up reel 603 can wind up the support body 601 that has passed between the first wedge-shaped member 611 and the second wedge-shaped member 612.

The table 637 has a flat surface. The first member 71 separated from the support body 601 is placed on the flat surface.

The flat surface of the carrier plate 610 is preferably positioned higher than the flat surface of the table 637. In other words, the flat surface of the carrier plate 610 and that of the table 637 are not on the same plane and are located at different levels in cross section. As long as the flat surfaces are located at different levels, the first wedge-shaped member 611 and the second wedge-shaped member 612 may or may not overlap with each other when seen from above. In the case where the first wedge-shaped member 611 and the second wedge-shaped member 612 overlap with each other, a tip of the second wedge-shaped member 612 is positioned below the first wedge-shaped member 611.

In the above-described manner, with the use of the separation apparatus of one embodiment of the present invention, the process member can be divided into the first member and the second member with a high yield. The separation apparatus of one embodiment of the present invention does not require a complicated structure and can be used for separation of process members with a variety of sizes.

Separation can be performed by a worker manually but in that case, experience is required for a high speed and a high yield of separation. Thus, automation using the separation apparatus of one embodiment of the present invention is important. When separation of a process member is automated with the separation apparatus of one embodiment of the present invention, transfer and separation of the process member at a constant speed and separation with uniform force can be performed, which can inhibit separation failure and crack caused in a separated member.

The structure described in this embodiment can be implemented in appropriate combination with any of the structures described in the other embodiments.

Example

In this example, an example in which a method for manufacturing a display device of one embodiment of the present invention is used is described.

Figure 43A:
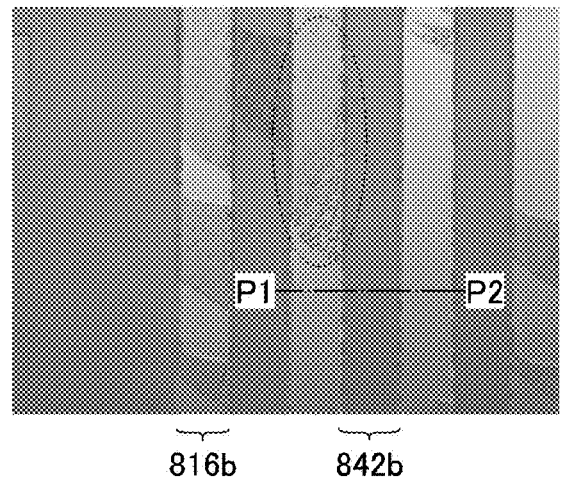
FIGS. 43A to 43C are optical micrographs and a schematic cross-sectional view of a process member according to Example.

FIG. 43A shows an optical micrograph of part of a terminal region 841 of a process member. In the terminal region 841, a plurality of electrodes 816*b* are provided at regular intervals, and an insulating layer 842*b* is provided between two adjacent electrodes 816*b*. A separation layer 810*a* remains over the electrodes 816*b* and the insulating layer 842*b*. That is, the uppermost surface of the terminal region 841 is the separation layer 810*a* in the entire region in the photograph of FIG. 43A. The region with a rough surface (the region surrounded by a broken line in the drawing) is a region in which part of the separation layer 810*a* has been removed at the same time as some layers provided over the separation layer 810*a*.

Figure 43B:
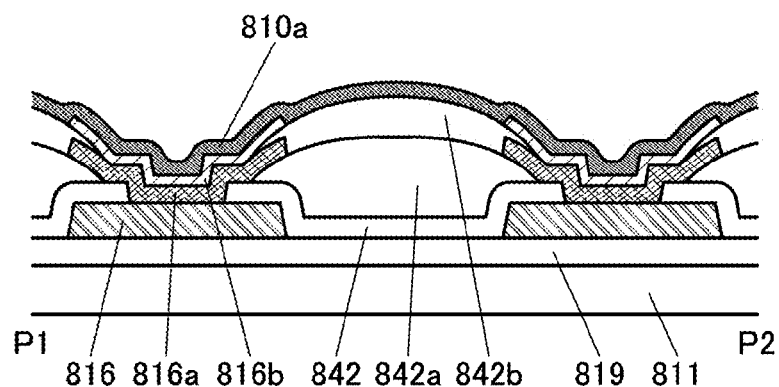

FIG. 43B is a schematic cross-sectional view taken along the dashed-dotted line P1-P2 in FIG. 43A. An electrode 816 is provided over an insulating layer 819 over a substrate 811. Note that the insulating layer 819 has a stacked-layer structure including a plurality of insulating layers.

As the electrode 816, a stacked-layer film including tungsten with a thickness of approximately 50 nm, aluminum with a thickness of approximately 400 nm, and titanium with a thickness of approximately 100 nm was used. As an electrode 816*a*, a stacked-layer film including titanium with a thickness of approximately 100 nm, aluminum with a thickness of approximately 400 nm, and titanium with a thickness of approximately 100 nm was used. As the electrodes 816*b*, a stacked-layer film including APC (Ag—Pd—Cu, an alloy of silver, palladium, and copper) with a thickness of approximately 100 nm and a compound of silicon oxide and indium tin oxide with a thickness of approximately 10 nm was used. As an insulating layer 842, a stacked-layer film including silicon oxynitride with a thickness of approximately 430 nm and silicon nitride with a thickness of approximately 100 nm was used. As an insulating layer 842*a*, polyimide with a thickness of approximately 2.0 µm was used. As the insulating layer 842*b*, polyimide with a thickness of approximately 1.0 µm was used. The separation layer 810*a* is a layer of an organic material including a light-emitting organic compound having a thickness of up to approximately 800 nm.

Figure 43C:
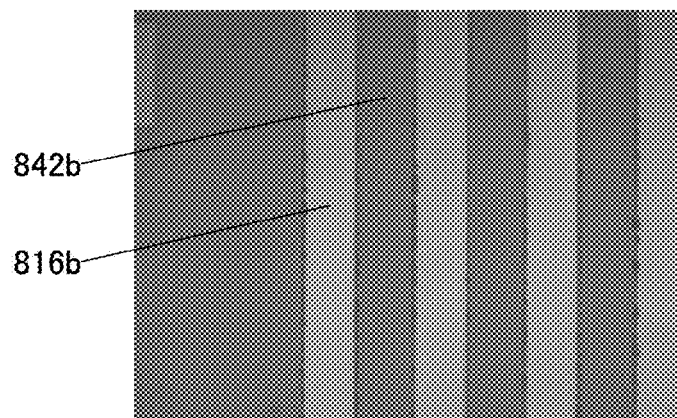

Particles of a solid form of carbon dioxide and a propulsive gas for accelerating the particles were emitted to the terminal region 841 illustrated in FIG. 43A. The result is shown in FIG. 43C. As shown in FIG. 43C, the separation layer 810*a* remaining over the electrode 816*a* was able to be removed with little damage to the electrode 816*a*.

This application is based on Japanese Patent Application serial no. 2015-108191 filed with Japan Patent Office on May 28, 2015, the entire contents of which are hereby incorporated by reference.

What is claimed is:

1. A method for manufacturing a display device, comprising:
    a first step of preparing a process member comprising:
        providing a terminal electrode, a wiring, and a functional layer over a first substrate, wherein the terminal electrode, the wiring, and the functional layer are electrically connected to one another;
        providing an insulating layer over the terminal electrode;
        providing a first layer over the terminal electrode and the insulating layer; and
        providing an adhesive layer sandwiched between the first substrate and a second substrate,
        wherein the second substrate and the adhesive layer comprise a first opening in a region overlapping with part of the first layer, and
        wherein the insulating layer comprises a second opening inside the first opening in a top view; and
    a second step of removing part of the first layer,
        wherein part of the first layer is removed by emitting particles to the first layer, so that the terminal electrode is exposed.

2. The method for manufacturing a display device according to claim 1,
    wherein the particles are a solid form of carbon dioxide.

3. The method for manufacturing a display device according to claim 1,
    wherein $(180°-\alpha 1)/2-10°<\beta 1<(180°-\alpha 1)/2+10°$ is satisfied where $\alpha 1$ is an inclination angle of an edge of the insulating layer and $\beta 1$ is an emission angle of the particles in the second step.

4. The method for manufacturing a display device according to claim 1,
    wherein the first layer is an organic film formed by vapor deposition.

5. The method for manufacturing a display device according to claim 1,
    wherein in the second step, the part of the first layer is removed by emitting the particles and dry air to the first layer.

6. A method for manufacturing a display device, comprising a first process, a second process, a third process, a fourth process, a fifth process, a sixth process, a seventh process, and an eighth process,
    wherein the first process comprises the steps of:
        providing a first layer over a first surface of a first substrate;
        providing a first insulating layer over the first layer;
        providing a first electrode over the first insulating layer;
        providing a second insulating layer over the first electrode;

providing a first opening by removing part of the second insulating layer; and providing a display element, a second electrode, and a second layer over the second insulating layer, wherein the second process comprises the steps of:
providing a third layer over a second surface of a second substrate;
providing a third insulating layer over the third layer; and
providing a second opening by removing part of the third layer and part of the third insulating layer, wherein the third process comprises the step of overlapping the first substrate and the second substrate with each other with an adhesive layer therebetween so that the first surface and the second surface face each other and the first opening and the second opening overlap with each other in a region, wherein the fourth process comprises the step of separating the first substrate and the first layer from the first insulating layer, wherein the fifth process comprises the step of overlapping a third substrate and the first insulating layer with each other, wherein the sixth process comprises the step of separating the second substrate and the third layer from the third insulating layer, wherein the seventh process comprises the step of removing part of the second layer, wherein the eighth process comprises the step of overlapping a fourth substrate and the third insulating layer with each other, wherein in the first process, the second electrode and the second layer are stacked with each other in this order over the first electrode at a position overlapping with the first opening, wherein in the third process, the adhesive layer comprises a first region where the adhesive layer and the second opening overlap with each other and the second layer comprises a second region where the second layer and the second opening overlap with each other, wherein in the sixth process, at least part of the adhesive layer in the first region and at least part of the second layer in the second region are separated from each other, and wherein in the seventh process, the part of the second layer is removed by emitting particles to the second layer which remains over the second electrode in the sixth process, so that at least part of the second electrode is exposed.

7. The method for manufacturing a display device according to claim 6,
wherein $(180°-\alpha 2)/2-10°<\beta 2<(180°-\alpha 2)/2+10°$ is satisfied where $\alpha 2$ is an inclination angle of an edge of the second insulating layer and $\beta 2$ is an emission angle of the particles in the seventh process.

8. The method for manufacturing a display device according to claim 6,
wherein the second layer comprises a stack of an EL layer and a conductive layer.

9. The method for manufacturing a display device according to claim 6,
wherein the first substrate is a glass substrate, a quartz substrate, a sapphire substrate, a ceramic substrate, a metal substrate, a semiconductor substrate, or a plastic substrate, and wherein the second substrate is a glass substrate, a quartz substrate, a sapphire substrate, a ceramic substrate, a metal substrate, a semiconductor substrate, or a plastic substrate.

10. The method for manufacturing a display device according to claim 6,
wherein the third substrate and the fourth substrate have flexibility.

11. The method for manufacturing a display device according to claim 6,
wherein the first layer comprises tungsten, molybdenum, titanium, tantalum, niobium, nickel, cobalt, zirconium, ruthenium, rhodium, palladium, osmium, iridium, or silicon, and wherein the third layer comprises tungsten, molybdenum, titanium, tantalum, niobium, nickel, cobalt, zirconium, ruthenium, rhodium, palladium, osmium, iridium, or silicon.

12. The method for manufacturing a display device according to claim 6,
wherein the display element is a light-emitting element.

13. The method for manufacturing a display device according to claim 6,
wherein in the seventh process, the part of the second layer is removed by emitting the particles and dry air to the second layer.

14. A method for manufacturing an electronic device comprising a display device, the electronic device comprising a battery, a touch sensor, or a housing,
wherein the display device is manufactured by the method for manufacturing a display device according to claim 6.

15. A method for manufacturing a display device, comprising the steps of:
providing a first electrode over a substrate;
providing a first insulating layer over the first electrode;
providing an opening by removing part of the first insulating layer;
providing a display element, a second electrode, and a layer over the first insulating layer; and
removing part of the layer in a region,
wherein the opening and the region overlap with each other,
wherein the second electrode and the layer are stacked with each other in this order over the first electrode at a position overlapping with the opening, and
wherein the part of the layer is removed by emitting particles to the layer, so that at least part of the second electrode is exposed.

16. The method for manufacturing a display device according to claim 15,
wherein $(180°-\alpha 2)/2-10°<\beta 2<(180°-\alpha 2)/2+10°$ is satisfied where $\alpha 2$ is an inclination angle of an edge of the first insulating layer and $\beta 2$ is an emission angle of the particles.

17. The method for manufacturing a display device according to claim 15,
wherein the layer comprises an EL layer.

18. The method for manufacturing a display device according to claim 15,
wherein the part of the layer is removed by emitting the particles and dry air to the layer.

19. The method for manufacturing a display device according to claim 15,
wherein the display element is a light-emitting element.

20. A method for manufacturing an electronic device comprising a display device, the electronic device comprising a battery, a touch sensor, or a housing,
wherein the display device is manufactured by the method for manufacturing a display device according to claim 15.

21. A method for manufacturing a semiconductor device, comprising:
forming a terminal electrode, a wiring, and a functional layer over a first substrate, wherein the terminal electrode, the wiring, and the functional layer are electrically connected to one another;
forming an insulating layer over the terminal electrode and the first substrate, the insulating layer comprising a first opening overlapping with part of the terminal electrode;
forming a first layer over the insulating layer, the first layer overlapping with the first opening;
bonding the first substrate and a second substrate each other with an adhesive layer sandwiched therebetween;
forming a second opening in the adhesive layer by removing the second substrate and part of the adhesive layer, the second opening overlapping with part of the first layer; and
removing the part of the first layer by emitting particles to the first layer, so that the terminal electrode is exposed,
wherein the first opening is provided inside the second opening in a top view.

22. The method for manufacturing a semiconductor device according to claim 21,
wherein the particles are a solid form of carbon dioxide.

23. The method for manufacturing a semiconductor device according to claim 21,
wherein $(180° - \alpha 1)/2 - 10° < \beta 1 < (180° - \alpha 1)/2 + 10°$ is satisfied where $\beta 1$ is an inclination angle of an edge of the insulating layer and $\alpha 1$ is an emission angle of the particles.

24. The method for manufacturing a semiconductor device according to claim 21,
wherein the first layer is an organic film formed by vapor deposition.

25. The method for manufacturing a semiconductor device according to claim 21,
wherein the part of the first layer is removed by emitting the particles and dry air to the first layer.

* * * * *

UNITED STATES PATENT AND TRADEMARK OFFICE
CERTIFICATE OF CORRECTION

PATENT NO. : 9,812,517 B2
APPLICATION NO. : 15/163072
DATED : November 7, 2017
INVENTOR(S) : Ito et al.

Page 1 of 1

It is certified that error appears in the above-identified patent and that said Letters Patent is hereby corrected as shown below:

In the Claims

Column 64, Line 11, Claim 23, replace "$\beta1$" with --$\alpha1$--; and

Column 64, Line 12, Claim 23, replace "$\alpha1$" with --$\beta1$--.

Signed and Sealed this
Twenty-fourth Day of April, 2018

Andrei Iancu
*Director of the United States Patent and Trademark Office*